US011237444B2

(12) United States Patent
Jintyou et al.

(10) Patent No.: US 11,237,444 B2
(45) Date of Patent: Feb. 1, 2022

(54) SEMICONDUCTOR DEVICE AND DISPLAY DEVICE

(71) Applicant: Semiconductor Energy Laboratory Co., Ltd., Atsugi (JP)

(72) Inventors: Masami Jintyou, Shimotsuga (JP); Daisuke Kurosaki, Utsunomiya (JP); Masakatsu Ohno, Utsunomiya (JP); Junichi Koezuka, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1 day.

(21) Appl. No.: 16/635,290

(22) PCT Filed: Aug. 22, 2018

(86) PCT No.: PCT/IB2018/056334
§ 371 (c)(1),
(2) Date: Jan. 30, 2020

(87) PCT Pub. No.: WO2019/043511
PCT Pub. Date: Mar. 7, 2019

(65) Prior Publication Data
US 2020/0161340 A1    May 21, 2020

(30) Foreign Application Priority Data

Sep. 1, 2017   (JP) .............................. JP2017-168137

(51) Int. Cl.
*G02F 1/136*      (2006.01)
*G02F 1/1368*     (2006.01)
(Continued)

(52) U.S. Cl.
CPC ........ *G02F 1/1368* (2013.01); *G02F 1/13685* (2021.01); *H01L 27/1218* (2013.01);
(Continued)

(58) Field of Classification Search
CPC ............... G02F 1/1368; G02F 1/13685; H01L 29/78645; H01L 29/78648
See application file for complete search history.

(56) References Cited

U.S. PATENT DOCUMENTS 8,547,771 B2  10/2013  Koyama
9,653,613 B2  5/2017   Yamazaki et al.
(Continued)

FOREIGN PATENT DOCUMENTS

CN    107046040 A    8/2017
CN    107710392 A    2/2018
(Continued)

OTHER PUBLICATIONS

International Search Report (Application No. PCT/IB2018/056334) dated Dec. 11, 2018.
(Continued)

*Primary Examiner* — Paisley L Wilson
(74) *Attorney, Agent, or Firm* — Robinson Intellectual Property Law Office; Eric J. Robinson

(57) ABSTRACT

A highly reliable semiconductor device is provided. A second insulating layer is positioned over a first insulating layer. A semiconductor layer is positioned between the first insulating layer and the second insulating layer. A third insulating layer is positioned over the second insulating layer. A fourth insulating layer is positioned over the third insulating layer. A first conductive layer includes a region overlapping with the semiconductor layer, and is positioned between the third insulating layer and the fourth insulating layer. The third insulating layer includes a region in contact with a bottom surface of the first conductive layer and a region in contact with the fourth insulating layer. The fourth insulating layer is in contact with a top surface and a side surface of the first conductive layer. A fifth insulating layer is in contact with a top surface and a side surface of the
(Continued)

semiconductor layer. The fifth insulating layer includes a first opening and a second opening in a region overlapping with the semiconductor layer and not overlapping with the first conductive layer. A second conductive layer and a third conductive layer are electrically connected to the semiconductor layer in the first opening and the second opening, respectively. The third to fifth insulating layers include metal, and oxygen or nitrogen. A sixth insulating layer includes a region in contact with a top surface and a side surface of the fifth insulating layer and a region in contact with the first insulating layer.

8 Claims, 25 Drawing Sheets

(51) Int. Cl.
    *H01L 27/12*     (2006.01)
    *H01L 33/62*     (2010.01)
    *H01L 29/786*     (2006.01)
    *H01L 27/32*     (2006.01)

(52) U.S. Cl.
    CPC ...... *H01L 27/1225* (2013.01); *H01L 27/1248* (2013.01); *H01L 29/78648* (2013.01); *H01L 33/62* (2013.01); *G02F 2202/10* (2013.01); *H01L 27/3244* (2013.01)

(56) References Cited

U.S. PATENT DOCUMENTS

| | | | |
|---|---|---|---|
| 9,748,403 | B2 | 8/2017 | Koezuka et al. |
| 10,115,741 | B2 | 10/2018 | Matsuda et al. |
| 10,141,069 | B2 | 11/2018 | Ikeda et al. |
| 10,475,818 | B2 | 11/2019 | Ando et al. |
| 2015/0228799 | A1* | 8/2015 | Koezuka ............. H01L 27/1225 257/43 |
| 2016/0172500 | A1* | 6/2016 | Yamazaki ............... C23C 14/08 257/43 |
| 2016/0240684 | A1* | 8/2016 | Yamazaki ........... H01L 21/4757 |
| 2016/0254386 | A1 | 9/2016 | Yamazaki et al. |
| 2016/0300952 | A1 | 10/2016 | Toriumi et al. |
| 2016/0343452 | A1 | 11/2016 | Ikeda et al. |
| 2017/0170211 | A1 | 6/2017 | Yamazaki |
| 2017/0229486 | A1 | 8/2017 | Matsuda et al. |
| 2019/0164620 | A1 | 5/2019 | Ikeda et al. |

FOREIGN PATENT DOCUMENTS

| | | |
|---|---|---|
| DE | 112016001703 | 12/2017 |
| JP | 2011-228622 A | 11/2011 |
| JP | 2012-257187 A | 12/2012 |
| JP | 2016-164979 A | 9/2016 |
| JP | 2016-201541 A | 12/2016 |
| JP | 2016-219011 A | 12/2016 |
| JP | 2017-130647 A | 7/2017 |
| JP | 2017-143255 A | 8/2017 |
| KR | 2017-0093709 A | 8/2017 |
| KR | 2017-0137125 A | 12/2017 |
| TW | 201705490 | 2/2017 |
| WO | WO-2016/166628 | 10/2016 |

OTHER PUBLICATIONS

Written Opinion (Application No. PCT/IB2018/056334) dated Dec. 11, 2018.

* cited by examiner

SEMICONDUCTOR DEVICE AND DISPLAY DEVICE

TECHNICAL FIELD

One embodiment of the present invention relates to a semiconductor device and a manufacturing method thereof. One embodiment of the present invention relates to a semiconductor device including an oxide semiconductor film and a manufacturing method thereof.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device may each include a semiconductor device.

BACKGROUND ART

In recent years, semiconductor devices have been developed and an LSI, a CPU, or a memory is mainly used. A CPU is an aggregation of semiconductor elements in which an electrode which is a connection terminal is formed, which includes a semiconductor integrated circuit (at least a transistor and a memory) separated from a semiconductor wafer.

A semiconductor circuit (an IC chip) of an LSI, a CPU, a memory, or the like is mounted on a circuit board, for example, a printed wiring board, to be used as one of components of a variety of electronic devices. The reduction in the number of components by incorporating peripheral circuits such as a driver circuit is proposed in the display device with high resolution.

Thus, a technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a semiconductor thin film applicable to the transistor; in addition, an oxide semiconductor has been attracting attention as another material.

Furthermore, it is known that a transistor including an oxide semiconductor (Oxide Semiconductor transistor, hereinafter referred to as OS transistor) has an extremely low leakage current in an off state. For example, a low-power-consumption CPU or the like utilizing a characteristic of low leakage current of the transistor using an oxide semiconductor has been disclosed (see Patent Document 1).

A self-aligned transistor has been proposed as the OS transistor. A method in which, for the self-aligned transistor, a metal film is formed over a source region and a drain region and heat treatment is performed on the metal film so that the resistance of the metal film is increased and the resistance of the source region and the drain region is reduced is disclosed (see Patent Document 2).

In recent years, demand for an integrated circuit in which transistors and the like are integrated with high density has risen with reductions in the size and weight of an electronic device. In addition, improvement in the productivity of a semiconductor device including an integrated circuit is required.

REFERENCES

Patent Documents

[Patent Document 1] Japanese Published Patent Application No. 2012-257187
[Patent Document 2] Japanese Published Patent Application No. 2011-228622

SUMMARY OF THE INVENTION

Problems to be Solved by the Invention

In Patent Document 2, to reduce the resistance of the source region and the drain region, the metal film is formed over the source region and the drain region and heat treatment is performed on the metal film in an oxygen atmosphere. By the heat treatment, a constituent element of the metal film enters the source region and the drain region of an oxide semiconductor film as a dopant, whereby the resistance of the source region and the drain region is reduced. The heat treatment in an oxygen atmosphere causes oxidization of a conductive film, whereby the resistance of the conductive film is increased. However, since the heat treatment is performed in an oxygen atmosphere, the metal film has a low effect of extracting oxygen from the oxide semiconductor film.

Patent Document 2 discloses the concentration of oxygen in a channel formation region, and does not refer to the concentration of impurities such as water or hydrogen. That is, purification of the channel formation region (reduction in impurities such as water or hydrogen, typically, dehydration or dehydrogenation) is not performed; thus, there is a problem in that a transistor tends to have normally-on characteristics. Note that normally-on characteristics of a transistor means a state where a channel exists and current flows through a transistor even when no voltage is applied to a gate. In contrast, normally-off characteristics of a transistor means a state where current does not flow through a transistor without application of voltage to a gate.

In view of the above problems, an object of one embodiment of the present invention is to provide a semiconductor device having favorable electrical characteristics by stably reducing the resistance of a source region and a drain region of a transistor and increasing the purity of a channel formation region.

An object of one embodiment of the present invention is to provide a semiconductor device having favorable electrical characteristics. An object of one embodiment of the present invention is to provide a highly reliable semiconductor device. An object of one embodiment of the present invention is to provide a semiconductor device using a flexible substrate. An object of one embodiment of the present invention is to provide a novel semiconductor device. An object of one embodiment of the present invention is to provide a display device with high reliability. An object of one embodiment of the present invention is to provide a display device using a flexible substrate. An object of one embodiment of the present invention is to provide a novel display device.

Note that the descriptions of these objects do not disturb the existence of other objects. In one embodiment of the present invention, there is no need to achieve all these objects. Note that objects other than the above objects can be derived from the descriptions of the specification, the drawings, the claims, and the like.

Means for Solving the Problems

A semiconductor device of one embodiment of the present invention is a semiconductor device including first to sixth insulating layers, a semiconductor layer, first to third conductive layers, a first opening, and a second opening. The second insulating layer is positioned over the first insulating layer. The semiconductor layer is positioned between the first insulating layer and the second insulating layer. The third insulating layer is positioned over the second insulating layer. The fourth insulating layer is positioned over the third insulating layer. The first conductive layer includes a region overlapping with the semiconductor layer, and is positioned between the third insulating layer and the fourth insulating layer. The third insulating layer includes a region in contact with a bottom surface of the first conductive layer and a region in contact with the fourth insulating layer. The fourth insulating layer is in contact with a top surface and a side surface of the first conductive layer. The fifth insulating layer is in contact with a top surface and a side surface of the semiconductor layer. The fifth insulating layer includes a first opening and a second opening in a region overlapping with the semiconductor layer and not overlapping with the first conductive layer. The second conductive layer is electrically connected to the semiconductor layer in the first opening. The third conductive layer is electrically connected to the semiconductor layer in the second opening. The third insulating layer, the fourth insulating layer, and the fifth insulating layer include metal, and oxygen or nitrogen. The sixth insulating layer includes a region in contact with a top surface and a side surface of the fifth insulating layer and a region in contact with the first insulating layer.

In the above-described semiconductor device, it is preferable that the third insulating layer, the fourth insulating layer, and the fifth insulating layer include aluminum or hafnium, and oxygen or nitrogen.

It is preferable that the above-described semiconductor device further include a seventh insulating layer and a fourth conductive layer, the seventh insulating layer be positioned between the first insulating layer and the third conductive layer, the fourth conductive layer include a region overlapping with the first conductive layer, and the seventh insulating layer include metal, and oxygen or nitrogen. Furthermore, it is preferable that the seventh insulating layer include aluminum or hafnium, and oxygen or nitrogen.

It is preferable that the above-described semiconductor device further include eighth and ninth insulating layers, the ninth insulating layer be positioned over the first insulating layer and the fourth insulating layer, the eighth insulating layer be positioned between the first insulating layer and the ninth insulating layer, and the ninth insulating layer include metal, and oxygen or nitrogen. Furthermore, it is preferable that the ninth insulating layer include aluminum or hafnium, and oxygen or nitrogen.

It is preferable that the above-described semiconductor device further include a third opening provided in the fifth insulating layer and the sixth insulating layer, and the second insulating layer and the first conductive layer be positioned inside the third opening.

In the above-described semiconductor device, the semiconductor layer preferably includes metal oxide.

A semiconductor device of one embodiment of the present invention is a display device including the above-described semiconductor device, and a liquid crystal element or a light-emitting element electrically connected to the semiconductor device.

Effect of the Invention

According to one embodiment of the present invention, a semiconductor device having favorable electrical characteristics can be provided. According to one embodiment of the present invention, a highly reliable semiconductor device can be provided. According to one embodiment of the present invention, a semiconductor device using a flexible substrate can be provided. According to one embodiment of the present invention, a novel semiconductor device can be provided. According to one embodiment of the present invention, a highly reliable display device can be provided. According to one embodiment of the present invention, a display device using a flexible substrate can be provided. According to one embodiment of the present invention, a novel display device can be provided.

MODE FOR CARRYING OUT THE INVENTION

Figure 1A:
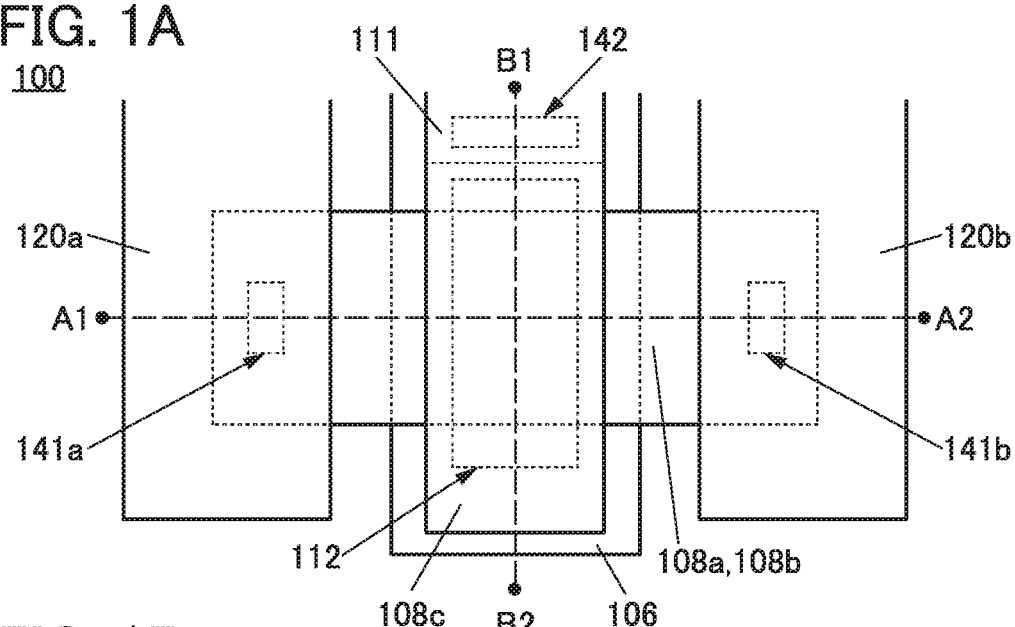
FIG. 1 A structure example of a transistor.

Hereinafter, embodiments are described with reference to drawings. However, the embodiments can be implemented in many different modes, and it is easily understood by those skilled in the art that modes and details thereof can be changed in various ways without departing from the spirit and scope thereof. Thus, the present invention should not be interpreted as being limited to the following description of the embodiments.

In each drawing described in this specification, the size, the layer thickness, or the region of each component is exaggerated for clarity in some cases. Therefore, the size, the layer thickness, or the region is not limited to the illustrated scale.

Note that ordinal numbers such as "first", "second", and "third" used in this specification are used in order to avoid confusion among components, and the terms do not limit the components numerically.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, terms are not limited to those used in this specification, and description can be made appropriately depending on the situation.

In this specification and the like, a transistor is an element having at least three terminals of a gate, a drain, and a source. The transistor has a channel region between the drain (a drain terminal, a drain region, or a drain electrode) and the source (a source terminal, a source region, or a source electrode), and can make current flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Thus, the terms of source and drain are interchangeable for use in this specification and the like.

Furthermore, in this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, the term "parallel" indicates a state where two straight lines are placed such that the angle formed therebetween is greater than or equal to −10° and less than or equal to 10°. Accordingly, the case where the angle is greater than or equal to −5° and less than or equal to 5° is also included. Moreover, "perpendicular" indicates a state where the angle formed between two straight lines is greater than or equal to 80° and less than or equal to 100°. Accordingly, the case where the angle is greater than or equal to 85° and less than or equal to 95° is also included.

In this specification and the like, the term "film" and the term "layer" can be interchanged with each other. For example, the term "conductive layer" can be changed into the term "conductive film" in some cases. Alternatively, for example, the term "insulating film" can be changed into the term "insulating layer" in some cases.

Unless otherwise specified, off-state current in this specification and the like refers to a drain current of a transistor in an off state (also referred to as a non-conducting state or a cutoff state). Unless otherwise specified, the off state of an n-channel transistor refers to a state where the voltage Vgs between its gate and source is lower than the threshold voltage Vth, and the off state of a p-channel transistor refers to a state where the voltage Vgs between its gate and source is higher than the threshold voltage Vth.

The off-state current of a transistor depends on Vgs in some cases. Thus, when there is Vgs with which the off-state current of the transistor is lower than or equal to 1, it may be said that the off-state current of the transistor is lower than or equal to 1. The off-state current of a transistor sometimes refers to the off-state current in an off state at predetermined Vgs, in an off state at Vgs in a predetermined range, in an off state at Vgs with which sufficiently reduced off-state current is obtained, or the like.

As an example, the assumption is made of an n-channel transistor where the threshold voltage Vth is 0.5 V, and the drain current is $1\times10^{-9}$ A at Vgs of 0.5 V, the drain current is $1\times10^{-13}$ A at Vgs of 0.1 V, the drain current is $1\times10^{-19}$ A at Vgs of −0.5 V, and the drain current is $1\times10^{-22}$ A at Vgs of −0.8 V. The drain current of the transistor is lower than or equal to $1\times10^{-19}$ A at Vgs of −0.5 V or at Vgs in the range of −0.5 V to −0.8 V; therefore, it is sometimes said that the off-state current of the transistor is lower than or equal to $1\times10^{-19}$ A. Since there is Vgs at which the drain current of the transistor is lower than or equal to $1\times10^{-22}$ A, it is sometimes said that the off-state current of the transistor is lower than or equal to $1\times10^{-22}$ A.

Furthermore, in this specification and the like, the off-state current of a transistor with a channel width W is sometimes represented by a current value per channel width W. Alternatively, it is sometimes represented by the value of flowing current per given channel width (e.g., 1 µm). In the latter case, the off-state current is sometimes represented by the unit with the dimension of current per length (e.g., A/µm).

The off-state current of a transistor sometimes depends on temperature. Unless otherwise specified, the off-state current in this specification is sometimes off-state current at room temperature, 60° C., 85° C., 95° C., or 125° C. Alternatively, the off-state current sometimes refers to off-state current at a temperature at which reliability of a semiconductor device or the like including the transistor is ensured or a temperature at which a semiconductor device or the like including the transistor is used (e.g., any temperature in the range of 5° C. to 35° C.). The off-state current of the transistor being lower than or equal to 1 sometimes means that there is Vgs at which the off-state current of a transistor is lower than or equal to 1 at room temperature, 60° C., 85° C., 95° C., 125° C., a temperature at which reliability of a semiconductor device or the like including the transistor is ensured, or a temperature at which the semiconductor device or the like including the transistor is used (e.g., any temperature in the range of 5° C. to 35° C.).

The off-state current of a transistor depends on voltage Vds between its drain and source in some cases. Unless otherwise specified, the off-state current in this specification sometimes refers to off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current sometimes refers to off-state current at Vds at which reliability of a semiconductor device or the like including the transistor is ensured or Vds used in the semiconductor device or the like including the transistor. The off-state current of the transistor being lower than or equal to 1 sometimes means that there is Vgs at which the off-state current of a transistor is lower than or equal to 1 at Vds of 0.1 V, 0.8 V, 1 V, 1.2 V, 1.8 V, 2.5 V, 3

V, 3.3 V, 10 V, 12 V, 16 V, or 20 V, at Vds at which reliability of a semiconductor device or the like including the transistor is ensured, or at Vds used in the semiconductor device or the like including the transistor.

In the above description of off-state current, a drain may be replaced with a source. That is, the off-state current sometimes refers to current that flows through a source of a transistor in an off state.

Furthermore, in this specification and the like, leakage current sometimes expresses the same meaning as off-state current. In addition, in this specification and the like, the off-state current sometimes refers to current that flows between a source and a drain of a transistor in the off state, for example.

Furthermore, in this specification and the like, the threshold voltage of a transistor refers to a gate voltage (Vg) at which a channel is formed in the transistor. Specifically, in a graph where the horizontal axis represents the gate voltage (Vg) and the vertical axis represents the square root of drain current (Id), the threshold voltage of a transistor may refer to a gate voltage (Vg) at the intersection of the square root of drain current (Id) of 0 (Id is 0 A) and an extrapolated straight line that is tangent with the highest inclination to a plotted curve (Vg-√Id characteristics). Alternatively, the threshold voltage of a transistor may refer to a gate voltage (Vg) at which the value of Id [A]×L [μm]/W [μm] is $1\times10^{-9}$ [A] where L is channel length and W is channel width.

Furthermore, in this specification and the like, a "semiconductor" has characteristics of an "insulator" in some cases when the conductivity is sufficiently low, for example. Furthermore, a "semiconductor" and an "insulator" cannot be strictly distinguished from each other in some cases because a border therebetween is not clear. Therefore, a "semiconductor" in this specification and the like can be replaced with an "insulator" in some cases.

Furthermore, in this specification and the like, a "semiconductor" has characteristics of a "conductor" in some cases when the conductivity is sufficiently high, for example. Furthermore, a "semiconductor" and a "conductor" cannot be strictly distinguished from each other in some cases because a border therebetween is not clear. Therefore, a "semiconductor" in this specification and the like can be replaced with a "conductor" in some cases.

Furthermore, in this specification and the like, an atomic ratio being In:Ga:Zn=4:2:3 or a neighborhood thereof refers to an atomic ratio where, when the proportion of In to the total number of atoms of In, Ga, and Zn is 4, the proportion of Ga is greater than or equal to 1 and less than or equal to 3 and the proportion of Zn is greater than or equal to 2 and less than or equal to 4. Furthermore, an atomic ratio being In:Ga:Zn=5:1:6 or a neighborhood thereof refers to an atomic ratio where, when the proportion of In to the total number of atoms of In, Ga, and Zn is 5, the proportion of Ga is greater than 0.1 and less than or equal to 2 and the proportion of Zn is greater than or equal to 5 and less than or equal to 7. Furthermore, an atomic ratio being In:Ga:Zn=1:1:1 or a neighborhood thereof refers to an atomic ratio where, when the proportion of In to the total number of atoms of In, Ga, and Zn is 1, the proportion of Ga is greater than 0.1 and less than or equal to 2 and the proportion of Zn is greater than 0.1 and less than or equal to 2.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. In addition, in the case where an "OS FET" is stated, it can also be called a transistor including a metal oxide or an oxide semiconductor.

In this specification and the like, metal oxides containing nitrogen are also collectively referred to as a metal oxide in some cases. A metal oxide containing nitrogen may be referred to as a metal oxynitride.

Furthermore, in this specification and the like, CAAC (c-axis aligned crystal) and CAC (Cloud-Aligned Composite) may be stated in some cases. Note that CAAC refers to an example of a crystal structure, and CAC refers to an example of a function or a material composition.

Furthermore, in this specification and the like, a CAC-OS or a CAC-metal oxide has a conducting function in part of the material and has an insulating function in another part of the material, and has a function of a semiconductor as a whole. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, in this specification and the like, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or the CAC-metal oxide is used in a channel region of a transistor, high current drive capability in the on state of the transistor, that is, a high on-state current and high field-effect mobility, can be obtained.

In other words, the CAC-OS or the CAC-metal oxide can also be referred to as a matrix composite or a metal matrix composite.

An example of a crystal structure of a metal oxide is described. Note that a metal oxide deposited by a sputtering method using an In—Ga—Zn oxide target (In:Ga:Zn=4:2:

4.1 [atomic ratio]) is described below as an example. A metal oxide deposited by a sputtering method using the above-described target at a substrate temperature higher than or equal to 100° C. and lower than or equal to 130° C. is referred to as sIGZO, and a metal oxide formed by a sputtering method using the above-described target with a substrate temperature set at room temperature (R.T.) is referred to as tIGZO. For example, sIGZO has one or both of crystal structures of nc (nano crystal) and CAAC. Furthermore, tIGZO has a crystal structure of nc. Note that room temperature (R.T.) here also includes a temperature in the case where a substrate is not heated intentionally.

Note that the CAAC structure is a crystal structure of a thin film or the like that has a plurality of nanocrystals (crystal regions each of which has a maximum diameter of less than 10 nm). The nanocrystals each have c-axis alignment in a particular direction. The nanocrystals each have neither a-axis alignment nor b-axis alignment, and have continuous crystal connection without a grain boundary in the a-axis and b-axis directions. In particular, in a thin film having the CAAC structure, the c-axes of nanocrystals are likely to be aligned in the film thickness direction, the normal direction of the surface where the thin film is formed, or the normal direction of the surface of the thin film.

Here, in crystallography, a unit cell is formed with three axes (crystal axes) of the a-axis, the b-axis, and the c-axis; in general, a specific axis is taken as the c-axis in the unit cell. In particular, in the case of a crystal having a layered structure, two axes parallel to the plane direction of a layer are regarded as the a-axis and the b-axis and an axis intersecting with the layer is regarded as the c-axis in general. Typical examples of such a crystal having a layered structure include graphite, which is classified as a hexagonal system. In a unit cell of graphite, the a-axis and the b-axis are parallel to the cleavage plane and the c-axis is orthogonal to the cleavage plane. For example, an $InGaZnO_4$ crystal having a $YbFe_2O_4$ type crystal structure can be classified as a hexagonal system, and, in a unit cell thereof, the a-axis and the b-axis are parallel to the plane direction of the layer and the c-axis is orthogonal to the layer (i.e., orthogonal to the a-axis and the b-axis).

In this specification and the like, a display panel which is one embodiment of the display device has a function of displaying (output) an image or the like on (to) a display surface. Thus, the display panel is one embodiment of an output device.

In this specification and the like, a structure in which a connector such as an FPC (flexible printed circuit) or a TPC (tape carrier package) is attached to a substrate of a display panel, or a structure in which an IC is mounted on a substrate by a COG (chip on glass) method or the like is referred to as a display panel module or a display module, or simply referred to as a display panel or the like in some cases.

Furthermore, in this specification and the like, a touch sensor has a function of sensing the contact, press, approach, or the like of a sensing target such as a finger or a stylus. In addition, the touch sensor may have a function of sensing the positional information. Therefore, the touch sensor is one embodiment of an input device. For example, the touch sensor can include one or more sensor elements.

Furthermore, in this specification and the like, a substrate provided with a touch sensor is referred to as a touch sensor panel or simply a touch sensor or the like in some cases. In addition, in this specification and the like, a substrate of a touch sensor panel to which, for example, a connector such as an FPC or a TCP is attached, or a substrate on which an IC is mounted by a COG method or the like is referred to as a touch sensor panel module, a touch sensor module, a sensor module, or simply a touch sensor or the like in some cases.

Note that in this specification and the like, a touch panel which is one embodiment of the display device has a function of displaying (output) an image or the like on (to) a display surface and a function as a touch sensor capable of sensing the contact, press, approach, or the like of a sensing target such as a finger or a stylus with or to the display surface. Therefore, the touch panel is an embodiment of an input/output device.

A touch panel can be referred to as, for example, a display panel (or a display device) with a touch sensor or a display panel (or a display device) having a touch sensor function.

A touch panel can include a display panel and a touch sensor panel. Alternatively, a touch panel can have a function of a touch sensor at the inside or on a surface of a display panel.

Furthermore, in this specification and the like, a substrate of a touch panel to which, for example, a connector such as an FPC or a TCP is attached, or a substrate on which an IC is mounted by a COG method or the like is referred to as a touch panel module, a display module, or simply a touch panel or the like in some cases.

Embodiment 1

In this embodiment, a structure example of a semiconductor device of one embodiment of the present invention and an example of a manufacturing method thereof are described.

One embodiment of the present invention is a transistor including a first gate electrode, a first gate insulating layer, a semiconductor layer over the first gate insulating layer, a second gate insulating layer over the semiconductor layer, and a second gate electrode over the second gate insulating layer. The semiconductor layer contains a metal oxide exhibiting semiconductor properties (hereinafter also referred to as an oxide semiconductor).

It is preferable that an insulating film functioning as a barrier layer (hereinafter also referred to as a barrier layer) be provided on a top surface and a side surface of the semiconductor layer. An insulating film functioning as a spacer layer (hereinafter also referred to as a spacer layer) is provided on the top surface and the side surface of the barrier layer. The barrier layer and the spacer layer include an opening at a position overlapping with a region where a channel is formed, and the gate insulating layer and the gate electrode are sequentially embedded in the opening. The provision of the barrier layer can suppress release of oxygen from the semiconductor layer, and an increase in oxygen vacancies in the channel formation region can be suppressed. In addition, by formation of a barrier layer, oxygen can be supplied from the barrier layer to the channel formation region of the semiconductor layer, so that oxygen vacancies in the channel formation region can be effectively reduced.

The barrier layer preferably contains a metal element and oxygen or nitrogen. Note that the metal element is one or more of metal elements selected from aluminum, hafnium, ruthenium, titanium, tantalum, tungsten, and chromium. In other words, as the barrier layer, a nitride film containing a metal element or an oxide film containing a metal element can be used.

The spacer layer preferably includes an excess oxygen region. The spacer layer preferably includes a region in contact with the first gate insulating layer. The spacer layer includes an excess oxygen region and is in contact with the first gate insulating layer, whereby excess oxygen can be supplied to the semiconductor layer through the first gate insulating layer. As a result, oxygen vacancies that might be formed in the semiconductor layer can be filled with excess oxygen, and thus the semiconductor device having high reliability can be provided.

The semiconductor layer includes a region in which a channel might be formed in a portion overlapping with the gate electrode (also referred to as a channel formation region). The semiconductor layer includes a pair of low-resistance regions between which a channel formation region is sandwiched. The low-resistance region serves as a source or a drain.

The low-resistance region has a higher carrier density than the channel formation region. For example, the low-resistance regions can be regions containing more hydrogen than the channel formation region or regions containing more oxygen vacancies than the channel formation region. When bonded to hydrogen atoms, oxygen vacancies in the oxide semiconductor serve as a carrier generation source.

A region having an extremely low carrier density in the channel formation region of the semiconductor layer preferably has a small thickness. Therefore, the low-resistance region of the semiconductor layer that functions as a source or a drain and has a high carrier density preferably has the largest thickness.

For example, as the oxide semiconductor, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, for the oxide semiconductor, In—Ga oxide or In—Zn oxide may be used.

In addition to the constituent element of the oxide semiconductor, the oxide semiconductor contains a metal element such as aluminum, ruthenium, titanium, tantalum, chromium, or tungsten, whereby the oxide semiconductor forms a metal compound to have reduced resistance in some cases. Note that aluminum, titanium, tantalum, tungsten, or the like is preferably used. To add the metal element to the oxide semiconductor, for example, a metal film containing the metal element, a nitride film containing the metal element, or an oxide film containing the metal element is provided over the oxide semiconductor. By providing the film, some oxygen at the interface of the film and the oxide semiconductor or in the oxide semiconductor in the vicinity of the interface may be absorbed into the film or the like and an oxygen vacancy may be formed, so that the resistance in the vicinity of the interface of the oxide semiconductor may be reduced.

After the metal film, the nitride film containing the metal element, or the oxide film containing the metal element is provided over the oxide semiconductor, heat treatment is preferably performed in an atmosphere containing nitrogen. By the heat treatment in the atmosphere containing nitrogen, the metal element diffuses from the metal film to the oxide semiconductor; thus, the metal element can be added to the oxide semiconductor. In this case, it is preferable that the metal film, the nitride film containing the metal element, or the oxide film containing the metal element that is provided over the oxide semiconductor be provided to cover the oxide semiconductor.

In the case where hydrogen in the oxide semiconductor diffuses into a low-resistance region of the oxide semiconductor and enters an oxygen vacancy in the low-resistance region, the hydrogen becomes relatively stable. It is known that hydrogen in the oxygen vacancy in the oxide semiconductor is released from the oxygen vacancy by heat treatment at 250° C. or higher, diffuses into a low-resistance region of the oxide semiconductor, enters an oxygen vacancy in the low-resistance region, and becomes relatively stable. Thus, by the heat treatment, the resistance of the low-resistance region of the oxide semiconductor tends to be further reduced, and the oxide semiconductor whose resistance is not reduced tends to be highly purified (reduction of impurities such as water or hydrogen) to have increased resistance.

The oxide semiconductor has an increased carrier density when hydrogen, nitrogen, or the like exists therein. Hydrogen in the oxide semiconductor reacts with oxygen, which is bonded to a metal atom, to be water, and thus forms an oxygen vacancy in some cases. Entry of hydrogen into the oxygen vacancy increases carrier density. Furthermore, in some cases, part of hydrogen is bonded to oxygen, which is bonded to a metal atom, whereby an electron serving as a carrier is generated. That is, the resistance of an oxide semiconductor containing nitrogen or hydrogen is reduced.

Thus, selective addition of a metal element and hydrogen, nitrogen, or the like to the oxide semiconductor allows a high-resistance region and a low-resistance region to be provided in the oxide semiconductor. In other words, when the resistance of the oxide semiconductor is selectively reduced, a region functioning as a semiconductor having a low carrier density and a low-resistance region functioning as a source region or a drain region can be provided in the island-shaped oxide semiconductor.

After the resistance of the oxide semiconductor is reduced, the metal film, the nitride film containing the metal element, or the oxide film containing the metal element may be removed. The oxide semiconductor can hold a region with reduced resistance even when the metal film, the nitride film containing the metal element, or the oxide film containing the metal element is removed.

The second gate electrode is preferably surrounded by an insulating layer. When the insulating layer surrounds the second gate electrode, the resistance of the second gate electrode can be prevented from being increased by oxidization of the second gate electrode.

Furthermore, the first gate insulating layer preferably has a stacked structure consisting of at least two layers. Furthermore, a structure including a stacked structure of three or more layers is more preferable. When the first gate insulating layer has a three-layer stacked structure, the layers are referred to as a first layer, a second layer, and a third layer from the first gate electrode side.

A case where the first gate insulating layer has a three-layer stacked structure is described below.

The third layer in contact with the semiconductor layer and the second layer positioned therebelow preferably contain materials different from each other.

For example, the second layer can be a layer containing a material having a higher dielectric constant than the third layer, in which case a reduction in the voltage applied to the second gate electrode is possible. Alternatively, the second layer can be a layer into which hydrogen or oxygen less easily diffuses than into the third layer, in which case the diffusion of impurities from below the first gate insulating layer into the semiconductor layer can be prevented.

More specifically, aluminum oxide, hafnium oxide, hafnium aluminate, or the like is preferably used for the second layer of the first gate insulating layer. Moreover, silicon oxide, silicon oxynitride, or the like is preferably used for the third layer. Note that in this specification and the like, oxynitride contains more oxygen than nitrogen in its composition. Nitride oxide contains more nitrogen than oxygen.

Furthermore, the first layer positioned in a lower layer than the second layer is preferably formed using the same material as the third layer.

Note that in the above, the first layer positioned on the first gate electrode side may be omitted.

With the first gate insulating layer having such a structure, reliability can be increased even when a substrate having a low barrier property such as a flexible substrate is used as a substrate that supports the transistor.

A more specific example is described below with reference to drawings.

Structure Example 1

Figure 1B:
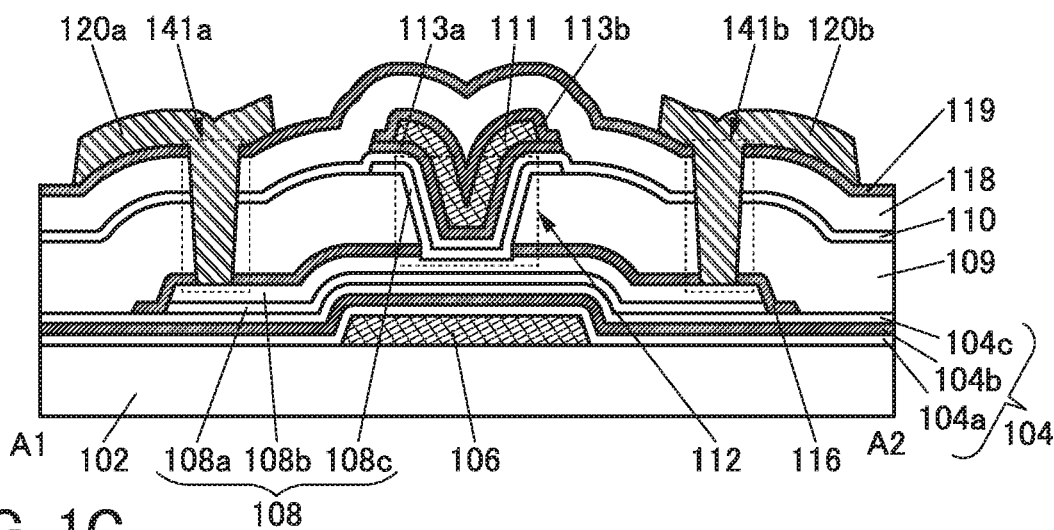
Figure 1C:
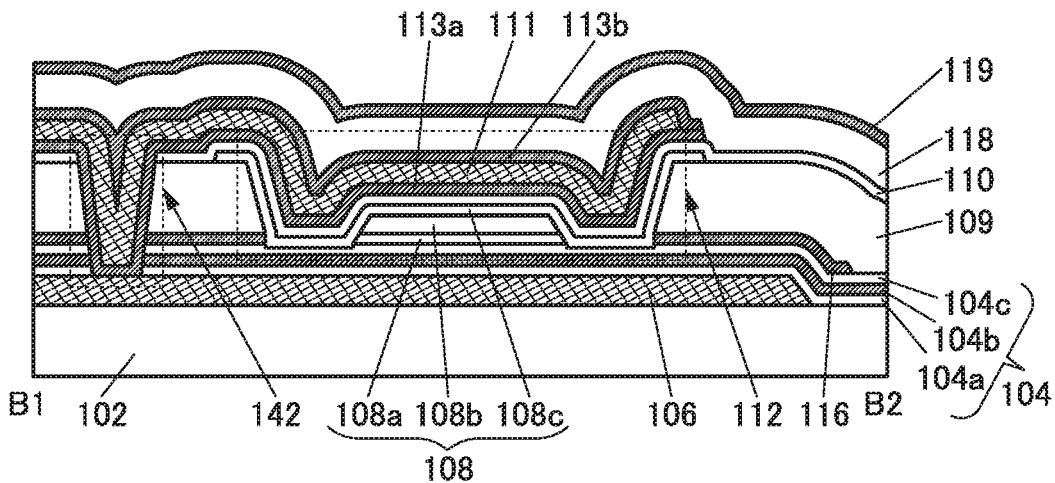

FIG. 1(A) is a top view of a transistor 100; FIG. 1(B) is a cross-sectional view of a cut plane taken along dashed-dotted line A1-A2 in FIG. 1(A); and FIG. 1(C) is a cross-sectional view of a cut plane taken along dashed-dotted line B1-B2 in FIG. 1(A). Note that in FIG. 1(A), some components of the transistor 100 (e.g., a gate insulating layer) are not illustrated. Furthermore, the direction of the dashed-dotted line A1-A2 may be referred to as a channel length direction, and the direction of the dashed-dotted line B1-B2 may be referred to as a channel width direction. Note that some components are not illustrated in some cases in top views of transistors in the following drawings, as in FIG. 1(A).

The transistor 100 includes a conductive layer 106, an insulating layer 104, a semiconductor layer 108a, a semiconductor layer 108b, a semiconductor layer 108c, an insulating layer 116, an insulating layer 109, an insulating layer 110, an insulating layer 113a, an insulating layer 113b, a conductive layer 111, an insulating layer 118, an insulating layer 119, and the like. The insulating layer 104 is provided over a substrate 102. A semiconductor layer 108 is provided over the insulating layer 104. The insulating layer 116 is provided to cover part of the semiconductor layer 108. The insulating layer 116 and the insulating layer 109 are provided over the semiconductor layer 108 and the opening 112 is formed therein.

In the opening 112, the insulating layer 110, the insulating layer 113a, the conductive layer 111, and the insulating layer 113b are stacked over the semiconductor layer 108b in this order.

In this embodiment, the semiconductor layer has a three-layer structure of the semiconductor layer 108a, the semiconductor layer 108b, and the semiconductor layer 108c. Note that in this specification and the like, the semiconductor layer 108a, the semiconductor layer 108b, and the semiconductor layer 108c are collectively referred to as a "semiconductor layer 108" in some cases.

Part of the conductive layer 106 functions as a first gate electrode (also referred to as a bottom-gate electrode), and the conductive layer 106 has a portion overlapping with the semiconductor layer 108 with the insulating layer 104 provided therebetween. Part of the conductive layer 111 functions as a second gate electrode (also referred to as a top-gate electrode), and the conductive layer 111 has a portion overlapping with the semiconductor layer 108 with the insulating layer 110 provided therebetween. Part of the insulating layer 104 functions as a first gate insulating layer, and part of the insulating layer 110 functions as a second gate insulating layer. The insulating layer 104 can have a stacked-layer structure including, for example, a first layer 104a, a second layer 104b, and a third layer 104c from the conductive layer 106 side.

A portion of the semiconductor layer 108 that overlaps with at least one of the conductive layer 111 and the conductive layer 106 functions as a channel formation region. For easy explanation, a portion of the semiconductor layer 108 that overlaps with the conductive layer 111 is hereinafter referred to as a channel formation region in some cases; however, practically, a channel is also formed in a portion that does not overlap with the conductive layer 111 but overlaps with the conductive layer 106. The semiconductor layer 108 preferably contains a metal oxide.

The insulating layer 116 functions as a barrier layer and is preferably a layer into which hydrogen, oxygen, water, and the like do not easily diffuse. The insulating layer 116 is provided between the insulating layer 109 and the first semiconductor layer 108a and the second semiconductor layer 108b so that the insulating layer 109 is not in contact with the first semiconductor layer 108a and the second semiconductor layer 108b, whereby diffusion of impurities from the insulating layer 109 into the first semiconductor layer 108a and the second semiconductor layer 108b, release of oxygen in the first semiconductor layer 108a and the second semiconductor layer 108b, and the like can be prevented; thus, the reliability can be improved.

The insulating layer 116 preferably contains a metal element and oxygen or nitrogen. Note that the metal element is one or more of metal elements selected from aluminum, hafnium, ruthenium, titanium, tantalum, tungsten, chromium, and the like. In other words, as the insulating layer 116, a nitride film containing a metal element or an oxide film containing a metal element can be used.

It is particularly preferable to use an aluminum oxide film, a hafnium oxide film, and a hafnium aluminate film as the insulating layer 116. An aluminum oxide film, a hafnium oxide film, and a hafnium aluminate film have extremely high barrier properties even when their thicknesses are small. Accordingly, such a film can have a thickness of 0.5 nm to 50 nm inclusive, preferably 1 nm to 40 nm inclusive, further preferably 2 nm to 30 nm inclusive. In particular, an aluminum oxide film has high barrier properties against hydrogen, oxygen, and the like; hence, sufficient effects can be obtained even when the film has an extremely small thickness (e.g., a thickness of 0.5 nm to 1.5 nm).

The insulating layer 109 preferably includes an excess oxygen region. The insulating layer 109 preferably includes a region in contact with the third layer 104c. The insulating layer 109 has an excess oxygen region and is in contact with the third layer 104c, whereby excess oxygen can be supplied to the semiconductor layer 108 through the third layer 104c. As a result, oxygen vacancies that might be formed in the semiconductor layer 108 can be filled with excess oxygen, and the semiconductor device having high reliability can be provided. In addition, the insulating layer 110 preferably includes an excess oxygen region like the insulating layer 109.

Here, oxygen vacancies that might be formed in the semiconductor layer 108 are described.

Oxygen vacancies formed in the semiconductor layer 108 adversely affect the transistor characteristics and therefore cause a problem. For example, when an oxygen vacancy is formed in the semiconductor layer 108, the oxygen vacancy might be bonded with hydrogen to serve as a carrier supply source. The carrier supply source generated in the semiconductor layer 108 causes a change in the electrical characteristics, typically, a shift in the threshold voltage, of the transistor 100. Therefore, it is preferable that the amount of oxygen vacancies in the semiconductor layer 108 be as small as possible.

In view of this, in one embodiment of the present invention, a structure in which an insulating film in the vicinity of the semiconductor layer 108, specifically the insulating layer 109 and the insulating layer 110 formed above the semiconductor layer 108, contains excess oxygen is employed. Oxygen or excess oxygen is transferred from the insulating layer 109 and the insulating layer 110 to the semiconductor layer 108, whereby oxygen vacancies in the semiconductor layer 108 can be reduced.

Note that the insulating layer 104 positioned below the semiconductor layer 108 may contain excess oxygen. In that case, excess oxygen is transferred also from the insulating layer 104 to the semiconductor layer 108, whereby the amount of oxygen vacancies in the semiconductor layer 108 can be further reduced.

Here, in the case where the semiconductor layer 108 is a metal oxide containing In, Ga, and Zn, bonding strength between In and oxygen is weaker than bonding strength between Ga and oxygen; hence, with a higher atomic proportion of In, an oxygen vacancy tends to be generated in the metal oxide film. There is a similar tendency when a metal element shown above as M is used instead of Ga. A large amount of oxygen vacancies in the metal oxide film leads to deterioration of electrical characteristics and reduction in reliability of a transistor.

However, in one embodiment of the present invention, an extremely large amount of oxygen can be supplied to the semiconductor layer 108 containing a metal oxide; thus, the semiconductor layer 108 can be formed using a metal oxide material with a high atomic proportion of In. Accordingly, it is possible to achieve a transistor with extremely high field-effect mobility, stable electrical characteristics, and high reliability.

For example, a metal oxide in which the atomic proportion of In is 1.5 times or higher, 2 times or higher, 3 times or higher, 3.5 times or higher, or 4 times or higher that of M can be favorably used.

In particular, the atomic ratio of In to M and Zn in the semiconductor layer 108 is preferably In:M:Zn=5:1:6 or the neighborhood thereof. The term "neighborhood" includes the following: when In is 5, M is greater than or equal to 0.5 and less than or equal to 1.5, and Zn is greater than or equal to 5 and less than or equal to 7.

Note that the composition of the semiconductor layer 108 is not limited to the above composition. For example, the atomic ratio of In to M and Zn in the semiconductor layer 108 is preferably In:M:Zn=4:2:3 or the neighborhood thereof.

Furthermore, as the composition of the semiconductor layer 108, the proportions of the numbers of atoms of In, M, and Zn in the semiconductor layer 108 may be approximately equal to each other. That is, a material having an atomic ratio of In to M and Zn being In:M:Zn=1:1:1 or the neighborhood thereof may be included. A material having an atomic ratio of In to M and Zn being In:M:Zn=1:1:0.5 or the neighborhood thereof may be included.

When the semiconductor layer 108 includes a region where the proportion of the number of In atoms is higher than that of M atoms, the transistor 100 can have high field-effect mobility. Specifically, the field-effect mobility of the transistor 100 can exceed 10 $cm^2/Vs$, preferably exceed 30 $cm^2/Vs$.

For example, with the use of the transistor with high field-effect mobility in a gate driver that generates a gate signal, the display device with a small frame width (also referred to as a narrow frame) can be provided. Furthermore, with the use of the above transistor with high field-effect mobility in a source driver included in a display device (particularly a demultiplexer connected to an output terminal of a shift register included in the source driver), a display device to which fewer wirings are connected can be provided.

Note that even when the semiconductor layer 108 includes the region where the proportion of the number of atoms of In is higher than that of M atoms, the field-effect mobility may sometimes be low if the semiconductor layer 108 has high crystallinity.

For example, as the composition of the semiconductor layer 108*a*, an atomic ratio of In to Ga and Zn can be In:Ga:Zn=1:1:0.5 or a neighborhood thereof. For example, as the composition of the semiconductor layer 108*a*, an atomic ratio of In to Ga and Zn can be In:Ga:Zn=4:2:3 or a neighborhood thereof. For example, as the composition of the semiconductor layer 108*c*, an atomic ratio of In to Ga and Zn can be In:Ga:Zn=1:1:0.5 or a neighborhood thereof. Although a structure in which the composition of the semiconductor layer 108*a* and the semiconductor layer 108*c* is different from the composition of the semiconductor layer 108*b* is shown, one embodiment of the present invention is not limited to this structure. The semiconductor layer 108*a*, the semiconductor layer 108*b*, and the semiconductor layer 108*c* may have the same composition. A structure in which the semiconductor layer 108*a*, the semiconductor layer 108*b*, and the semiconductor layer 108*c* have different compositions may be employed. Alternatively, a structure in which any one of the semiconductor layer 108*a*, the semiconductor layer 108*b*, and the semiconductor layer 108*c* has a different composition may be employed.

Figure 10A:
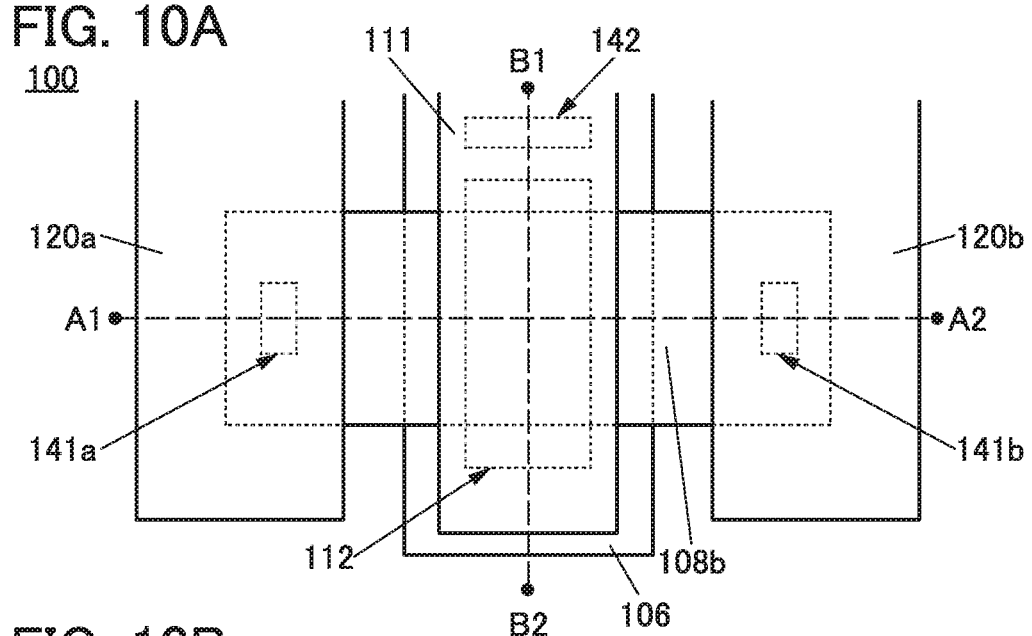
FIG. 10 A structure example of a transistor.
Figure 10B:
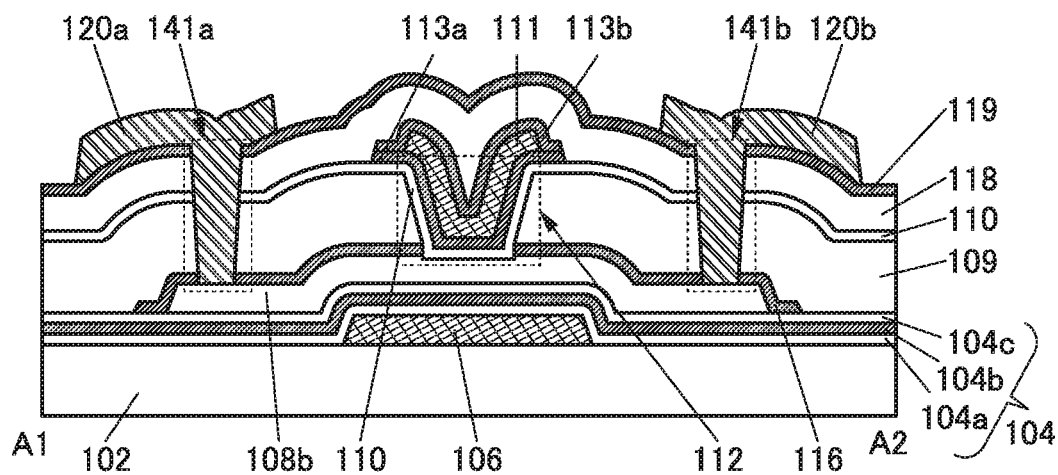
Figure 10C:
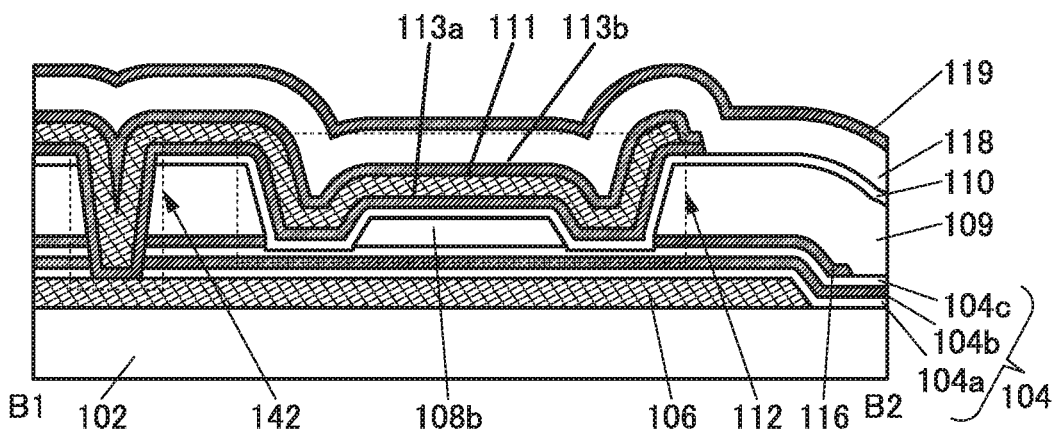

Note that one or more of the semiconductor layer 108*a* and the semiconductor layer 108*c* may be omitted. For example, as illustrated in FIG. 10(A), FIG. 10(B), and FIG. 10(C), the semiconductor layer 108 may have a single-layer structure of the semiconductor layer 108*b*. For example, the semiconductor layer 108 may have a two-layer structure of the semiconductor layer 108*a* and the semiconductor layer 108*b*. For example, the semiconductor layer 108 may have a two-layer structure of the semiconductor layer 108*b* and the semiconductor layer 108*c*. When the semiconductor layer 108 has a single-layer structure or a two-layer structure, the process can be simplified.

The crystallinity of the semiconductor layer 108 can be analyzed by using X-ray diffraction (XRD) or analyzed with a transmission electron microscope (TEM), for example.

Here, impurities such as hydrogen or moisture entering the semiconductor layer 108 adversely affect the transistor characteristics and therefore cause a problem. Thus, it is preferable that the amount of impurities such as hydrogen or moisture in the semiconductor layer 108 as small as possible.

It is preferable to use, as the semiconductor layer 108, a metal oxide film in which the impurity concentration is low and the density of defect states is low, in which case the transistor having excellent electrical characteristics can be fabricated. Here, the state in which the impurity concentration is low and the density of defect states is low (the amount of oxygen vacancies is small) is referred to as highly purified intrinsic or substantially highly purified intrinsic. A highly purified intrinsic or substantially highly purified intrinsic metal oxide film has few carrier generation sources, and thus can have a low carrier density. Thus, a transistor in which a channel region is formed in the metal oxide film rarely has electrical characteristics with a negative threshold voltage (also referred to as normally-on). Moreover, a highly purified intrinsic or substantially highly purified intrinsic metal oxide film has a low density of defect states and accordingly may have a low density of trap states. Furthermore, a highly purified intrinsic or substantially highly purified intrinsic metal oxide film has an extremely low off-state current; even an element having a channel width of $1 \times 10^6$ μm and a channel length of 10 μm can have an off-state current that is lower than or equal to the measurement limit of a semiconductor parameter analyzer, that is, lower than or equal to $1 \times 10^{-13}$ A, at a voltage (drain voltage) between a source electrode and a drain electrode ranging from 1 V to 10 V.

FIG. 1(B) and FIG. 1(C) illustrate a case where the insulating layer 104 has a stacked-layer structure. The insulating layer 104 includes a first layer 104a, a second layer 104b, and a third layer 104c from the conductive layer 106 side.

The first layer 104a is provided to cover a top surface and a side surface of the conductive layer 106. The third layer 104c is provided in contact with a bottom surface of the semiconductor layer 108. The second layer 104b is sandwiched between the first layer 104a and the third layer 104c.

The third layer 104c which is in contact with the semiconductor layer 108 is preferably formed using an insulating film containing oxygen. For example, as the third layer 104c, an oxide insulating film such as a silicon oxide film or a silicon oxynitride film is preferably used. Such an oxide insulating film can be a film that can easily contain a large amount of oxygen during or after the deposition and easily release oxygen by heating. When the semiconductor layer 108 is provided in contact with the oxide insulating film, a large amount of oxygen can be supplied to the semiconductor layer 108.

Furthermore, the third layer 104c preferably includes a region in contact with the insulating layer 109. When the third layer 104c and the insulating layer 109 are in contact with each other, oxygen released from the insulating layer 109 can be supplied to the semiconductor layer 108 through the third layer 104c.

As the first layer 104a, an insulating film formed by a deposition method achieving high step coverage can be used. For example, the film can be formed by a plasma CVD method, a sputtering method, or the like. The first layer 104a formed of an inorganic insulating film can have a smaller thickness compared with the case of forming the first layer 104a of an organic insulating film, reducing the driving voltage of the transistor 100. Like the third layer 104c, the first layer 104a is preferably formed to include an insulating film containing oxygen. In particular, it is preferable to use the same insulating films as the first layer 104a and the third layer 104c because a deposition apparatus can be used in common.

A thin film into which water, hydrogen, nitrogen, or the like does not easily diffuse (which has a high barrier property) is preferably used for the second layer 104b. Thus, diffusion of impurities contained in the substrate 102, the conductive layer 106, and the like into the semiconductor layer 108 can be suppressed. The second layer 104b is preferably formed using a thin film into which oxygen does not easily diffuse. Accordingly, it is possible to prevent diffusion of oxygen contained in the third layer 104c, the insulating layer 109, or the like into the conductive layer 106, and thus prevent an increase in the resistance of the conductive layer 106 due to oxidization.

The second layer 104b preferably includes a material having a higher dielectric constant than at least one of the first layer 104a and the third layer 104c. Accordingly, the voltage applied to the conductive layer 106 functioning as the second gate electrode can be reduced.

More specifically, aluminum oxide, hafnium oxide, hafnium aluminate, or the like is preferably used for the second layer 104b.

As illustrated in FIG. 1(B) and FIG. 1(C), the insulating layer 113a and the insulating layer 113b are preferably provided to surround the conductive layer 111. The insulating layer 113a and the insulating layer 113b can be formed using a material similar to that for the insulating layer 116. When the conductive layer 111 is surrounded by the insulating layer 113a and the insulating layer 113b, an increase in the resistance of the conductive layer 111 can be suppressed due to diffusion of oxygen included in the insulating layer 110 and the like into the conductive layer 111. The insulating layer 113a and the insulating layer 113b can have substantially the same top surface shape.

As illustrated in FIG. 1(C), the conductive layer 106 may be electrically connected to the conductive layer 111 through an opening 142 provided in the insulating layer 104, the insulating layer 116, the insulating layer 109, and the insulating layer 110. In that case, the conductive layer 106 and the conductive layer 111 can be supplied with the same potential.

The conductive layer 106 can be formed using a material similar to that for the conductive layer 111, the conductive layer 120a, or the conductive layer 120b. It is particularly suitable to use a material containing copper for formation of the conductive layer 106 because the resistance can be reduced.

As illustrated in FIG. 1(A) and FIG. 1(C), the conductive layer 111 and the conductive layer 106 preferably extend beyond an end portion of the semiconductor layer 108 in the channel width direction. In that case, as shown in FIG. 1(C), the semiconductor layer 108 is entirely covered with the conductive layer 111 and the conductive layer 106 in the channel width direction with the insulating layer 110 and the insulating layer 104 therebetween.

With such a structure, the semiconductor layer 108 can be electrically surrounded by electric fields generated by a pair of gate electrodes. At this time, it is particularly preferable that the conductive layer 106 and the conductive layer 111 be supplied with the same potential. In that case, electric fields for inducing a channel can be effectively applied to the semiconductor layer 108, whereby the on-state current of the transistor 100 can be increased. Thus, the transistor 100 can also be miniaturized.

Note that a structure in which the conductive layer 111 and the conductive layer 106 are not connected to each other may be employed. In that case, a constant potential may be supplied to one of the pair of gate electrodes, and a signal for driving the transistor 100 may be supplied to the other. In this case, the potential supplied to one of the electrodes can control the threshold voltage at the time of driving the transistor 100 with the other electrode.

As illustrated in FIG. 1(B) and FIG. 1(C), the transistor 100 preferably includes the insulating layer 118 over the insulating layer 110, the insulating layer 113a, the conductive layer 111, and the insulating layer 113b and the insulating layer 119 over the insulating layer 118.

A material similar to that for the insulating layer 109 can be used for the insulating layer 118.

The insulating layer 119 can be formed using a material similar to that for the insulating layer 116. The provision of the insulating layer 119 can prevent diffusion of oxygen released from the insulating layer 109, the insulating layer 110, and the insulating layer 118 to the outside of the transistor.

As illustrated in FIG. 1(A) and FIG. 1(B), the transistor 100 may include the conductive layer 120a and the conductive layer 120b. The conductive layer 120a functions as a source electrode, and the conductive layer 120b functions as a drain electrode. The conductive layer 120a and the conductive layer 120b are electrically connected to the low-resistance regions of the semiconductor layer 108b through an opening 141a or an opening 141b provided in the insulating layer 116, the insulating layer 109, the insulating layer 110, and the insulating layer 118.

The above is the description of Structure example 1.

A structure example of a transistor whose structure is partly different from Structure example 1 described above is described below. Note that description of the same portions as those in Structure example 1 described above is skipped in some cases. Furthermore, in the drawings that are referred to later, the same hatching pattern is applied to portions having functions similar to those in Structure example 1 described above, and the portions are not denoted by reference numerals in some cases.

Structure Example 2

Figure 2A:
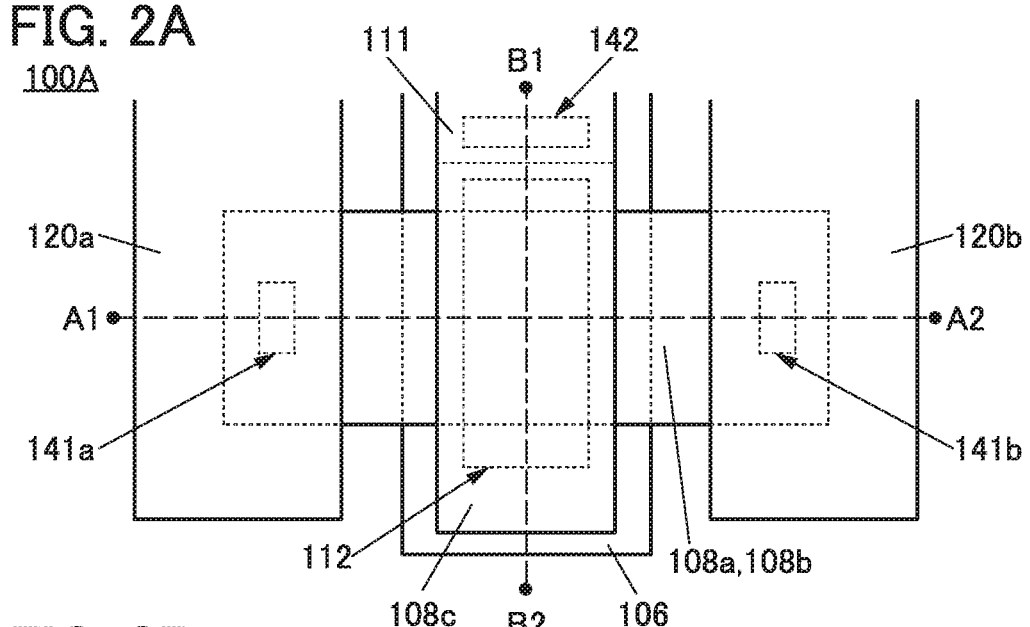
FIG. 2 A structure example of a transistor.
Figure 2B:
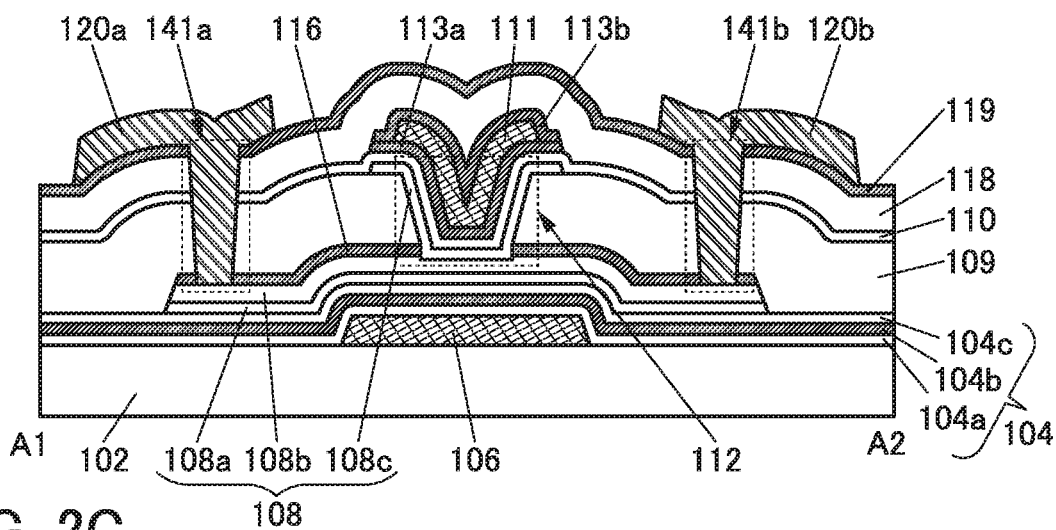
Figure 2C:
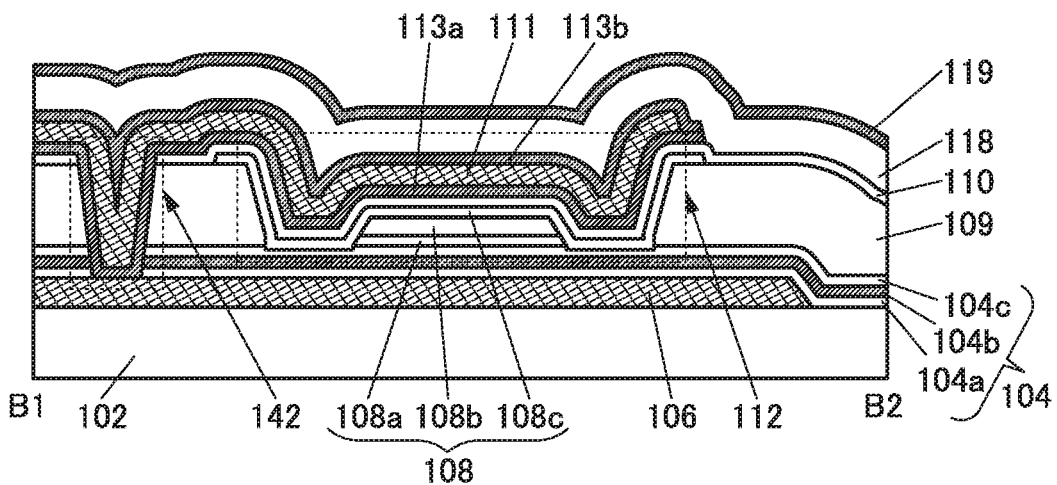

FIG. 2(A) is a top view of the transistor 100A, FIG. 2(B) is a cross-sectional view of the transistor 100A in the channel length direction, and FIG. 2(C) is a cross-sectional view of the transistor 100A in the channel width direction.

The transistor 100A differs from the transistor 100 described in Structure example 1 mainly in that the insulating layer 116 is in contact with a top surface of the semiconductor layer 108b and is not in contact with a side surface of the semiconductor layer 108a and a side surface of the semiconductor layer 108b. In the transistor 100A, the insulating layer 109 is in contact with the side surface of the semiconductor layer 108a and the side surface of the semiconductor layer 108b.

The insulating layer 116 can be processed using the same resist mask as the semiconductor layer 108a and the semiconductor layer 108b. The process can be simplified by using the same resist mask. Furthermore, with the use of the same resist mask, the insulating layer 116 that has substantially the same top surface shape as those of the semiconductor layer 108a and the semiconductor layer 108b can be formed.

The above is the description of Structure example 2.

Structure Example 3

Figure 3A:
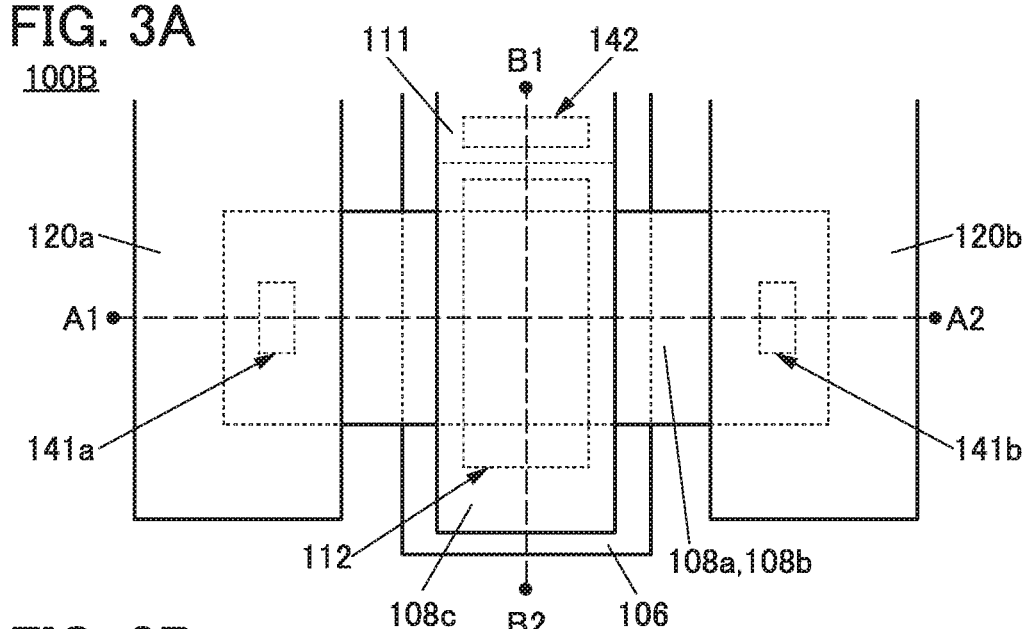
FIG. 3 A structure example of a transistor.
Figure 3B:
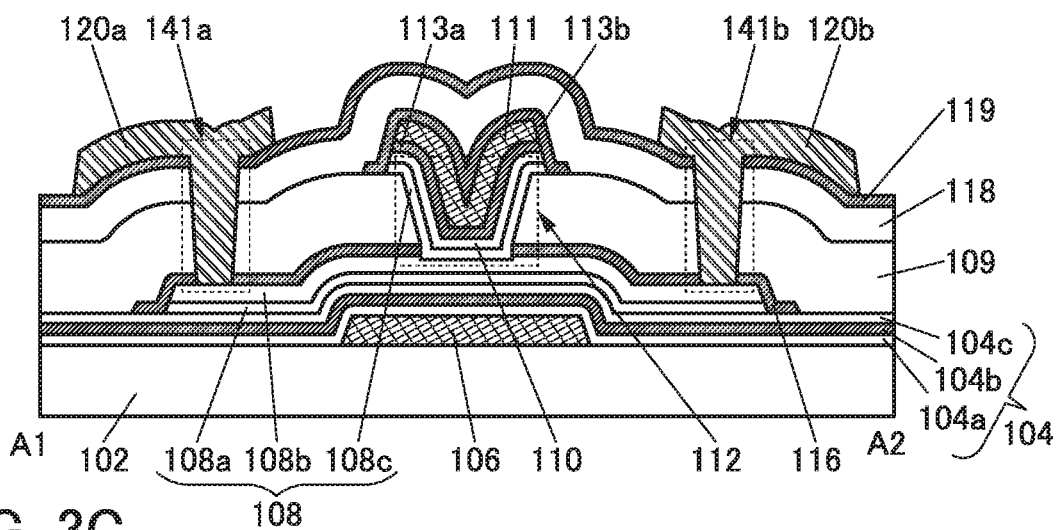
Figure 3C:
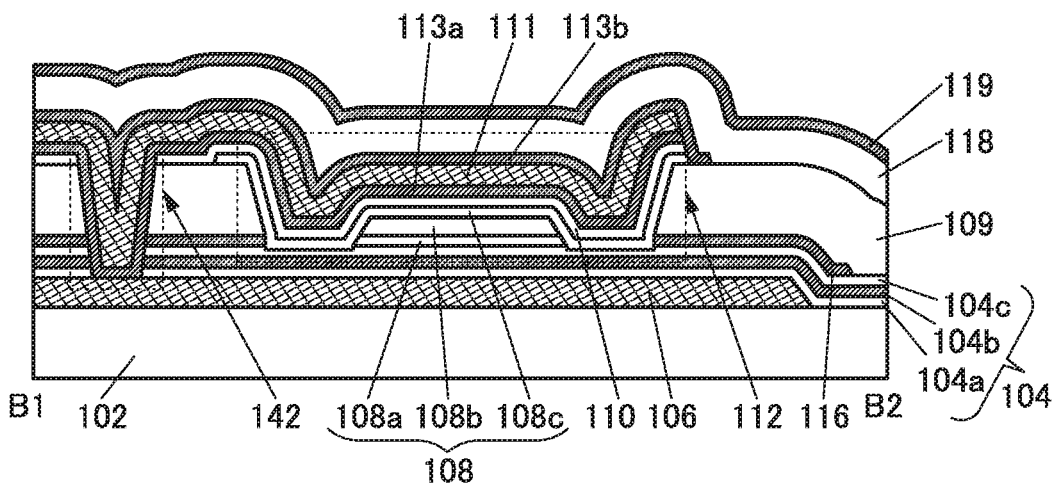

FIG. 3(A) is a top view of a transistor 100B, FIG. 3(B) is a cross-sectional view of the transistor 100B in the channel length direction, and FIG. 3(C) is a cross-sectional view of the transistor 100B in the channel width direction.

The transistor 100B differs from the transistor 100 described in Structure example 1 mainly in that the insulating layer 113b is in contact with a top surface and a side surface of the conductive layer 111, a side surface of the insulating layer 113a, a side surface of the insulating layer 110, and a side surface of the semiconductor layer 108c.

In the transistor 100B, films to be the semiconductor layer 108c, the insulating layer 110, the insulating layer 113a, and conductive layer 111 can be successively deposited and then can be processed using the same resist mask. Thus, impurities at the interfaces between respective layers, particularly, the interface between the semiconductor layer 108c and the insulating layer 110 can be reduced; thus, the highly reliable transistor 100B can be obtained.

The above is the description of Structure example 3.

Structure Example 4

Figure 4A:
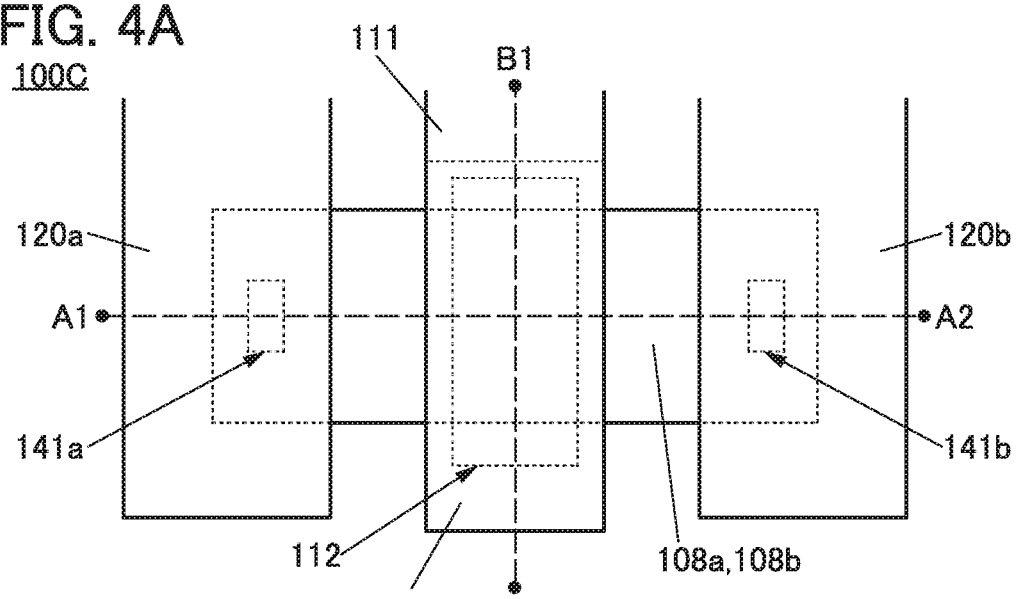
FIG. 4 A structure example of a transistor.
Figure 4B:
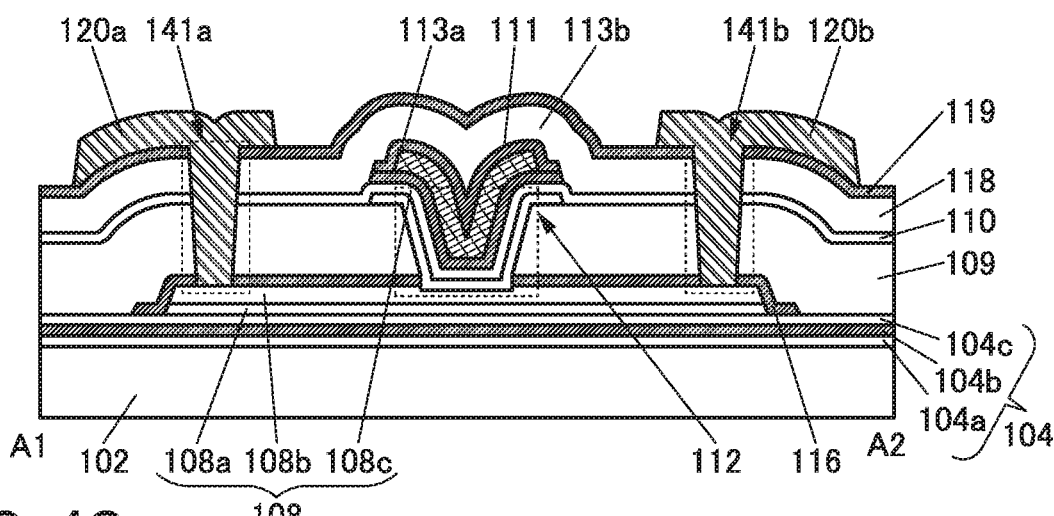
Figure 4C:
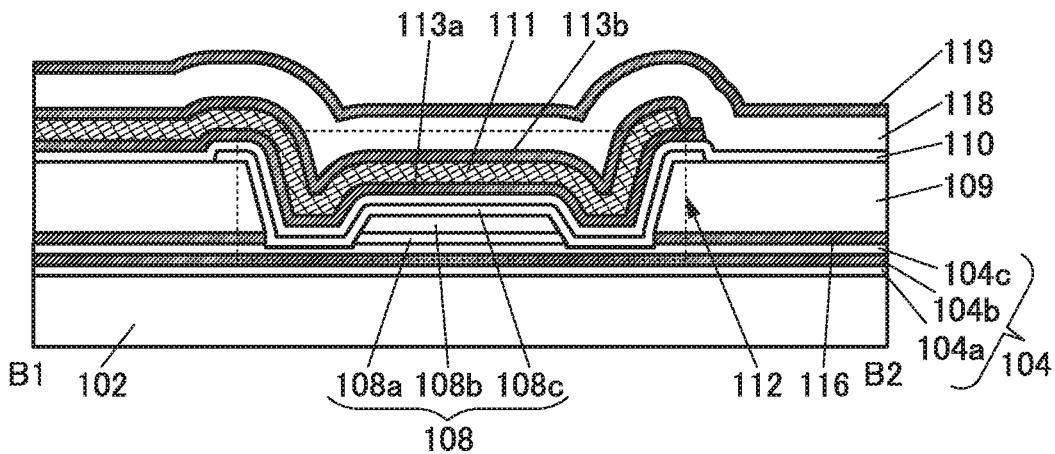

FIG. 4(A) is a top view of a transistor 100C, FIG. 4(B) is a cross-sectional view of the transistor 100C in the channel length direction, and FIG. 4(C) is a cross-sectional view of the transistor 100C in the channel width direction.

The transistor 100C differs from the transistor 100 described in Structure example 1 mainly in that the transistor 100C does not include the conductive layer 106 between the substrate 102 and the insulating layer 104.

Omission of provision of the conductive layer 106 can simplify the process.

The above is the description of Structure example 4.

<Components of Semiconductor Device>

Next, components of the semiconductor device in this embodiment are described in detail.

[Substrate]

Although there is no particular limitation on a material and the like of the substrate 102, it is necessary that the substrate have heat resistance high enough to withstand at least heat treatment performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon or silicon carbide, a compound semiconductor substrate made of silicon germanium or the like, an SOI substrate, or the like can be used, or any of these substrates provided with a semiconductor element may be used as the substrate 102. In the case where a glass substrate is used as the substrate 102, a large-area glass substrate having any of the following sizes is used: the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), the 10.5th generation, the 11th generation, the 12th generation, and the like; thus, a large-sized display device can be manufactured.

A flexible substrate may be used as the substrate 102, and the transistor 100 or the like may be formed directly on the flexible substrate. Alternatively, a separation layer may be provided between the substrate 102 and the transistor 100 and the like. The separation layer can be used when part or the whole of a semiconductor device completed thereover is separated from the substrate 102 and transferred onto another substrate. In such a case, the transistor 100 or the like can be transferred onto a substrate having low heat resistance or a flexible substrate as well.

[Conductive Film]

The conductive layer 111 and the conductive layer 106 functioning as gate electrodes, the conductive layer 120a functioning as a source electrode, and the conductive layer 120b functioning as a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), cobalt (Co), and ruthenium (Ru); an alloy including the above metal elements as its component; an alloy including a combination of the above metal elements; or the like.

Furthermore, the conductive layer 111 and the conductive layer 106 functioning as gate electrodes, the conductive layer 120a functioning as a source electrode, and the conductive layer 120b functioning as a drain electrode can be formed using an oxide conductor or a metal oxide film, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC (Oxide Conductor). As the oxide conductor, for example, oxygen vacancies are formed in a metal oxide, and then hydrogen is added to the oxygen vacancies, so that a donor level is formed in the vicinity of the conduction band. As a result, the conductivity of the metal oxide is increased, so that the metal oxide becomes a conductor. The metal oxide having become a conductor can be referred to as an oxide conductor. A metal oxide generally has a visible light transmitting property because of its large energy gap. Meanwhile, an oxide conductor is a metal oxide having a donor level in the vicinity of the conduction band. Therefore, the influence of absorption due to the donor level is small in an oxide conductor, and an oxide conductor has a visible light transmitting property comparable to that of a metal oxide.

The conductive layer 111 may have a stacked-layer structure of a conductive film containing the above-described oxide conductor (metal oxide) and a conductive film containing a metal or an alloy. The use of the conductive film containing a metal or an alloy can reduce the wiring resistance. At this time, the conductive film in contact with the insulating layer functioning as a gate insulating film is preferably a conductive film containing an oxide conductor.

Moreover, a Cu—X alloy film (X is Mn, Ni, Cr, Fe, Co, Mo, Ta, or Ti) may be used for the conductive layer 111, the conductive layer 106, the conductive layer 120a, and the conductive layer 120b. The use of a Cu—X alloy film enables the manufacturing cost to be reduced because wet etching process can be used in the processing.

Among the above-mentioned metal elements, it is particularly preferable that any one or more selected from titanium, tungsten, tantalum, and molybdenum be included in the conductive layer 111, the conductive layer 106, the conductive layer 120a, and the conductive layer 120b. It is particularly preferable that tantalum nitride films be used as the conductive layer 111, the conductive layer 106, the conductive layer 120a, and the conductive layer 120b. The tantalum nitride film has conductivity and a high barrier property against copper or hydrogen. Furthermore, since a tantalum nitride film releases little hydrogen from itself, it can be favorably used as the conductive film in contact with the semiconductor layer 108 or the conductive film in the vicinity of the semiconductor layer 108.

[Insulating Layer 116, Insulating Layer 113a, Insulating Layer 113b, Insulating Layer 119, and Layer 104b]

The insulating layer 116, the insulating layer 113a, the insulating layer 113b, the insulating layer 119, and the layer 104b functioning as a cap layer or the like preferably contain a metal element and oxygen or nitrogen. Note that the metal element contains one or more of metal elements such as aluminum, hafnium, ruthenium, titanium, tantalum, tungsten, and chromium. In other words, as the insulating layer 116, the insulating layer 113a, the insulating layer 113b, the insulating layer 119, and the layer 104b that function as a cap layer or the like, a nitride film containing a metal element or an oxide film containing a metal element can be used.

[Layer 104a and Layer 104c]

The insulating layer 104 can be formed by a sputtering method, a CVD method, an evaporation method, a pulsed laser deposition (PLD) method, a printing method, a coating method, or the like as appropriate. For example, the insulating layer 104 can be formed with a single layer or a stacked layer including an oxide insulating film or a nitride insulating film. To improve the properties of the interface with the semiconductor layer 108, at least a region in the insulating layer 104, which is in contact with the semiconductor layer 108, is preferably formed using an oxide insulating film. When an oxide insulating film from which oxygen is released by heating is used as the insulating layer 104, oxygen contained in the insulating layer 104 can be moved to the semiconductor layer 108 by heat treatment.

The thickness of the insulating layer 104 can be greater than or equal to 50 nm, greater than or equal to 100 nm and less than or equal to 3000 nm, or greater than or equal to 200 nm and less than or equal to 1000 nm. By increasing the thickness of the insulating layer 104, the amount of oxygen released from the insulating layer 104 can be increased; furthermore, interface states at the interface between the insulating layer 104 and the semiconductor layer 108 and oxygen vacancies included in the semiconductor layer 108 can be reduced.

For example, a single layer or stacked layers using silicon oxide, silicon oxynitride, silicon nitride oxide, silicon nitride, aluminum oxide, hafnium oxide, gallium oxide, a Ga—Zn oxide, or the like can be provided as the insulating layer 104. In this embodiment, the insulating layer 104 has a stacked-layer structure of a silicon nitride film and a silicon oxynitride film. With the insulating layer 104 having such a stacked-layer structure including a silicon nitride film on the lower layer side and a silicon oxynitride film on the upper layer side, oxygen can be efficiently introduced into the semiconductor layer 108.

A film other than an oxide film, such as a silicon nitride film, can be used as a side of the insulating layer 104 that is in contact with the semiconductor layer 108. In that case, pretreatment such as oxygen plasma treatment is preferably performed on a surface of the insulating layer 104 that is to be in contact with the semiconductor layer 108 to oxidize the surface of the insulating layer 104 or the vicinity of the surface.

[Insulating Layer 110]

As the insulating layer 110 functioning as a gate insulating film of the transistor 100 or the like, an insulating layer including one or more of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating layer 110 may have a stacked-layer structure of two layers or a stacked-layer structure of three or more layers.

The insulating layer 110 that is in contact with the semiconductor layer 108 functioning as the channel formation region of the transistor 100 or the like is preferably an oxide insulating film and preferably includes a region including oxygen in excess of that in the stoichiometric composition (excess oxygen region). In other words, the insulating layer 110 is an insulating film capable of releasing oxygen. Note that in order to provide the excess oxygen region in the insulating layer 110, the insulating layer 110 is formed in an oxygen atmosphere, or the deposited insulating layer 110 is subjected to heat treatment in an oxygen atmosphere, for example.

In the case of using hafnium oxide for the insulating layer 110, the following effects are attained. Hafnium oxide has a higher dielectric constant than silicon oxide and silicon oxynitride. Therefore, the thickness of the insulating layer 110 can be made large as compared with the case of using silicon oxide; thus, a leakage current due to a tunnel current can be low. That is, it is possible to achieve a transistor with a low off-state current. Moreover, hafnium oxide having a crystal structure has a higher dielectric constant than hafnium oxide having an amorphous structure. Therefore, it is preferable to use hafnium oxide having a crystal structure, in order to obtain a transistor with a low off-state current. Examples of the crystal structure include a monoclinic crystal structure and a cubic crystal structure. However, one embodiment of the present invention is not limited thereto.

It is preferable that the insulating layer 110 have few defects and typically have as few signals observed by electron spin resonance (ESR) spectroscopy as possible. Examples of the signals include an E' center observed at a g-factor of 2.001. Note that the E' center is due to the dangling bond of silicon. As the insulating layer 110, a silicon oxide film or a silicon oxynitride film whose spin density due to the E' center is lower than or equal to $3 \times 10^{17}$ spins/cm$^3$ and preferably lower than or equal to $5 \times 10^{16}$ spins/cm$^3$ may be used.

<Semiconductor Layer 108>

In the case where the semiconductor layer 108 is an In-M-Zn oxide, the atomic ratio of the metal elements in a sputtering target used to deposit the In-M-Zn oxide preferably satisfies In M Examples of the atomic ratio of the metal elements in such a sputtering target include In:M:Zn=1:1:0.5, In:M:Zn=1:1:1, In:M:Zn=1:1:1.2, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, In:M:Zn=5:2:5, and the like.

In the case where the semiconductor layer 108 is an In-M-Zn oxide, a target containing a polycrystalline In-M-Zn oxide is preferably used as the sputtering target. The use of the target containing a polycrystalline In-M-Zn oxide facilitates formation of the semiconductor layer 108 having crystallinity. Note that the atomic ratio in the semiconductor layer 108 to be deposited varies in the range of ±40% from any of the above atomic ratios of the metal elements contained in the sputtering target. For example, in the case where the composition of a sputtering target used for the semiconductor layer 108 is In:Ga:Zn=4:2:4.1 [atomic ratio], the composition of the semiconductor layer 108 to be deposited is In:Ga:Zn=4:2:3 [atomic ratio] or its neighborhood in some cases.

The energy gap of the semiconductor layer 108 is 2 eV or more, preferably 2.5 eV or more. With the use of a metal oxide having such a wide energy gap, the off-state current of the transistor can be reduced.

Furthermore, the semiconductor layer 108 preferably has a non-single-crystal structure. The non-single-crystal structure includes, for example, a CAAC-OS (C Axis Aligned Crystalline Oxide Semiconductor), a polycrystalline structure, a microcrystalline structure, or an amorphous structure. Among the non-single-crystal structures, the amorphous structure has the highest density of defect states, whereas the CAAC-OS has the lowest density of defect states.

Note that the semiconductor layer 108 of one embodiment of the present invention is not limited to the structure including a metal oxide in the channel formation region of the transistor. For example, in the semiconductor device of this embodiment, silicon can be used in the channel formation region of the transistor. As the silicon, hydrogenated amorphous silicon (a-Si:H), low temperature poly-silicon (LTPS), or crystalline silicon can be used. As crystalline silicon, microcrystalline silicon, polycrystalline silicon, single crystal silicon, and the like can be given.

<Manufacturing Method Example 1>

A manufacturing method example of a transistor of one embodiment of the present invention is described below. Here, description is made giving, as an example, the transistor 100A described above in Structure example 2.

Note that thin films that form the semiconductor device (insulating films, semiconductor films, conductive films, and the like) can be formed by a sputtering method, a chemical vapor deposition (CVD) method, a vacuum evaporation method, a pulse laser deposition (PLD) method, an ALD method, or the like. Examples of the CVD method include a plasma-enhanced chemical vapor deposition (PECVD) method and a thermal CVD method. In addition, as an example of the thermal CVD method, a metal organic CVD (MOCVD) method can be given.

The thin films that form the semiconductor device can be formed by a method such as spin coating, dipping, spray coating, ink-jetting, dispensing, screen printing, or offset printing, or with a tool (equipment) such as a doctor knife, a slit coater, a roll coater, a curtain coater, or a knife coater.

When the thin films that form the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a deposition method using a blocking mask such as a metal mask.

There are the following two typical ways of a photolithography method. One is a method in which a resist mask is formed over a thin film that is to be processed, the thin film is processed by etching or the like, and the resist mask is removed. The other is a method in which, after a photosensitive thin film is deposited, exposure and development are performed to process the thin film into a desired shape.

As light used for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Furthermore, exposure may be performed by liquid immersion light exposure technique. Furthermore, as the light used for the exposure, extreme ultra-violet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is unnecessary.

For etching of thin films, a dry etching method, a wet etching method, a sandblasting method, or the like can be used.

FIG. 6 to FIG. 8 are cross-sectional views in the channel length direction illustrating a method for manufacturing the transistor 100A.

[Formation of Conductive Layer 106]

Figure 5A:
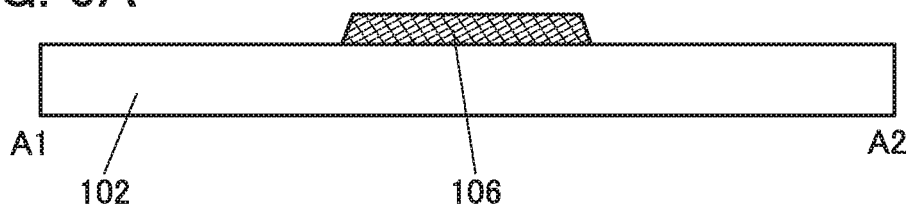
FIG. 5 Diagrams illustrating a method for manufacturing a transistor.

A conductive film is formed over the substrate 102 and processed by etching, whereby the conductive layer 106 functioning as the first gate electrode is formed (FIG. 5(A)).

[Formation of Insulating Layer 104]

Figure 5B:
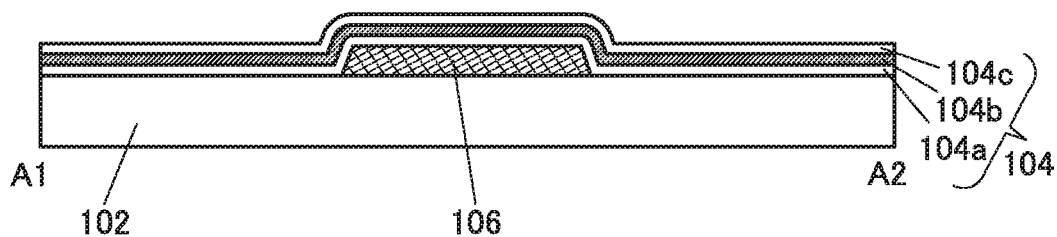

Then, the insulating layer 104 is formed to cover the substrate 102 and the conductive layer 106 (FIG. 5(B)). The insulating layer 104 can be formed by a plasma CVD method, an ALD method, a sputtering method, or the like.

Here, the insulating layer 104 having a three-layer structure is formed.

As the first layer 104a and the third layer 104c, an insulating film containing silicon, such as a silicon oxide film, a silicon oxynitride film, a silicon nitride oxide film, or a silicon nitride film, is formed by a plasma CVD method, a sputtering method, or the like.

As the second layer 104b, an insulating film containing a metal oxide not containing silicon, such as an aluminum oxide film, a hafnium oxide film, or a hafnium aluminate film, is formed by a sputtering method or an ALD method.

Here, after the insulating layer 104 is formed, oxygen is preferably added to the insulating layer 104. As oxygen added to the insulating layer 104, an oxygen radical, an oxygen atom, an oxygen atomic ion, an oxygen molecular ion, or the like may be used. As an addition method, an ion doping method, an ion implantation method, a plasma treatment method, or the like is given. Alternatively, a film that suppresses oxygen release may be formed over the insulating layer 104, and then oxygen may be added to the insulating layer 104 through the film.

As the above film that suppresses oxygen release, a conductive film or a semiconductor film containing one or more of indium, zinc, gallium, tin, aluminum, chromium, tantalum, titanium, molybdenum, nickel, iron, cobalt, and tungsten can be used.

In the case where oxygen is added by plasma treatment, oxygen is excited by a microwave to generate high-density oxygen plasma, whereby the amount of oxygen added to the insulating layer 104 can be increased. By performing plasma treatment in an atmosphere containing oxygen, water, hydrogen, or the like adsorbed on the surface of the insulating layer 104 can be removed. Accordingly, the amount of water or hydrogen which might exist in the semiconductor layer 108 formed later or at an interface between the semiconductor layer 108 and the insulating layer 104 can be reduced.

In the case where silicon nitride, silicon nitride oxide, or the like is used as the insulating layer 104, hydrogen is contained in the insulating layer 104 in some cases. At this time, the above-described plasma treatment or the like can reduce the hydrogen concentration at least on the semiconductor layer 108 side.

[Formation of Semiconductor Layer 108a and Semiconductor Layer 108b]

Figure 5C:
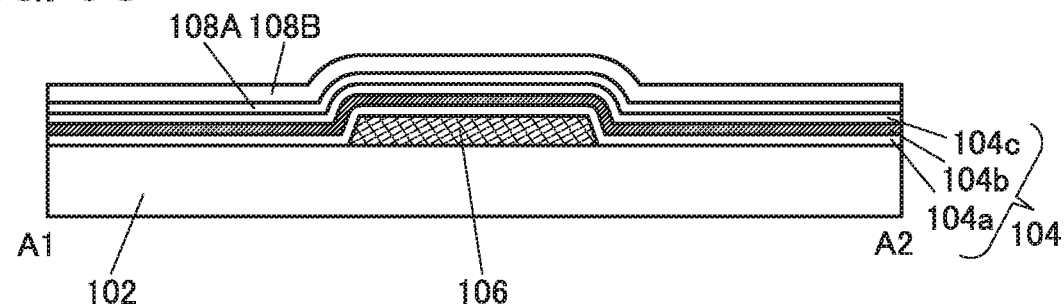

Next, a semiconductor film 108A to be the semiconductor layer 108a and a semiconductor film 108B to be the semiconductor layer 108b are formed over the insulating layer 104 (see FIG. 5(C)).

The semiconductor film 108A and the semiconductor film 108B are preferably formed by a sputtering method using a metal oxide target.

When the semiconductor film 108A and the semiconductor film 108B are deposited, an inert gas (e.g., a helium gas, an argon gas, or a xenon gas) may be mixed in addition to the oxygen gas.

For example, the proportion of the oxygen gas in the whole deposition gas (hereinafter also referred to as oxygen flow rate ratio) in depositing the semiconductor film 108A is preferably higher than or equal to 0% and lower than or equal to 100%, further preferably higher than or equal to 10% and lower than or equal to 50%. With the above-described oxygen flow rate ratio, the semiconductor film 108A with lower crystallinity than that of the semiconductor film 108B can be formed. When the crystallinity of the semiconductor film 108A is lower than that of the semiconductor film 108B, oxygen released from the insulating layer 110 and the like is easily supplied to the semiconductor film 108B. When the semiconductor film 108A is deposited, part of oxygen contained in the sputtering gas is supplied to the insulating layer 104 in some cases.

For example, the oxygen flow rate at the time of depositing the semiconductor film 108B is higher than or equal to 0% and lower than or equal to 100%, preferably higher than or equal to 5% and lower than or equal to 50%. When a metal oxide film with relatively low crystallinity is formed with a low oxygen flow rate ratio, a transistor with high on-state current can be obtained.

In addition, the semiconductor film 108A and the semiconductor film 108B are deposited at a substrate temperature higher than or equal to room temperature and lower than or equal to 250° C., preferably higher than or equal to 130° C. and lower than 220° C. The substrate temperature at the time of deposition of the metal oxide film is preferably, for example, higher than or equal to room temperature and lower than 220° C. because the productivity is increased. Moreover, a metal oxide film with high crystallinity can be easily deposited by depositing a metal oxide film while the substrate temperature is high. When the metal oxide film is deposited with the substrate temperature set at room temperature or without intentional heating, the metal oxide film is likely to have low crystallinity.

The thickness of the semiconductor film 108A is greater than or equal to 3 nm and less than or equal to 200 nm, preferably greater than or equal to 3 nm and less than or equal to 100 nm, further preferably greater than or equal to 3 nm and less than or equal to 60 nm.

The thickness of the semiconductor film 108B is greater than or equal to 3 nm and less than or equal to 200 nm, preferably greater than or equal to 3 nm and less than or equal to 100 nm, further preferably greater than or equal to 3 nm and less than or equal to 60 nm.

Note that in the case where a large-sized glass substrate (e.g., the 6th generation to the 12th generation) is used as the substrate 102 and in the case where the substrate temperature in depositing the metal oxide film is higher than or equal to 220° C. and lower than or equal to 300° C., the substrate 102 might be changed in shape (distorted or warped). Therefore, in the case where a large-sized glass substrate is used, the change in the shape of the glass substrate can be suppressed by setting the substrate temperature in depositing the metal oxide film to higher than or equal to room temperature and lower than 220° C.

In addition, increasing the purity of a sputtering gas is also necessary. For example, as an oxygen gas or an argon gas used as a sputtering gas, a gas highly purified to have a dew point of −40° C. or lower, preferably −80° C. or lower, further preferably −100° C. or lower, still further preferably −120° C. or lower is used, whereby entry of moisture or the like into the metal oxide film can be prevented as much as possible.

In the case where the metal oxide film is deposited by a sputtering method, a chamber in a sputtering apparatus is preferably evacuated to be a high vacuum (to the degree of about $5 \times 10^{-7}$ Pa to $1 \times 10^{-4}$ Pa) with an adsorption vacuum evacuation pump such as a cryopump in order to remove water or the like, which serves as an impurity for the metal oxide, as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa.

Before the deposition of the metal oxide film, it is preferable to perform heat treatment for releasing water and hydrogen adsorbed on the surface of the insulating layer 104. For example, heat treatment can be performed at a temperature higher than or equal to 70° C. and lower than or equal to 400° C. in a reduced-pressure atmosphere. At that time, the metal oxide film is preferably deposited successively without exposure of the surface of the insulating layer 104 to the air. For instance, a deposition apparatus is preferably configured so that a heating chamber where the substrate is heated and a deposition chamber where the metal oxide film is deposited are connected through a gate valve or the like.

Figure 5D:
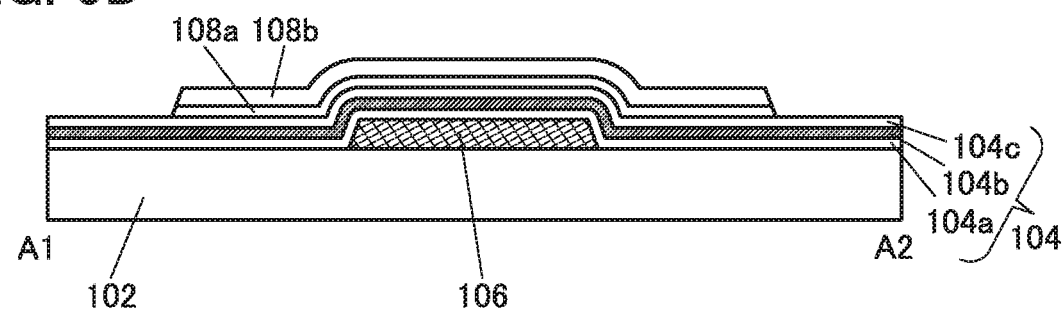

Note that the semiconductor film 108A and the semiconductor film 108B are processed into the semiconductor layer 108a and the semiconductor layer 108b (FIG. 5(D)). To process the semiconductor film 108A and the semiconductor film 108B, a wet etching method and/or a dry etching method can be used.

After the semiconductor film 108A and the semiconductor film 108B are deposited or after they are processed into the semiconductor layer 108a and the semiconductor layer 108b, heat treatment may be performed so that dehydrogenation or dehydration of the metal oxide film or the semiconductor layer 108 is performed. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert atmosphere containing nitrogen or a rare gas such as helium, neon, argon, xenon, or krypton. Alternatively, heating may be performed in an inert atmosphere, and then heating may be performed in an oxygen atmosphere. Note that it is preferable that the above inert atmosphere and oxygen atmosphere not contain hydrogen, water, or the like. The treatment time may be longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate only for a short time. Therefore, the heat treatment time can be shortened.

When the metal oxide film is deposited while being heated or heat treatment is performed after the metal oxide film is formed, the hydrogen concentration in the metal oxide film, which is measured by SIMS, can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

[Formation of Insulating Layer 116]

Figure 5E:
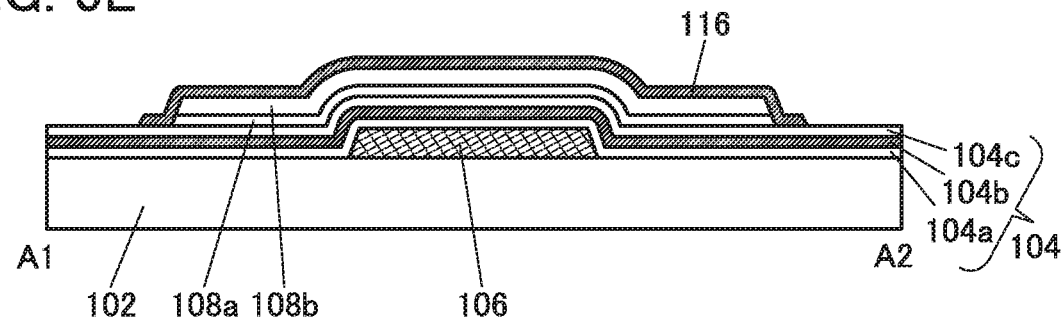

Next, an insulating film to be the insulating layer 116 is deposited over the insulating layer 104, the semiconductor layer 108a, and the semiconductor layer 108b, and the insulating film is processed, so that the insulating layer 116 is formed (FIG. 5(E)).

An insulating film to be the insulating layer 116 is preferably formed by a deposition method such as a sputtering method or an ALD method. Specifically, by an ALD method, a highly dense film can be formed with high step coverage; thus, a film having high barrier properties can be obtained.

The insulating layer 116 preferably contains a metal element and oxygen or nitrogen. Note that the metal element is one or more of metal elements selected from aluminum, hafnium, ruthenium, titanium, tantalum, tungsten, chromium, and the like. In other words, as the insulating layer 116, a nitride film containing a metal element or an oxide film containing a metal element can be used.

The insulating layer 116 is preferably provided to cover and be in contact with the semiconductor layer 108a and the semiconductor layer 108b. Thus, a metal element in the film is added to the semiconductor layer 108a and the semiconductor layer 108b, and a metal compound is formed in the semiconductor layer 108a and the semiconductor layer 108b in some cases. The metal compound sometimes attracts hydrogen contained in the semiconductor layer 108a and the semiconductor layer 108b.

The carrier density of the oxide semiconductor is increased when hydrogen, nitrogen, or the like exists. Hydrogen in the oxide semiconductor reacts with oxygen, which is bonded to a metal atom, to be water, and thus forms oxygen vacancies in some cases. Entry of hydrogen into the oxygen vacancies increases carrier density. Furthermore, in some cases, part of hydrogen is bonded to oxygen, which is bonded to a metal atom, whereby an electron serving as a carrier is generated. That is, the resistance of an oxide semiconductor containing nitrogen or hydrogen is reduced.

[Formation of Insulating Film 109f]

Figure 6A:
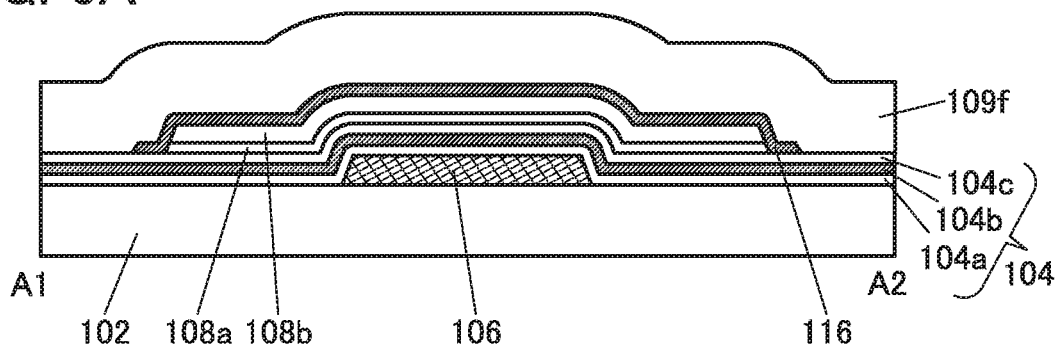
FIG. 6 Diagrams illustrating a method for manufacturing a transistor.
Figure 7A:
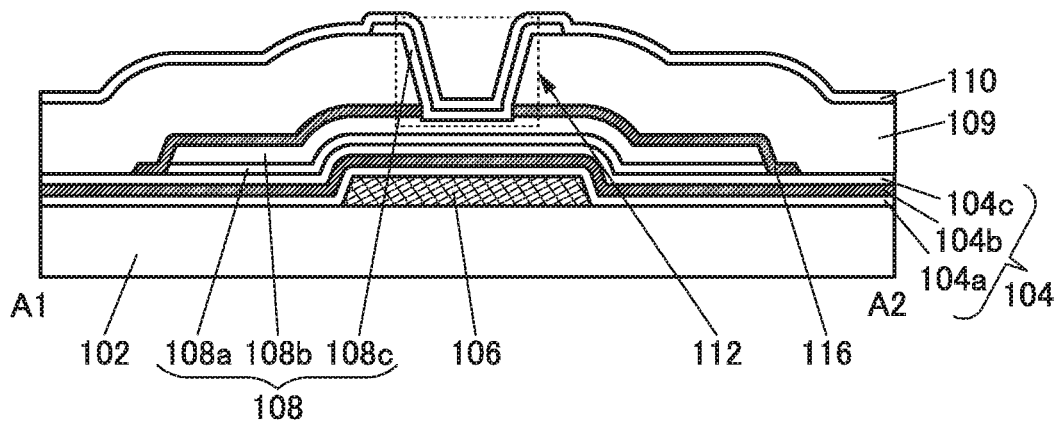
FIG. 7 Diagrams illustrating a method for manufacturing a transistor.

Next, the insulating film 109f to be the insulating layer 109 is deposited over the semiconductor layer 108 and the insulating layer 116 (FIG. 6(A)).

As the insulating film 109f, for example, an oxide film such as a silicon oxide film or a silicon oxynitride film is preferably formed with a plasma-enhanced chemical vapor deposition apparatus (a PECVD apparatus or simply referred to as a plasma CVD apparatus). In this case, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having a small amount of defects can be formed as the insulating film 109f with the PECVD apparatus in which the flow rate of the oxidizing gas is more than 20 times and less than 100 times, or more than or equal to 40 times and less than or equal to 80 times the flow rate of the deposition gas and the pressure in a treatment chamber is lower than 100 Pa or lower than or equal to 50 Pa.

As the insulating film 109f, a dense silicon oxide film or silicon oxynitride film can be formed as the insulating film 109 under the following conditions: the substrate placed in a vacuum-evacuated treatment chamber of the PECVD apparatus is held at higher than or equal to 280° C. and lower than or equal to 350° C.; a source gas is introduced into the treatment chamber; the pressure in the treatment chamber is set to higher than or equal to 20 Pa and lower than or equal to 250 Pa, further preferably higher than or equal to 100 Pa and lower than or equal to 250 Pa; and a high-frequency power is supplied to an electrode provided in the treatment chamber.

The insulating film 109f may be formed by a PECVD method using a microwave. A microwave refers to a wave in the frequency range of 300 MHz to 300 GHz. In the case of using a microwave, electron temperature and electron energy are low. Furthermore, in supplied power, the proportion of power used for acceleration of electrons is low, and power can be used for dissociation and ionization of more molecules; thus, plasma with a high density (high-density plasma) can be excited. Accordingly, with little plasma damage to the deposition surface or a deposit, the insulating film 109f having few defects can be formed.

Alternatively, the insulating film 109f can be formed by a CVD method using an organosilane gas. As the organosilane gas, a silicon-containing compound such as tetraethyl orthosilicate (TEOS: chemical formula $Si(OC_2H_5)_4$), tetramethylsilane (TMS: chemical formula $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like can be used. The insulating film 109f having high coverage can be formed by a CVD method using an organosilane gas.

[Etching of Insulating Layer 116 and Insulating Film 109f]

Figure 6B:
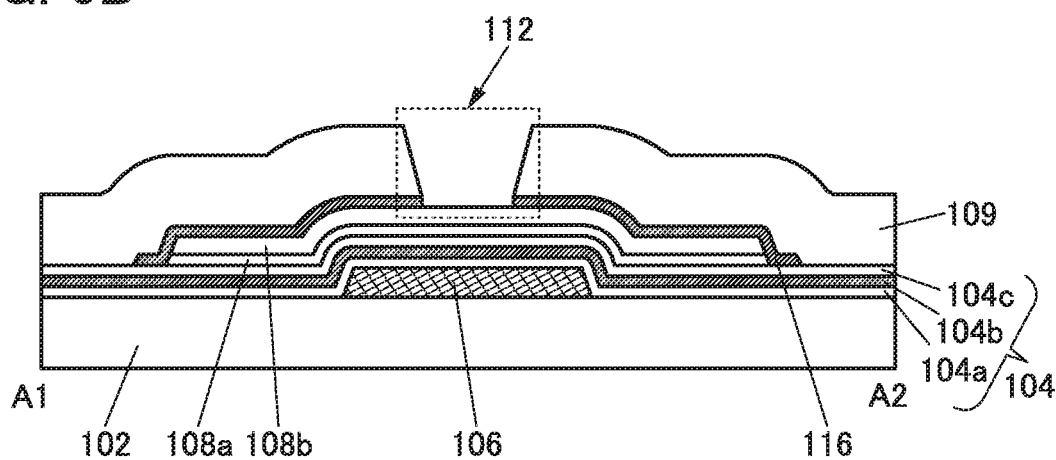

Next, parts of the insulating layer 116 and the insulating film 109f that overlap with the conductive layer 106 are etched to expose part of the semiconductor layer 108b (FIG. 6(B)).

Here, the insulating layer 116 and the insulating film 109f are preferably processed using the same resist mask. Accordingly, the opening 112 having substantially the same top surface shape can be formed over the semiconductor layer 108b.

Note that in this specification and the like, the expression "having substantially the same top surface shape" means that at least outlines of stacked layers partly overlap with each other. For example, the case of processing or partly processing an upper layer and a lower layer with the use of the same mask pattern is included. The expression "having substantially the same top surface shape" also includes the case where the outlines do not completely overlap with each other; for instance, the edge of the upper layer may be positioned on the inner side or the outer side of the edge of the lower layer.

Note that in some cases, part of the semiconductor layer 108b is etched at the etching of the insulating layer 109 and the insulating layer 116 so that the thickness of the semiconductor layer 108b is reduced.

[Formation of Semiconductor Layer 108c]

Figure 6C:
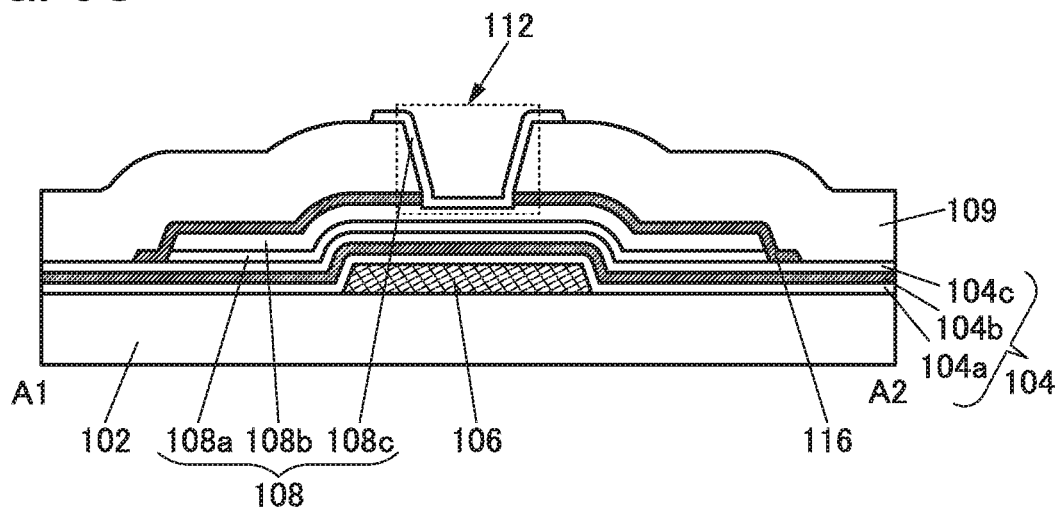

Next, a semiconductor film to be the semiconductor layer 108c is formed over the insulating layer 109 and the opening 112 and processed to form the semiconductor layer 108c (FIG. 6(C)).

The description of the semiconductor layer 108a can be referred to for the formation of the semiconductor layer 108c; thus, the details thereof are omitted. The semiconductor layer 108c is preferably formed by a sputtering method using a metal oxide target.

Furthermore, when the oxide the semiconductor layer 108c is deposited, an inert gas (e.g., a helium gas, an argon gas, or a xenon gas) may be mixed in addition to the oxygen gas.

For example, the proportion of the oxygen gas in the whole deposition gas (hereinafter also referred to as oxygen flow rate ratio) in depositing the semiconductor layer 108c is preferably higher than or equal to 0% and lower than or equal to 100%, further preferably higher than or equal to 50% and lower than or equal to 100%. When the oxygen flow rate ratio is high, at the time of the deposition of the semiconductor layer 108c, part of oxygen contained in the sputtering gas is sometimes supplied to the semiconductor layer 108a and the semiconductor layer 108b in some cases.

The semiconductor layer 108c may be deposited at a substrate temperature higher than or equal to room temperature and lower than or equal to 250° C., preferably higher than or equal to 130° C. and lower than 220° C. The substrate temperature at the time of deposition of the metal oxide film is preferably, for example, higher than or equal to room temperature and lower than 220° C. because the productivity is increased. Moreover, a metal oxide film with high crystallinity can be easily deposited by depositing a metal oxide film while the substrate temperature is high. When the metal oxide film is formed with the substrate temperature set at room temperature or without heating, the metal oxide film is likely to have low crystallinity.

The thickness of the semiconductor layer 108c is greater than or equal to 3 nm and less than or equal to 200 nm, preferably greater than or equal to 3 nm and less than or equal to 100 nm, further preferably greater than or equal to 3 nm and less than or equal to 60 nm.

[Heat Treatment]

After the semiconductor layer 108c is formed, heat treatment is performed. At this time, it is preferable that heat treatment be performed in a nitrogen atmosphere, and then heat treatment be performed thereon in an oxygen atmosphere.

By the heat treatment, oxygen released from the semiconductor layer 108c is supplied to the semiconductor layer 108a and the semiconductor layer 108b, so that oxygen vacancies in the semiconductor layer 108a and the semiconductor layer 108b can be reduced. Accordingly, high-resistance (low carrier concentration) regions are formed in portions of the semiconductor layer 108a and the semiconductor layer 108b that are in contact with the semiconductor layer 108c.

The maximum temperature of the heat treatment is preferably as high as possible, and when a large-sized substrate is used, the heat treatment temperature is higher than or equal to 100° C. and lower than or equal to 450° C., preferably higher than or equal to 150° C. and lower than or equal to 450° C., further preferably higher than or equal to 200° C. and lower than or equal to 450° C., further preferably higher than or equal to 250° C. and lower than or equal to 450° C., and further preferably higher than or equal to 300° C. and lower than or equal to 420° C., for example. The semiconductor layer 108c includes a large amount of excess oxygen, and therefore, a sufficient amount of oxygen can be supplied to the semiconductor layer 108a and the semiconductor layer 108b even by heat treatment at comparatively low temperatures.

[Deposition of Insulating Layer 110]

Next, the insulating layer 110 is deposited. The insulating layer 110 can be deposited by a plasma CVD method, a sputtering method, or the like. The insulating layer 110 is preferably formed using a silicon oxide film or a silicon oxynitride film that is dense and has few defects as in the case of the insulating layer 109 (FIG. 7(A)).

[Formation of Opening 142]

Figure 9:
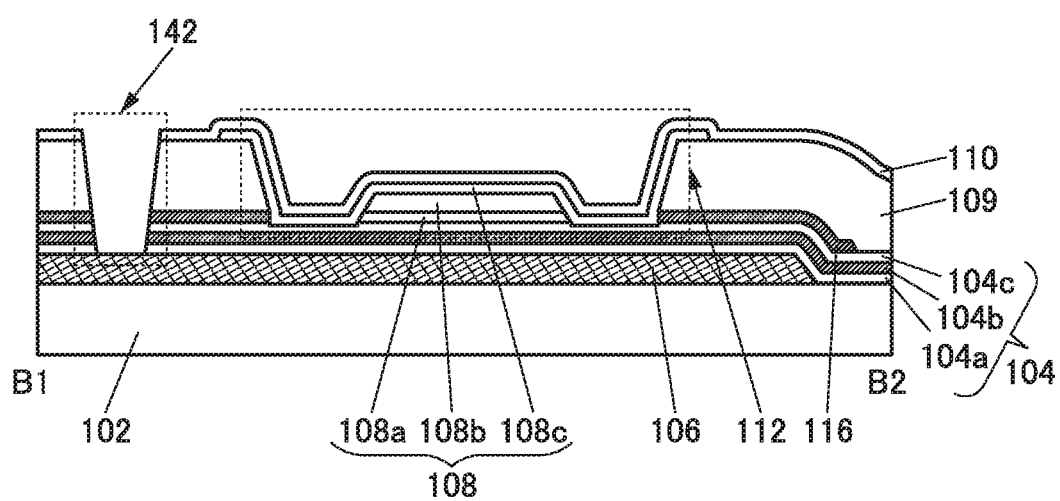
FIG. 9 A diagram illustrating a method for manufacturing a transistor.

Next, part of the insulating layer 110, the insulating layer 109, the insulating layer 116, and the insulating layer 104 in a region overlapping with the conductive layer 106 is etched to expose part of the conductive layer 106 (FIG. 9). FIG. 9 corresponds to a cross-sectional view of a cut plane taken along dashed dotted line B1-B2 in FIG. 1(A).

An opening 142 is formed, so that the conductive layer 111 to be formed in a later step can be electrically connected to the conductive layer 106 through the opening 142. Note that in the case where the conductive layer 111 is not electrically connected to the conductive layer 106, the opening 142 is not necessarily formed.

[Formation of Conductive Layer 111]

Figure 7B:
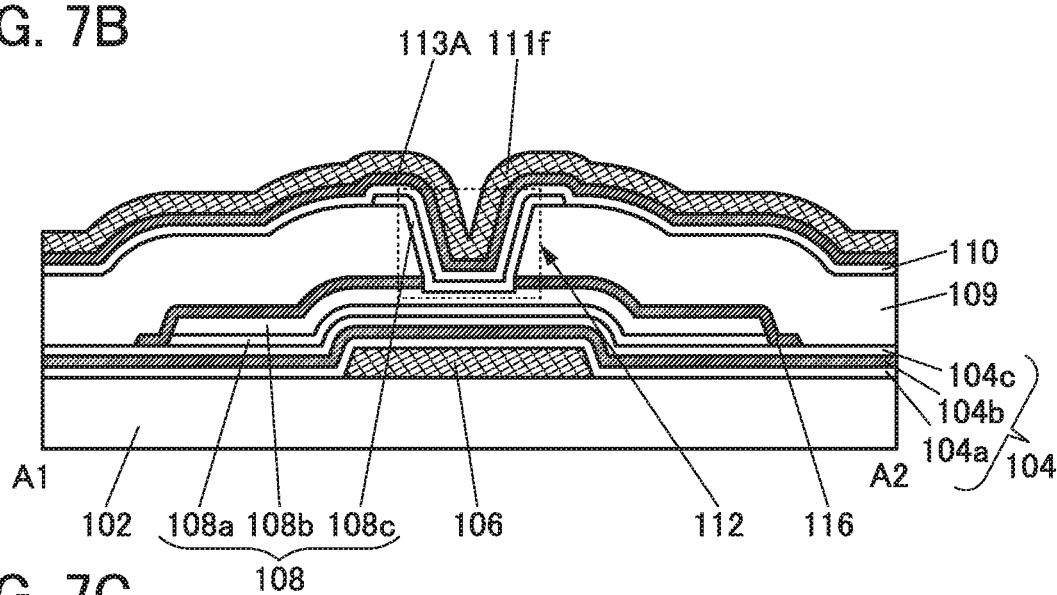
Figure 7C:
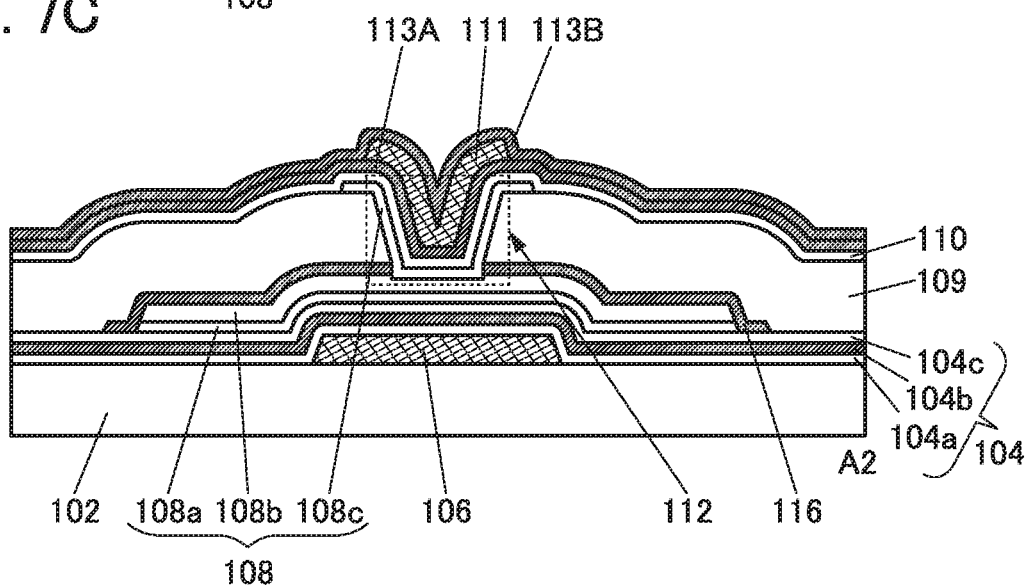

Next, the insulating film 113A to be the insulating layer 113a and the conductive film 111f to be the conductive layer 111 are deposited over the insulating layer 110 (FIG. 7(B)). The insulating film 113A and the conductive film 111f are preferably deposited by a sputtering method using a sputtering target of a metal or an alloy. The insulating film 113A and the conductive film 111f are deposited over the insulating layer 110 to cover the opening 112.

Next, the conductive film 111f is processed to form the conductive layer 111. Next, an insulating film 113B to be the insulating layer 113b is deposited to cover the conductive layer 111 and the insulating film 113A (FIG. 7(C)).

Figure 8A:
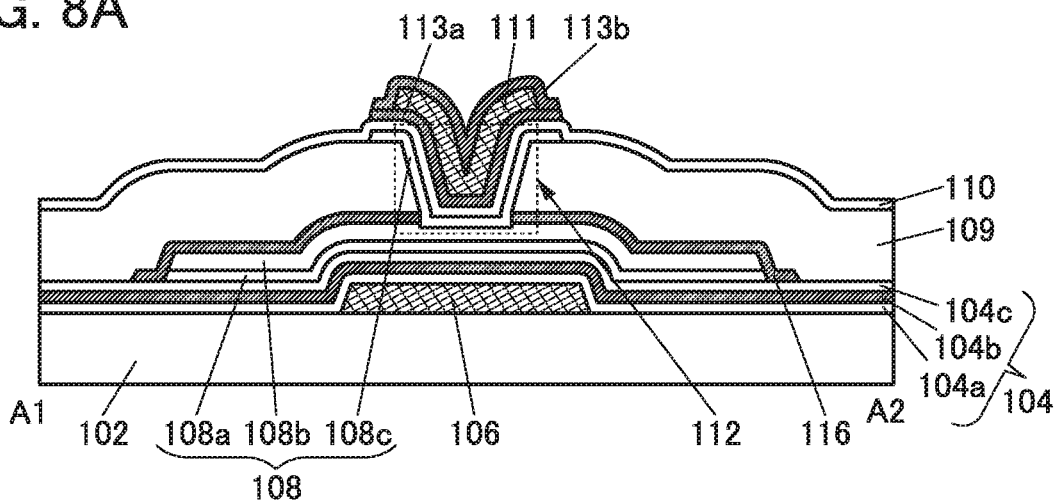
FIG. 8 Diagrams illustrating a method for manufacturing a transistor.

Next, the insulating film 113A and the insulating film 113B are processed, so that the insulating layer 113a and the insulating layer 113b are formed, respectively (FIG. 8(A)). At this time, it is preferable to perform processing so that end portions of the insulating layer 113a and the insulating layer 113b are in contact with each other and the conductive layer 111 is not exposed.

For the etching of the insulating film 113A and the insulating film 113B, an anisotropic etching method is preferably used. A dry etching method can be suitably used. Accordingly, the insulating layer 113a and the insulating layer 113b can be processed so that end portions of the insulating layer 113a and the insulating layer 113b do not recede. Thus, the insulating layer 113a and the insulating layer 113b can be formed to surround the conductive layer 111. In addition, the insulating layer 113a and the insulating layer 113b that have substantially the same top surface shapes can be formed.

When the insulating layer 113a and the insulating layer 113b are formed using the same insulating film, etching can be easily performed. Furthermore, unevenness is less likely to be formed at the end portions of the insulating layer 113a and the insulating layer 113b, which is preferable.

[Formation of Insulating Layer 118 and Insulating Layer 119]

Figure 8B:
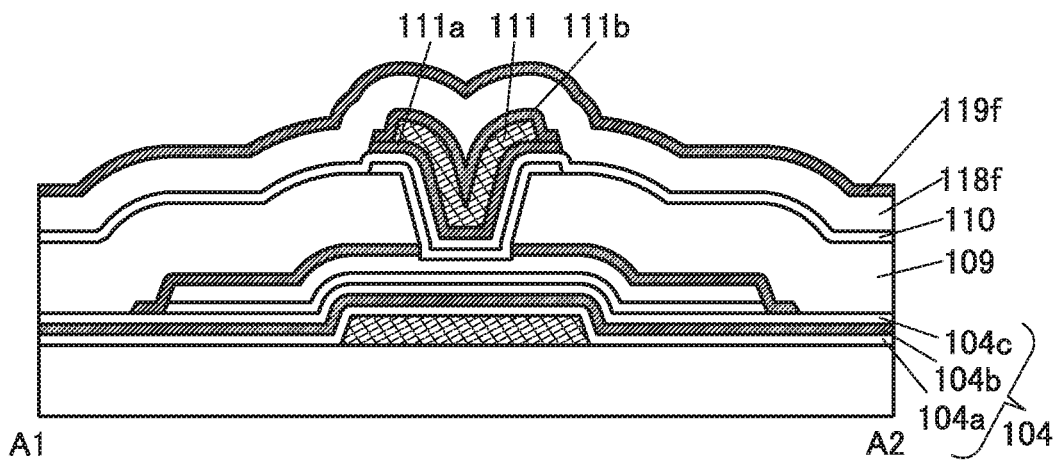

Next, an insulating film 118f and the insulating film 119f are formed to cover the insulating layer 110, the insulating layer 113a, the conductive layer 111, and the insulating layer 113b (FIG. 8(B)).

The insulating layer 118 can be deposited by a plasma CVD method, a sputtering method, or the like. The insulating layer 118 is preferably formed by a method similar to that for the insulating layer 109.

[Formation of Opening 141a and Opening 141b]

Figure 8C:
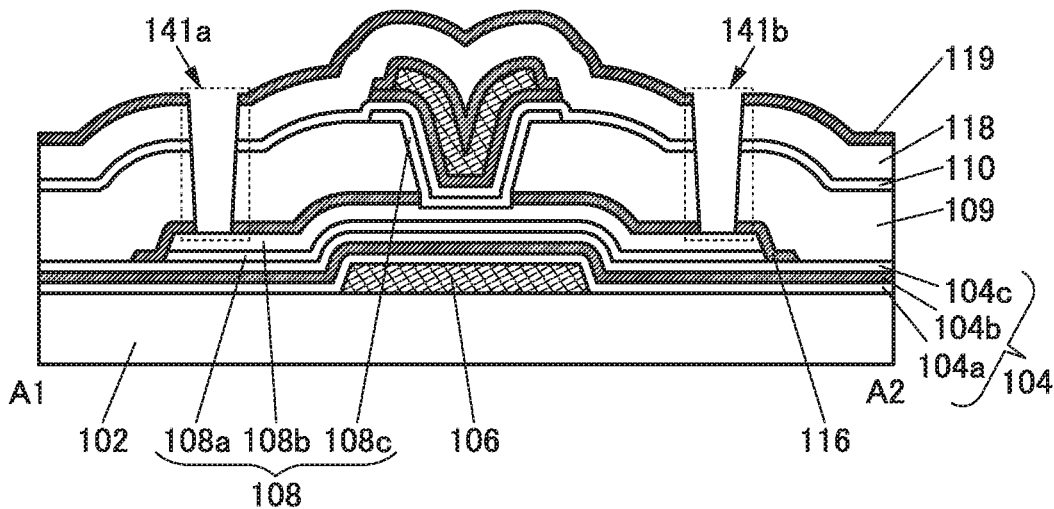

Subsequently, a mask is formed by lithography in a desired position over the insulating layer 118, and then the insulating layer 118, the insulating layer 110, the insulating layer 109, and the insulating layer 116 are partly etched, so that the opening 141a and opening 141b reaching the semiconductor layer 108b are formed (see FIG. 8(C)).

[Formation of Conductive Layer 120a and Conductive Layer 120b]

Next, a conductive film is deposited over the insulating layer 118 to cover the opening 141a and the opening 141b, and the conductive film is processed into a desired shape, whereby the conductive layer 120a and the conductive layer 120b are formed.

Through the above process, the transistor 100 can be manufactured.

According to this manufacturing method, a highly reliable transistor can be manufactured. The maximum temperature can be lower than or equal to 400° C., so that the productivity can be increased.

The above is the description of the manufacturing method example 1.

Note that the transistor 100 described in Structure Example 1 can be manufactured when the formation step of the conductive layer 106 in this manufacturing method example is omitted and the insulating layer 104 is formed of a single layer.

A structure example of a transistor different from the above structure examples is described below.

Structure Example 5

In one embodiment of the present invention, a transistor can be fabricated at low temperatures, and therefore, the transistor can be manufactured over a substrate with comparatively low heat resistance. As an example thereof, a transistor provided over an organic resin substrate that is thin enough to have flexibility is described below.

Figure 11A:
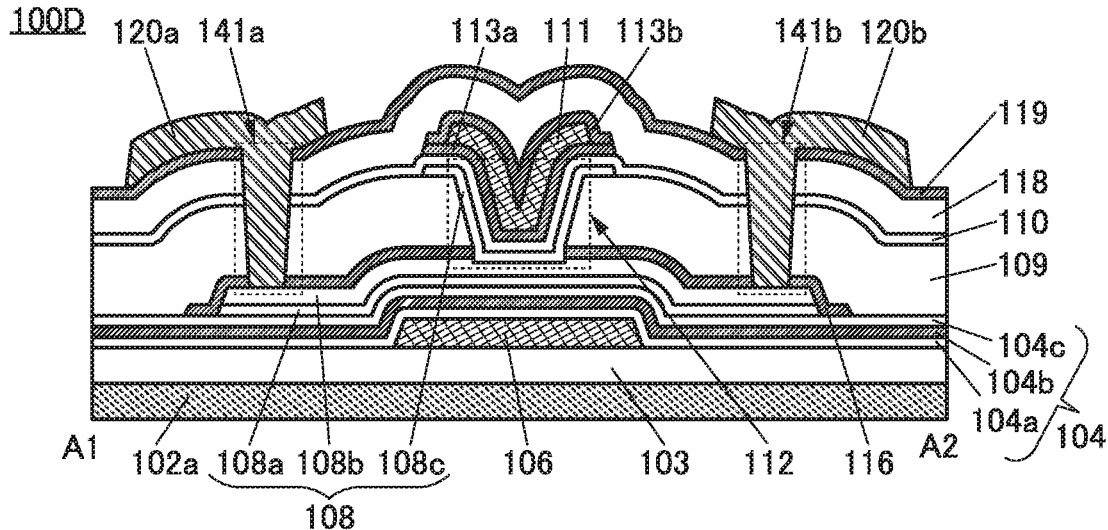
FIG. 11 Structure examples of a transistor.
Figure 11B:
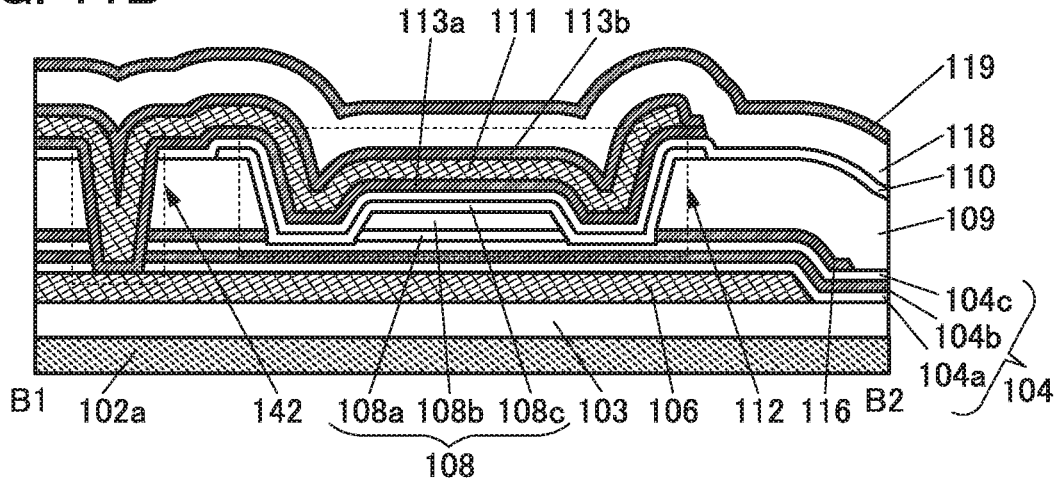

FIG. 11(A) and FIG. 11(B) are cross-sectional views of a transistor 100D described below. Note that FIG. 1(A) can be referred to for a top view. The transistor 100D is different from the transistor 100 of Structure example 1 mainly in that the transistor 100D is provided over a substrate 102a instead of the substrate 102 and includes an insulating layer 103.

As the substrate 102a, a substrate of an organic resin or the like that is thin enough to have flexibility (e.g., a thickness of more than or equal to 100 nm and less than or equal to 100 µm) can be used.

Typically, a polyimide resin can be used as the organic resin. A polyimide resin is preferable because of its excellent heat resistance. Other than that, an acrylic resin, an epoxy resin, a polyamide resin, a polyimide-amide resin, a siloxane resin, a benzocyclobutene-based resin, a phenol resin, or the like can be used.

For example, as the organic resin, a mixed material of a resin precursor and a solvent or a mixed material of a soluble resin material and a solvent is formed over a support substrate by a method such as spin coating, dipping, spray coating, ink-jetting, dispensing, screen printing, or offset printing, or with a tool (equipment) such as a doctor knife, a slit coater, a roll coater, a curtain coater, or a knife coater. After that, heat treatment is performed to remove the solvent or the like and cure the material, so that the substrate 102a including the organic resin can be formed.

For example, when polyimide is employed, a resin precursor that generates an imide bond by dehydration can be used. Alternatively, a material containing soluble polyimide may be used.

Note that in the case where an extremely thin (e.g., with a thickness of 5 µm or less) organic resin formed by a spin coating method or the like is used as the substrate 102a, sufficiently high mechanical strength cannot be obtained, making it difficult to transfer or handle the substrate, in some cases. For reinforcement, a flexible film having a thickness of more than or equal to 20 µm and less than or equal to 300 µm may be attached to the rear surface side (on the side where the transistor 100B is not provided) of the substrate 102a with an adhesive layer therebetween.

An inorganic insulating film can be used as the insulating layer 103. The insulating layer 103 preferably functions as a barrier film that prevents diffusion of impurities contained in the substrate 102a into the transistor 100D.

Examples of the inorganic insulating film having a high barrier property include silicon nitride, silicon nitride oxide, aluminum oxide, aluminum nitride, and aluminum oxynitride.

In the case where the insulating layer 103 is a stacked-layer film, an inorganic insulating film having a high barrier property is preferably used as at least one of the layers. For example, the insulating layer 103 may have a two-layer structure in which a silicon oxynitride film and a silicon nitride film are stacked in this order from the substrate 102a, or a three-layer structure in which a silicon oxynitride film, a silicon nitride film, and a silicon oxynitride film are stacked in this order from the substrate 102a side.

Here, an example of a manufacturing method of the transistor 100D is described. First, a resin layer to be the substrate 102a and the insulating layer 103 are stacked over a support substrate such as a glass substrate. Then, a transistor is formed over the insulating layer 103 by a method similar to that in the above-described manufacturing method example. Then, the support substrate and the substrate 102a are separated from each other; accordingly, the transistor 100B can be manufactured over the substrate 102a having flexibility.

A variety of methods can be used to separate the support substrate and the substrate 102a from each other. For example, a method for reducing the adhesiveness between the support substrate and the substrate 102a by laser light irradiation from the support substrate side may be used. In this method, a light absorption layer may be provided between the support substrate and the substrate 102a. A material that can absorb part of light used as laser light can be used as the light absorption layer. For example, a metal, a semiconductor, an oxide, or the like can be used as the light absorption layer when excimer laser with a wavelength of 308 nm is used as the laser light. For example, a semiconductor film of silicon or the like; a metal film of titanium, tungsten, or the like; an oxide film of titanium oxide, tungsten oxide, indium oxide, indium tin oxide, or the like; or the like can be used.

Figure 11C:
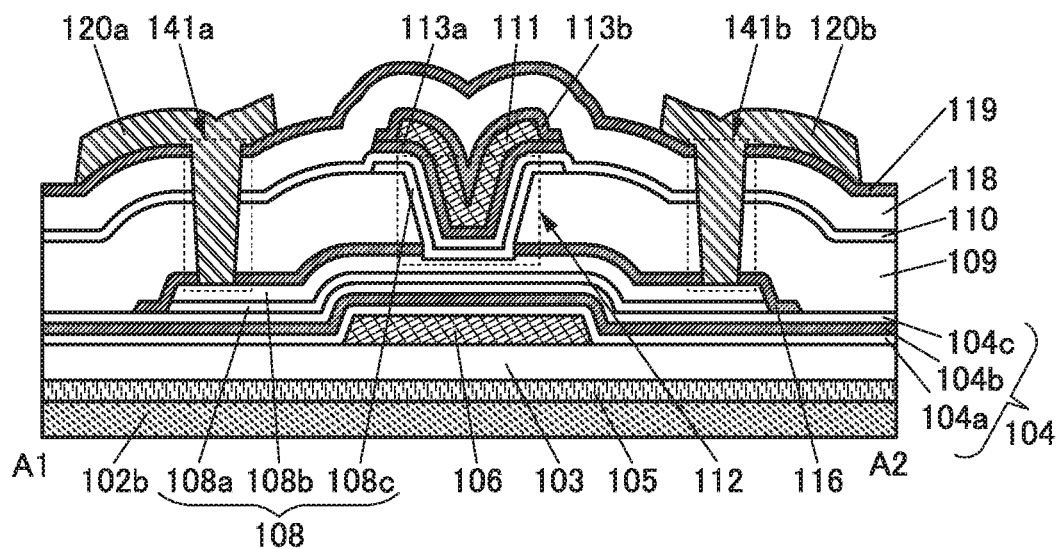

The following structure may be employed: the insulating layer 103 is formed over the support substrate and the transistor is formed; then, separation is performed between the support substrate and the insulating layer 103; and then the insulating layer 103 is attached to a flexible substrate 102b with an adhesive layer 105. A cross-sectional view of the case in the channel length direction is illustrated in FIG. 11(C).

Here, a separation layer is preferably formed between the insulating layer 103 and the support substrate. For example, as the separation layer, a stack of a layer containing a high-melting-point metal material such as tungsten and a layer containing an oxide of the metal material can be used; and as the insulating layer 103 thereover, an insulating layer containing an inorganic insulating material such as silicon nitride, silicon oxide, silicon oxynitride, or silicon nitride oxide can be stacked and used. With such a structure, separation can be performed at the interface between tungsten and tungsten oxide, inside tungsten oxide, or at the interface between tungsten oxide and the insulating layer, without performing laser irradiation after the completion of the manufacturing process of the transistor.

In this manufacturing method, an organic resin is not provided on the side on which the transistor is formed; thus, the temperature applied in the manufacturing process can be increased. Thus, the deposition temperature of the insulating layers included in the transistor and the temperature of the heat treatment for removing impurities contained in the insulating layers, the semiconductor layer, or the like can be increased, so that the transistor can have higher reliability.

Moreover, in this manufacturing method, the substrate 102b is attached after the transistor is completed; thus, the material of the substrate 102b is not limited. Thus, a variety of materials can be selected and used for the substrate 102b depending on the intended use.

The above is the description of the structure example of the transistor provided over a flexible substrate.

Note that although a structure similar to that of the transistor 100A described in the above Structure Example 2 is employed here as the structure of the transistor 100D provided over the insulating layer 103, the transistor 100 described in Structure Example 1, each of the transistors described in the manufacturing method examples, or each transistor described below can be similarly manufactured over a flexible substrate.

At least part of the structure examples, the manufacturing method examples, the drawings corresponding thereto, and the like described as examples in this embodiment can be implemented in combination with the other structure examples, the other manufacturing method examples, the other drawings, and the like as appropriate.

At least part of this embodiment can be implemented in combination with any of the other embodiments described in this specification as appropriate.

Embodiment 2

In this embodiment, an example of a display device that includes the transistors exemplified in the above embodiment is described.

Structure Example

Figure 12A:
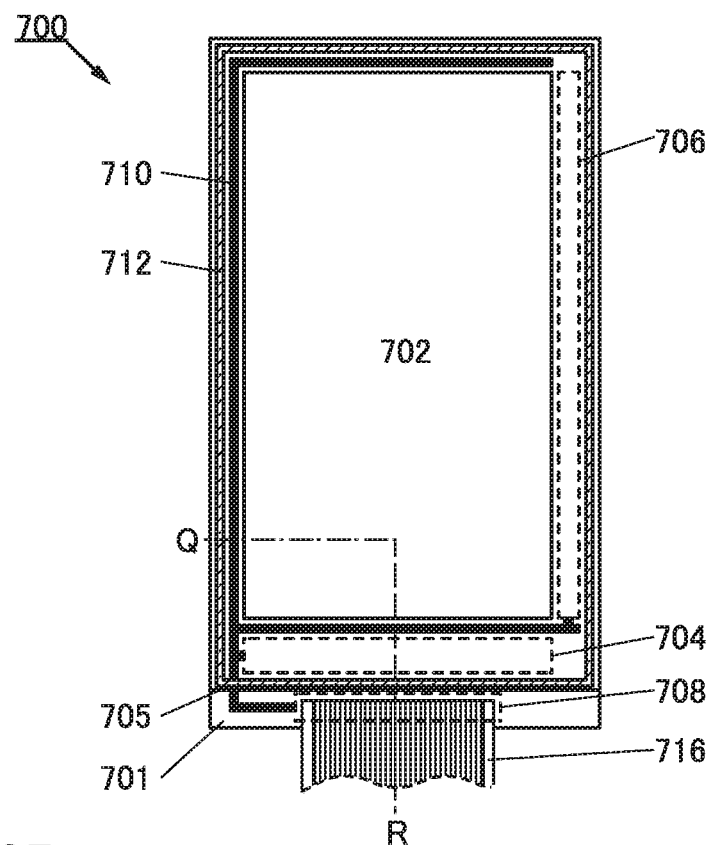
FIG. 12 Top views of display devices.

FIG. 12(A) is a top view of an example of a display device. A display device 700 illustrated in FIG. 12(A) includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. Note that the first substrate 701 and the second substrate 705 are bonded to each other with the sealant 712. That is, the pixel portion 702, the source driver circuit portion 704, and the gate driver circuit portion 706 are sealed with the first substrate 701, the sealant 712, and the second substrate 705. Although not illustrated in FIG. 12(A), a display element is provided between the first substrate 701 and the second substrate 705.

In addition, in the display device 700, an FPC terminal portion 708 (FPC: Flexible printed circuit) is provided in a region over the first substrate 701, which is different from the region surrounded by the sealant 712. The FPC terminal portion 708 is electrically connected to each of the pixel portion 702, the source driver circuit portion 704, and the gate driver circuit portion 706. An FPC 716 is connected to the FPC terminal portion 708, and a variety of signals and the like are supplied from the FPC 716 to the pixel portion 702, the source driver circuit portion 704, and the gate driver circuit portion 706. A signal line 710 is connected to the pixel portion 702, the source driver circuit portion 704, the gate driver circuit portion 706, and the FPC terminal portion 708. A variety of signals and the like are supplied from the FPC 716 to the pixel portion 702, the source driver circuit portion 704, the gate driver circuit portion 706, and the FPC terminal portion 708 via the signal line 710.

A plurality of gate driver circuit portions 706 may be provided in the display device 700. In addition, an example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a structure may be employed in which an IC including a substrate over which a source driver circuit, a gate driver circuit, or the like is formed (e.g., a driver circuit substrate formed using a single-crystal semiconductor film or a polycrystalline semiconductor film) is formed on the first substrate 701 or the FPC 716. Note that there is no particular limitation on the method for connecting a separately prepared driver circuit substrate, and a COG (Chip On Glass) method, a wire bonding method, or the like can be used.

Furthermore, the pixel portion 702, the source driver circuit portion 704, and the gate driver circuit portion 706 included in the display device 700 include a plurality of transistors, and the transistor that is a semiconductor device of one embodiment of the present invention can be used.

Moreover, the display device 700 can include a variety of elements. Examples of the elements include an electroluminescent (EL) element (an EL element containing an organic matter and an inorganic matter, an organic EL element, an inorganic EL element, an LED, and the like), a light-emitting transistor element (a transistor that emits light depending on current), an electron emitter, a liquid crystal element, an electronic ink element, an electrophoretic element, an electrowetting element, a plasma display panel (PDP), a MEMS (microelectromechanical systems) display (e.g., a grating light valve (GLV), a digital micromirror device (DMD), a digital micro shutter (DMS) element, and an interferometric modulation (IMOD) element), and a piezoelectric ceramic display.

Furthermore, examples of a display device using an EL element include an EL display. Examples of display devices using electron emitters include a field emission display (FED) and an SED-type flat panel display (SED: Surface-conduction Electron-emitter Display). Examples of display devices using liquid crystal elements include liquid crystal displays (a transmissive liquid crystal display, a transflective liquid crystal display, a reflective liquid crystal display, a direct-view liquid crystal display, and a projection liquid crystal display). Examples of a display device using an electronic ink element or an electrophoretic element include electronic paper. Note that in the case where a transflective liquid crystal display or a reflective liquid crystal display is obtained, some or all of pixel electrodes function as reflective electrodes. For example, some or all of pixel electrodes contain aluminum, silver, or the like. Moreover, in such a case, a memory circuit such as an SRAM can be provided under the reflective electrodes. Thus, the power consumption can be further reduced.

Note that as a display method in the display device 700, a progressive method, an interlace method, or the like can be used. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be employed. Alternatively, a color element may be composed of two colors among R, G, and B as in PenTile layout, and two different colors may be selected depending on color elements. Alternatively, one or more colors of yellow, cyan, magenta, and the like may be added to R, G, and B. Note that the size of a display region may differ between dots of the color elements. Note that the disclosed invention is not limited to a display device for color display and can also be applied to a display device for monochrome display.

In addition, a coloring layer (also referred to as a color filter) may be used to make a display device perform full-color display in which white light (W) is used for a backlight or a front light (an organic EL element, an inorganic EL element, an LED, a fluorescent lamp, or the like). For example, for the coloring layer, red (R), green (G), blue (B), and yellow (Y) can be used in combination as appropriate. With the use of the coloring layer, higher color reproducibility can be obtained as compared with the case without the coloring layer. At this time, by providing a region with the coloring layer and a region without the coloring layer, white light in the region without the coloring layer may be directly utilized for display. By partly providing the region without the coloring layer, a decrease in luminance of a bright image due to the coloring layer can be suppressed, and approximately 20% to 30% of power consumption can be reduced in some cases. Note that in the case where full-color display is performed using a self-luminous element such as an organic EL element or an inorganic EL element, elements may emit light of their respective colors R, G, B, Y, and W. By using a self-luminous element, power consumption may be further reduced as compared with the case of using a coloring layer.

Furthermore, as a coloring system, in addition to the above-described system (color filter system) in which part of white light is converted into red light, green light, and blue light through color filters, a system (three-color system) in which red light, green light, and blue light are used or a system (color conversion system or quantum dot system) in which part of blue light is converted into red or green may be used.

Figure 12B:
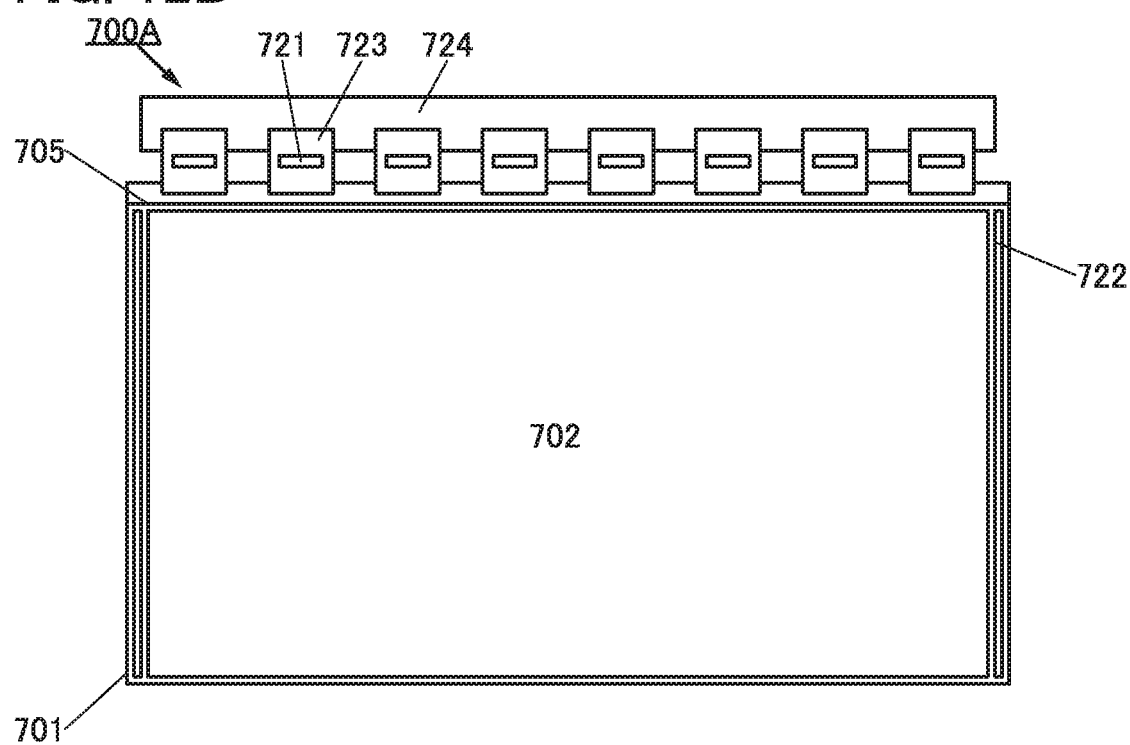

A display device 700A illustrated in FIG. 12(B) is a display device suitably used for an electronic device with a large screen. For example, the display device 700A can be suitably used for a television device, a monitor device, digital signage, or the like.

The display device 700A includes a plurality of source driver ICs 721 and a pair of gate driver circuits 722.

The plurality of source driver ICs 721 are attached to respective FPCs 723. In each of the plurality of FPCs 723, one of terminals is connected to the substrate 701, and the other terminal is connected to a printed board 724. The printed board 724 can be mounted on the electronic device in such a manner that the FPCs 723 are bent so that the printed board 724 is located on the back side of the pixel portion 702; thus, the electronic device can be downsized.

On the other hand, the gate driver circuits 722 are provided over the substrate 701. Thus, an electronic device with a narrow frame can be obtained.

With such a structure, a large-size and high-resolution display device can be obtained. For example, such a structure can be used for a display device whose screen diagonal is 30 inches or more, 40 inches or more, 50 inches or more, or 60 inches or more. Furthermore, a display device with extremely high resolution such as full high definition, 4K2K, or 8K4K can be obtained.

<Cross-Sectional Structure Example>

Figure 13:
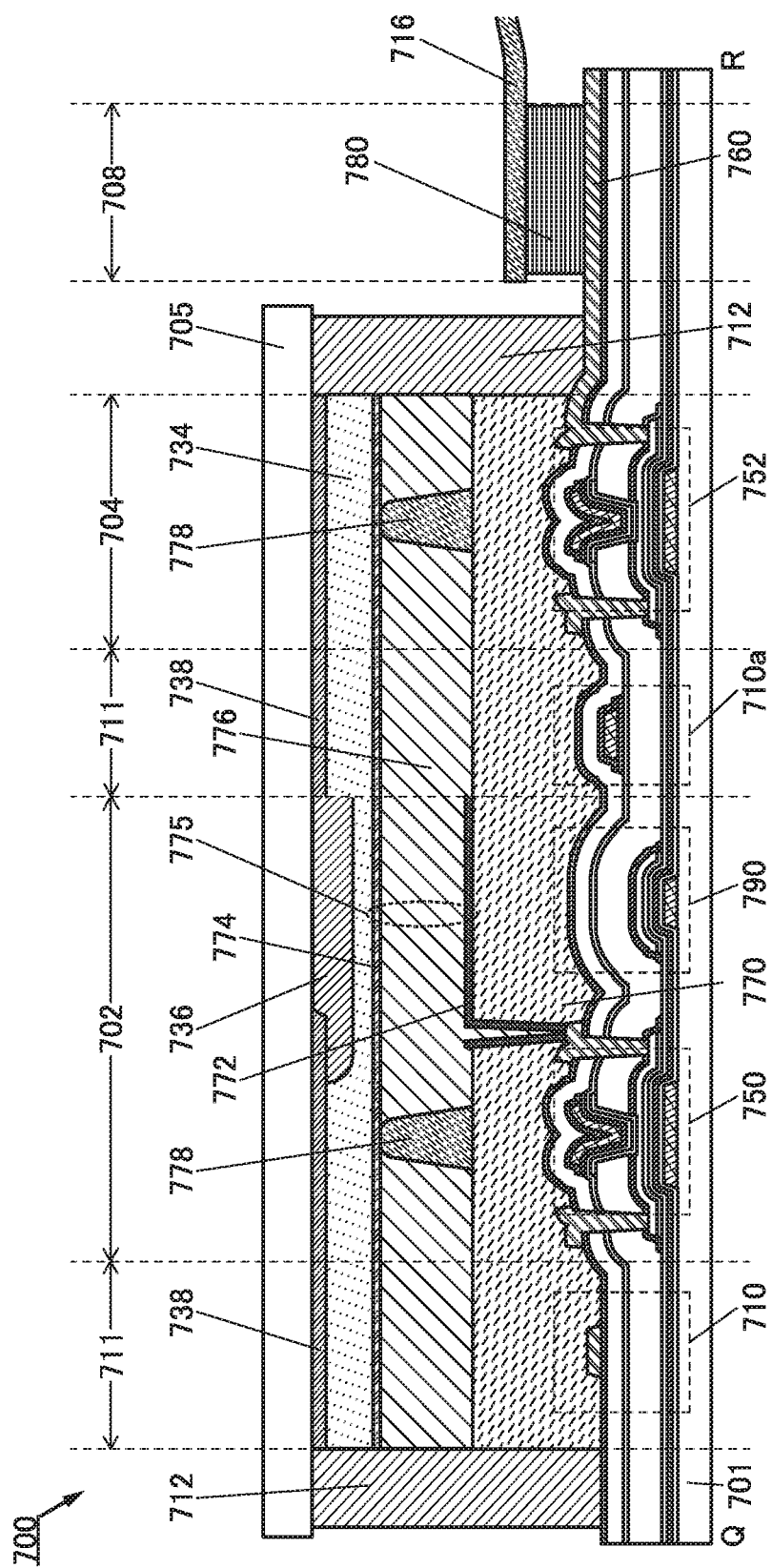
FIG. 13 A cross-sectional view of a display device.
Figure 14:
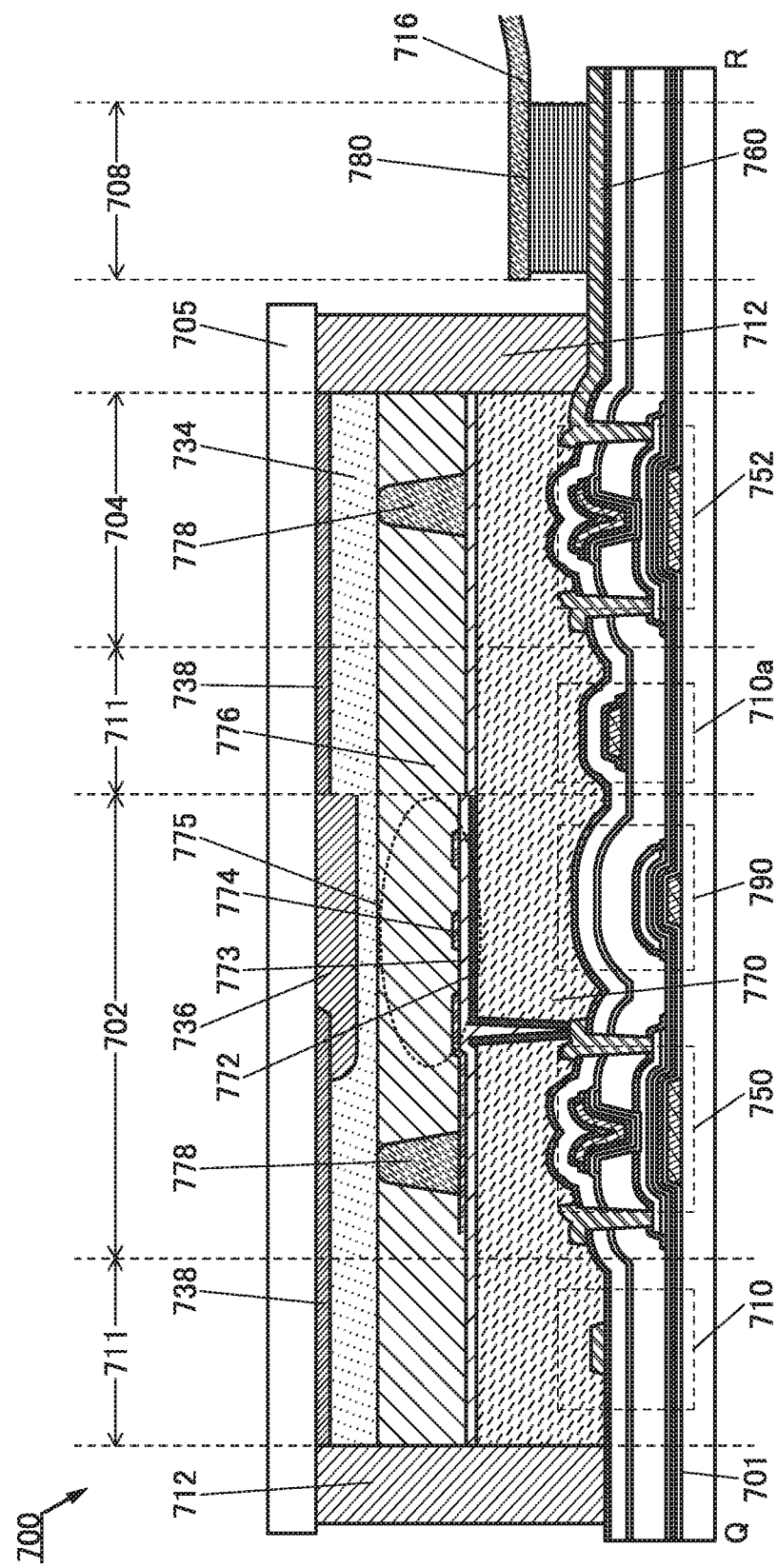
FIG. 14 A cross-sectional view of a display device.

Structures including a liquid crystal element and an EL element as display elements are described below with reference to FIG. 13 to FIG. 15. Note that FIG. 13 and FIG. 14 are cross-sectional views taken along dashed-dotted line Q-R illustrated in FIG. 12(A) and are structures including a liquid crystal element as a display element. In addition, FIG. 15 is a cross-sectional view taken along dashed-dotted line Q-R illustrated in FIG. 12(A) and is a structure including an EL element as a display element.

Figure 15:
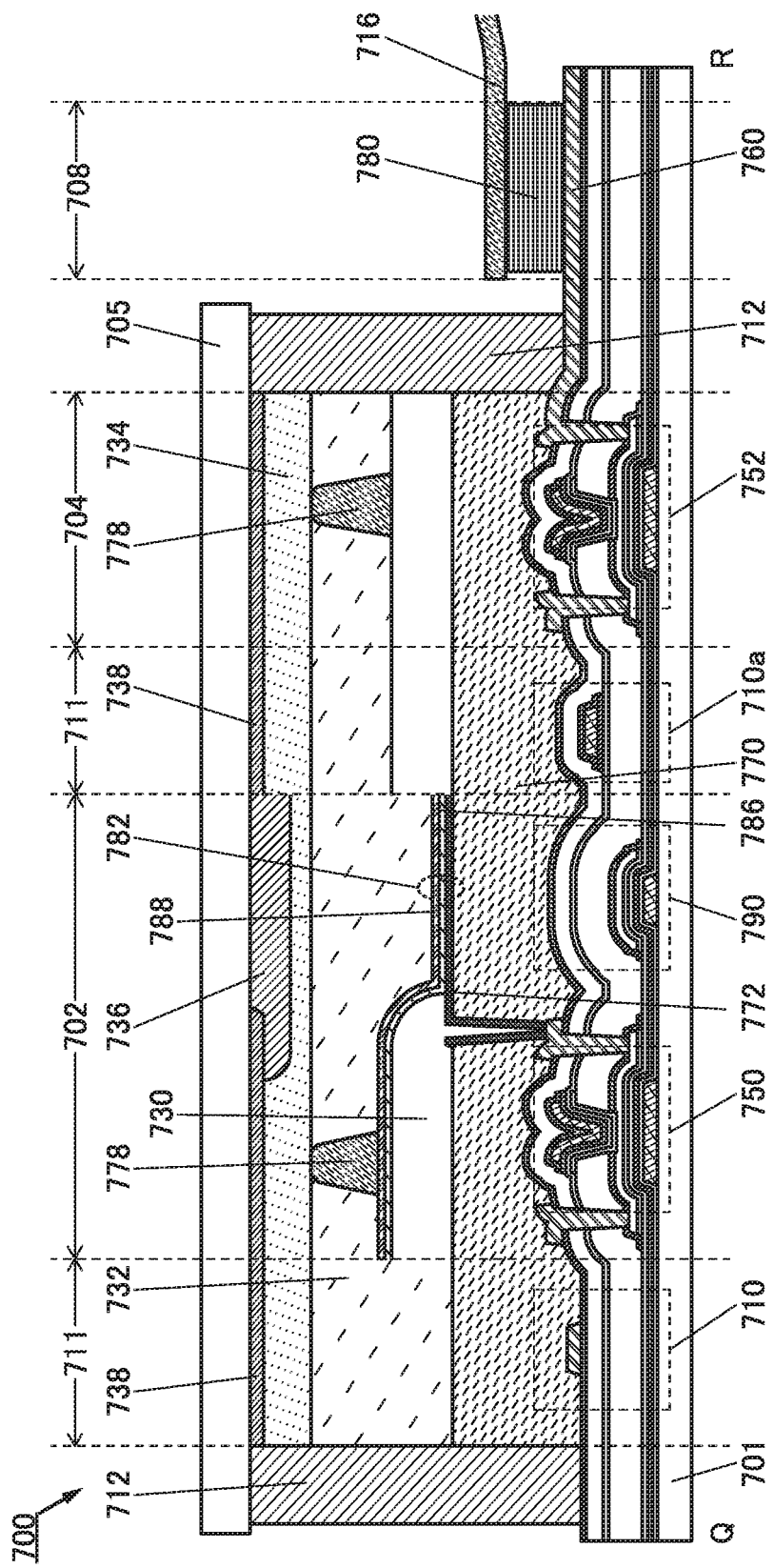
FIG. 15 A cross-sectional view of a display device.

Portions common to FIG. 13 to FIG. 15 are described first, and then, different portions are described below.

[Description of Common Portions in Display Devices]

The display device 700 illustrated in FIG. 13 to FIG. 15 includes a lead wiring portion 711, the pixel portion 702, the source driver circuit portion 704, and the FPC terminal portion 708. The lead wiring portion 711 includes the signal line 710 or a signal line 710a. The pixel portion 702 includes a transistor 750 and a capacitor 790. The source driver circuit portion 704 includes a transistor 752.

As the transistor 750 and the transistor 752, the transistors exemplified in Embodiment 1 can be used.

The transistor used in this embodiment includes a highly purified oxide semiconductor film in which formation of oxygen vacancies is suppressed. The transistor can have a low off-state current. Accordingly, the holding time of an electrical signal such as an image signal can be made longer, and a writing interval can also be set longer in an on state. Accordingly, the frequency of refresh operation can be reduced, which leads to an effect of suppressing power consumption.

In addition, the transistor used in this embodiment can have relatively high field-effect mobility and thus is capable of high-speed operation. For example, with the use of such a transistor capable of high-speed operation for a display device, a switching transistor in a pixel portion and a driver transistor in a driver circuit portion can be formed over one substrate. That is, a semiconductor device formed using a silicon wafer or the like is not additionally needed as a driver circuit; thus, the number of components of the semiconductor device can be reduced. Moreover, the use of the transistor capable of high-speed operation in the pixel portion can provide a high-quality image.

The capacitor 790 includes a lower electrode that is formed through a step of processing the same conductive film as a conductive film functioning as a first gate electrode included in the transistor 750 and an upper electrode that is formed through heat treatment which is performed with the semiconductor layer 108 functioning as a source electrode or a drain electrode included in the transistor 750 being in contact with the insulating layer 116. In addition, between the lower electrode and the upper electrode, an insulating film formed through a step of forming the same insulating film as an insulating film functioning as a first gate insulating film included in the transistor 750 and an insulating film formed through a step of forming the same insulating film as an insulating film functioning as a protective insulating film over the transistor 750 are provided. That is, the capacitor 790 has a stacked-layer structure in which the insulating films functioning as dielectric films are interposed between a pair of electrodes.

Furthermore, in FIG. 13 to FIG. 15, a planarization insulating film 770 is provided over the transistor 750, the transistor 752, and the capacitor 790.

Although FIG. 13 to FIG. 15 exemplify structures in which transistors having the same structure are used as the transistor 750 included in the pixel portion 702 and the transistor 752 included in the source driver circuit portion 704, one embodiment of the present invention is not limited thereto. For example, different transistors may be used in the pixel portion 702 and the source driver circuit portion 704. Specifically, a structure in which a top-gate transistor is used in the pixel portion 702 and a bottom-gate transistor is used in the source driver circuit portion 704, a structure in which a bottom-gate transistor is used in the pixel portion 702 and a top-gate transistor is used in the source driver circuit portion 704, and the like can be employed. Note that the source driver circuit portion 704 described above may be replaced with a gate driver circuit portion.

In addition, the signal line 710 is formed through the same step as conductive films functioning as source electrodes and drain electrodes of the transistors 750 and 752. Moreover, the signal line 710a is formed through the same step as conductive films functioning as gate electrodes of the transistors 750 and 752. In the case where a material containing a copper element is used for the signal line 710, for example, signal delay or the like due to wiring resistance is reduced, which enables display on a large screen.

In addition, the FPC terminal portion 708 includes a connection electrode 760, an anisotropic conductive film 780, and the FPC 716. Note that the connection electrode 760 is formed through the same step as the conductive films functioning as the source electrodes and the drain electrodes of the transistors 750 and 752. Moreover, the connection electrode 760 is electrically connected to a terminal included in the FPC 716 through the anisotropic conductive film 780.

For example, glass substrates can be used as the first substrate 701 and the second substrate 705. Alternatively, flexible substrates may be used as the first substrate 701 and the second substrate 705. Examples of the flexible substrate include a plastic substrate.

A structure body 778 is provided between the first substrate 701 and the second substrate 705. The structure body 778, which is a columnar spacer, is provided to control the distance (cell gap) between the first substrate 701 and the second substrate 705. Note that a spherical spacer may also be used as the structure body 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

[Structure Example of Display Device Using Liquid Crystal Element]

The display device 700 illustrated in FIG. 13 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 illustrated in FIG. 13 is capable of displaying an image in such a manner that transmission or non-transmission of light is controlled by a change in the alignment state of the liquid crystal layer 776 depending on a voltage applied to the conductive film 772 and the conductive film 774.

In addition, the conductive film 772 is electrically connected to the conductive film functioning as the source electrode or the drain electrode included in the transistor 750. The conductive film 772 is formed over the planarization insulating film 770 and functions as a pixel electrode, i.e., one electrode of the display element.

A conductive film that has a property of transmitting visible light or a conductive film that has a property of reflecting visible light can be used as the conductive film 772. As the conductive film that has a property of transmitting visible light, for example, a material containing one kind selected from indium (In), zinc (Zn), and tin (Sn) is preferably used. As the conductive film that has a property of reflecting visible light, for example, a material containing aluminum or silver is preferably used.

In the case where the conductive film that has a property of reflecting visible light is used as the conductive film 772, the display device 700 is a reflective liquid crystal display device. In the case where the conductive film that has a property of transmitting visible light is used as the conductive film 772, the display device 700 is a transmissive liquid crystal display device. In the case of a reflective liquid crystal display device, a polarizing plate is provided on the viewer side. On the other hand, in the case of a transmissive liquid crystal display device, a pair of polarizing plates between which a liquid crystal element is sandwiched is provided.

Furthermore, a method for driving a liquid crystal element can be changed with the change in the structure over the conductive film 772. FIG. 14 illustrates an example of this case. The display device 700 illustrated in FIG. 14 is an example of a structure in which a horizontal electric field mode (e.g., an FFS mode) is used as a driving mode of the liquid crystal element. In the structure illustrated in FIG. 14, an insulating film 773 is provided over the conductive film 772, and the conductive film 774 is provided over the insulating film 773. In this case, the conductive film 774 has a function of a common electrode, and an electric field generated between the conductive film 772 and the conductive film 774 through the insulating film 773 can control the alignment state in the liquid crystal layer 776.

Although not illustrated in FIG. 13 and FIG. 14, a structure in which either one or both of the conductive film 772 and the conductive film 774 are provided with an alignment film on a side in contact with the liquid crystal layer 776 may be employed. Alternatively, although not illustrated in FIG. 13 and FIG. 14, an optical member (optical substrate) such as a polarizing member, a retardation member, or an anti-reflection member, or the like may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer-dispersed liquid crystal, a polymer network liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

In the case of employing a horizontal electric field mode, a liquid crystal exhibiting a blue phase for which an alignment film is not used may be used. The blue phase is one of the liquid crystal phases, which appears just before a cholesteric phase changes into an isotropic phase when the temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition that contains a liquid crystal exhibiting the blue phase and a chiral material has a short response time and optical isotropy, which makes the alignment process unneeded. In addition, an alignment film does not need to be provided and rubbing treatment is thus not necessary; accordingly, electrostatic discharge damage caused by the rubbing treatment can be prevented and defects and damage of the liquid crystal display device in the manufacturing process can be reduced. Moreover, the liquid crystal material exhibiting the blue phase has small viewing angle dependence.

Furthermore, in the case where a liquid crystal element is used as the display element, a TN (Twisted Nematic) mode, an IPS (In-Plane-Switching) mode, an FFS (Fringe Field Switching) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, an ECB (Electrically Controlled Birefringence) mode, a guest-host mode or the like can be used.

Furthermore, a normally black liquid crystal display device, for example, a transmissive liquid crystal display device employing a vertical alignment (VA) mode may be used. Some examples can be given as a vertical alignment mode, which include an MVA (Multi-Domain Vertical Alignment) mode, a PVA (Patterned Vertical Alignment) mode, or an ASV mode.

[Display Device Using Light-Emitting Element]

The display device 700 illustrated in FIG. 15 includes a light-emitting element 782. The light-emitting element 782 includes the conductive film 772, an EL layer 786, and a conductive film 788. The display device 700 illustrated in FIG. 15 can display an image by light emission from the EL layer 786 included in the light-emitting element 782 provided in each pixel. Note that the EL layer 786 contains an organic compound or an inorganic compound such as a quantum dot.

Examples of materials that can be used for an organic compound include a fluorescent material and a phosphorescent material. In addition, examples of materials that can be used for a quantum dot include a colloidal quantum dot material, an alloyed quantum dot material, a core-shell quantum dot material, and a core quantum dot material. Moreover, a material containing elements belonging to Groups 12 and 16, elements belonging to Groups 13 and 15, or elements belonging to Groups 14 and 16 may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 illustrated in FIG. 15, an insulating film 730 is provided over the planarization insulating film 770 and the conductive film 772. The insulating film 730 covers part of the conductive film 772. Note that the light-emitting element 782 has a top-emission structure. Therefore, the conductive film 788 has a light-transmitting property and transmits light emitted from the EL layer 786. Note that although the top-emission structure is exemplified in this embodiment, one embodiment of the present invention is not limited thereto. For example, a bottom-emission structure in which light is emitted to the conductive film 772 side or a dual-emission structure in which light is emitted to both the conductive film 772 and the conductive film 788 can also be employed.

In addition, the coloring film 736 is provided at a position overlapping with the light-emitting element 782, and the light-blocking film 738 is provided at a position overlapping with the insulating film 730, in the lead wiring portion 711, and in the source driver circuit portion 704. In addition, the coloring film 736 and the light-blocking film 738 are covered with the insulating film 734. Moreover, a space between the light-emitting element 782 and the insulating film 734 is filled with a sealing film 732. Note that although the structure in which the coloring film 736 is provided is exemplified in the display device 700 illustrated in FIG. 15, one embodiment of the present invention is not limited thereto. For example, a structure without the coloring film 736 may also be employed in the case where the EL layer 786 is formed into an island shape per pixel, i.e., formed by separate coloring.

[Structure Example of Display Device Provided with Input/Output Device]

An input/output device may be provided in the display device 700 illustrated in FIG. 13 to FIG. 15. Examples of the input/output device include a touch panel.

Figure 16:
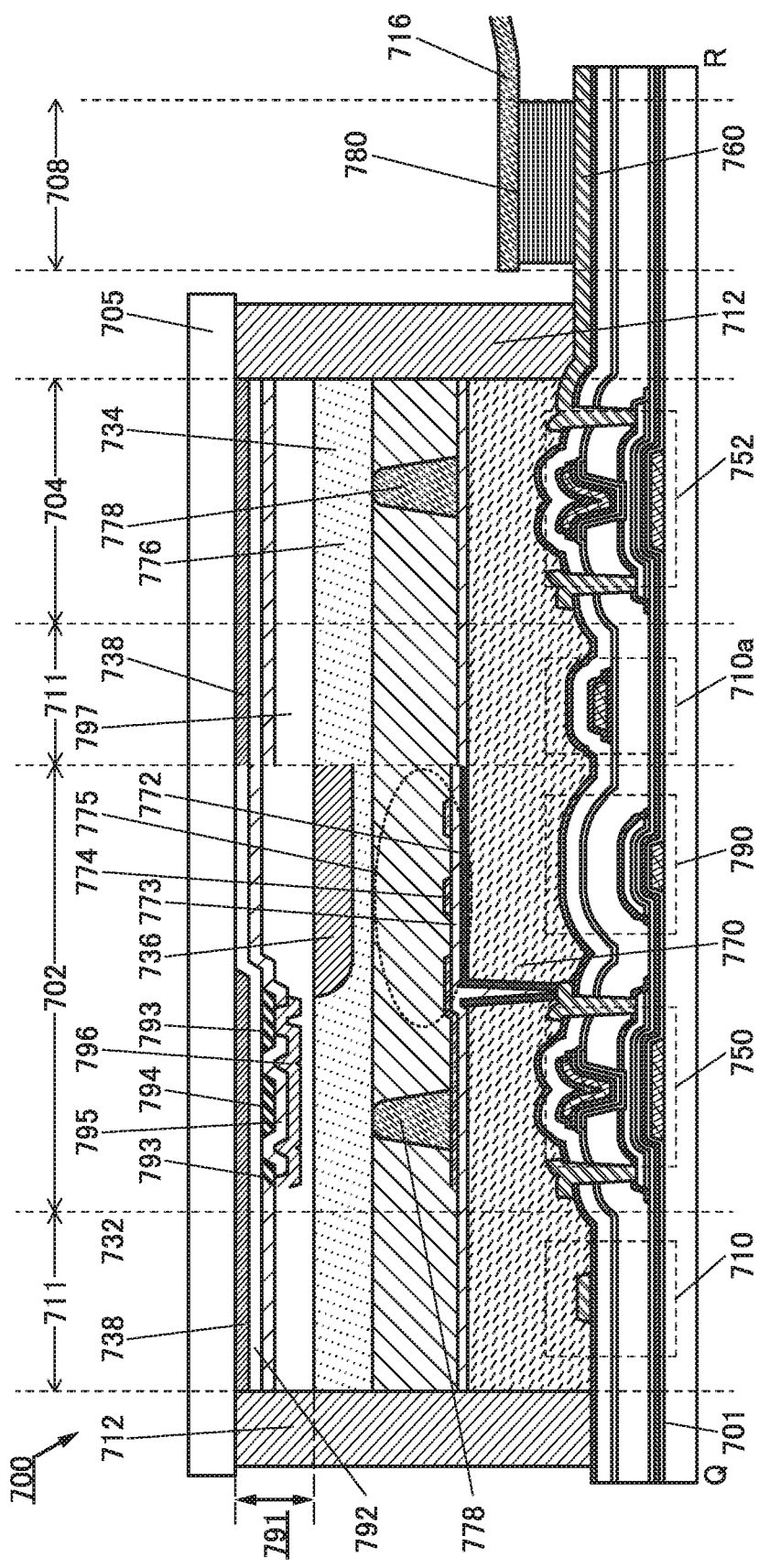
FIG. 16 A cross-sectional view of a display device.
Figure 17:
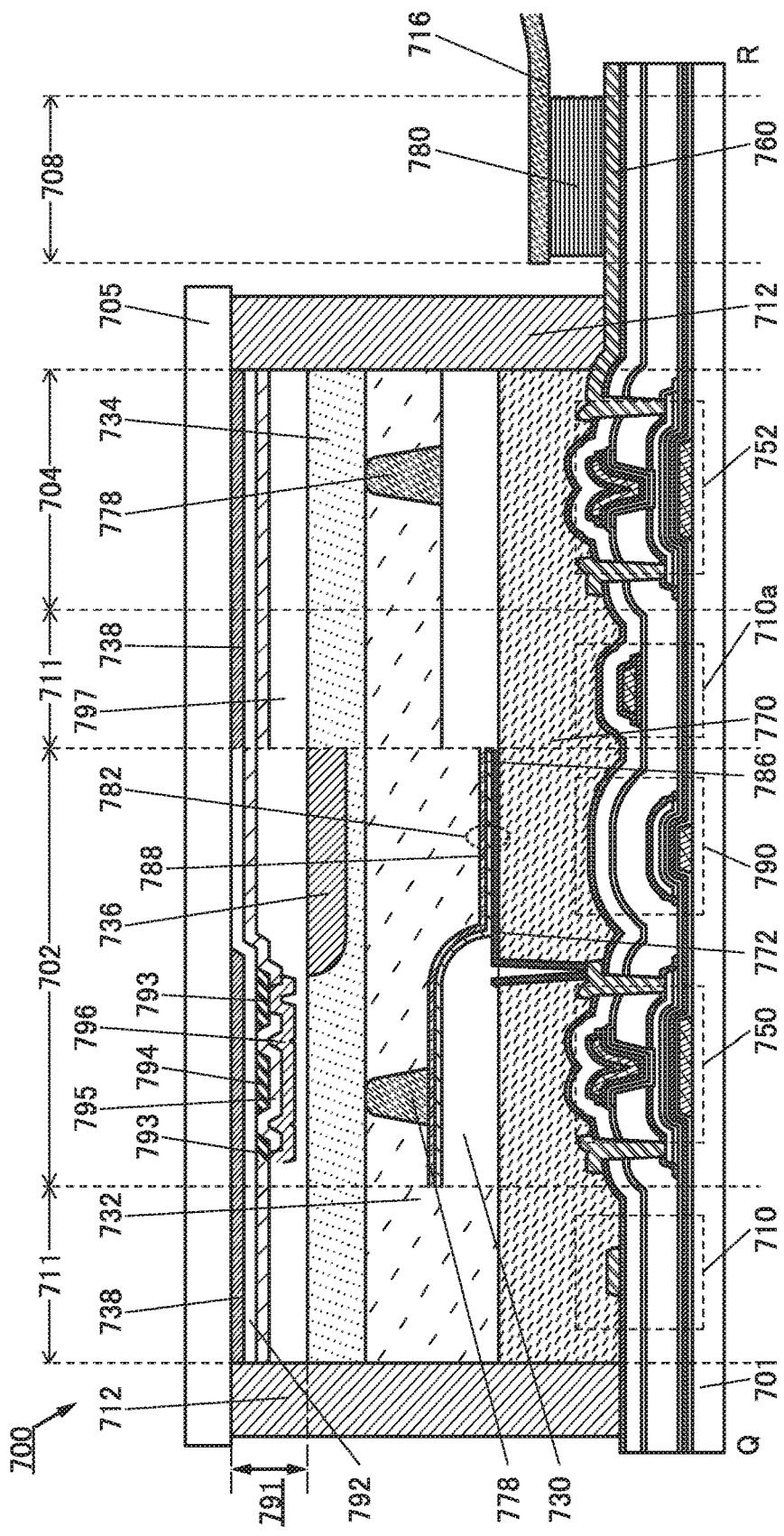
FIG. 17 A cross-sectional view of a display device.

FIG. 16 illustrates a structure in which the display device 700 illustrated in FIG. 14 is provided with a touch panel 791, and FIG. 17 illustrates a structure in which the display device 700 illustrated in FIG. 15 is provided with the touch panel 791.

FIG. 16 is a cross-sectional view of the structure in which the display device 700 illustrated in FIG. 14 is provided with the touch panel 791, and FIG. 17 is a cross-sectional view of the structure in which the display device 700 illustrated in FIG. 15 is provided with the touch panel 791.

First, the touch panel 791 illustrated in FIG. 16 and FIG. 17 is described below.

The touch panel 791 illustrated in FIG. 16 and FIG. 17 is what is called an in-cell touch panel provided between the substrate 705 and the coloring film 736. The touch panel 791 is formed on the substrate 705 side before the light-blocking film 738 and the coloring film 736 are formed.

Note that the touch panel 791 includes the light-blocking film 738, an insulating film 792, an electrode 793, an electrode 794, an insulating film 795, an electrode 796, and an insulating film 797. A change in the capacitance between the electrode 793 and the electrode 794 can be sensed when a sensing target such as a finger or a stylus approaches, for example.

In addition, a portion in which the electrode 793 intersects with the electrode 794 is illustrated in the upper portion of the transistor 750 illustrated in FIG. 16 and FIG. 17. Through openings provided in the insulating film 795, the electrode 796 is electrically connected to the two electrodes 793 between which the electrode 794 is sandwiched. Note that a structure in which a region provided with the electrode 796 is provided in the pixel portion 702 is exemplified in FIG. 16 and FIG. 17; however, one embodiment of the present invention is not limited thereto and the electrode 796 may be formed in the source driver circuit portion 704, for example.

The electrode 793 and the electrode 794 are provided in a region overlapping with the light-blocking film 738. As illustrated in FIG. 16, it is preferable that the electrode 793 not overlap with the light-emitting element 782. As illustrated in FIG. 17, it is preferable that the electrode 793 not overlap with the liquid crystal element 775. In other words, the electrode 793 has an opening in a region overlapping with the light-emitting element 782 or the liquid crystal element 775. That is, the electrode 793 has a mesh shape. With such a structure, a structure in which the electrode 793 does not block light emitted from the light-emitting element 782 can be obtained. Alternatively, a structure in which the electrode 793 does not block light transmitted through the liquid crystal element 775 can be obtained. Thus, since a reduction in luminance due to the placement of the touch panel 791 is extremely small, a display device with high visibility and low power consumption can be obtained. Note that the electrode 794 can have a similar structure.

In addition, since the electrode 793 and the electrode 794 do not overlap with the light-emitting element 782, a metal material with low visible light transmittance can be used for the electrode 793 and the electrode 794. Moreover, since the electrode 793 and the electrode 794 do not overlap with the liquid crystal element 775, a metal material with low visible light transmittance can be used for the electrode 793 and the electrode 794.

Accordingly, the resistance of the electrode 793 and the electrode 794 can be reduced as compared with an electrode using an oxide material with high visible light transmittance, so that the sensitivity of the touch panel can be increased.

For example, a conductive nanowire may be used for the electrodes 793, 794, and 796. The nanowire has a mean diameter of greater than or equal to 1 nm and less than or equal to 100 nm, preferably greater than or equal to 5 nm and less than or equal to 50 nm, further preferably greater than or equal to 5 nm and less than or equal to 25 nm. Moreover, as the above nanowire, a metal nanowire such as an Ag nanowire, a Cu nanowire, or an Al nanowire, a carbon nanotube, or the like is used. For example, in the case where an Ag nanowire is used for any one of or all of the electrodes 793, 794, and 796, the visible light transmittance can be greater than or equal to 89% and the sheet resistivity can be greater than or equal to 40 Ω/square and less than or equal to 100 Ω/square.

Although the structure of the in-cell touch panel is exemplified in FIG. 16 and FIG. 17, one embodiment of the present invention is not limited thereto. For example, a touch panel formed over the display device 700, what is called an on-cell touch panel, or a touch panel attached to the display device 700, what is called an out-cell touch panel, may be used.

In this manner, the display device of one embodiment of the present invention can be used in combination with various types of touch panels.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments described in this specification as appropriate.

Embodiment 3

In this embodiment, a display device that includes a semiconductor device of one embodiment of the present invention is described with reference to FIG. 18.

The display device illustrated in FIG. 18(A) includes a region including pixels (hereinafter referred to as a pixel portion 502), a circuit portion provided outside the pixel portion 502 and including a circuit for driving the pixels (hereinafter referred to as a driver circuit portion 504), circuits having a function of protecting an element (hereinafter referred to as protection circuits 506), and a terminal portion 507. Note that a structure in which the protection circuits 506 are not provided may be employed.

Part or the whole of the driver circuit portion 504 is desirably formed over the same substrate as the pixel portion 502. Thus, the number of components and the number of terminals can be reduced. In the case where part or the whole of the driver circuit portion 504 is not formed over the same substrate as the pixel portion 502, the part or the whole of the driver circuit portion 504 can be mounted by COG or TAB (Tape Automated Bonding).

The pixel portion 502 includes a plurality of circuits for driving display elements arranged in X rows (X is a natural number of 2 or more) and Y columns (Y is a natural number of 2 or more) (hereinafter referred to as pixel circuits 501), the driver circuit portion 504 includes driver circuits such as a circuit for outputting a signal (scan signal) to select a pixel (hereinafter referred to as a gate driver 504a) and a circuit for supplying a signal (data signal) to drive a display element in a pixel (hereinafter referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as gate lines GL_1 to GL_X). Note that a plurality of gate drivers 504a may be provided and the gate lines GL_1 to GL_X may be separately controlled by the plurality of gate drivers 504a. Alternatively, the gate driver 504a has a function of supplying an initialization signal. However, without being limited thereto, the gate driver 504a can supply another signal.

The source driver 504b includes a shift register or the like. The source driver 504b receives a signal (image signal) from which a data signal is derived, as well as a signal for driving the shift register, through the terminal portion 507. The source driver 504b has a function of generating a data signal to be written to the pixel circuit 501 on the basis of the image signal. In addition, the source driver 504b has a function of controlling output of a data signal in response to a pulse signal obtained by input of a start pulse, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. However, without being limited thereto, the source driver 504b can supply another signal.

The source driver 504b is formed using a plurality of analog switches, for example. The source driver 504b can output, as the data signals, signals obtained by time-dividing the image signal by sequentially turning on the plurality of analog switches. In addition, the source driver 504b may be formed using a shift register or the like.

A pulse signal and a data signal are input to each of the plurality of pixel circuits 501 through one of the plurality of scan lines GL supplied with scan signals and one of the plurality of data lines DL supplied with data signals, respectively. In addition, writing and holding of data of the data signal to and in each of the plurality of pixel circuits 501 are controlled by the gate driver 504a. For example, to the pixel circuit 501 in the m-th row and the n-th column, a pulse signal is input from the gate driver 504a through the scan line GL_m (m is a natural number less than or equal to X) and a data signal is input from the source driver 504b through the data line DL_n (n is a natural number less than or equal to Y) in accordance with the potential of the scan line GL_m.

Figure 18A:
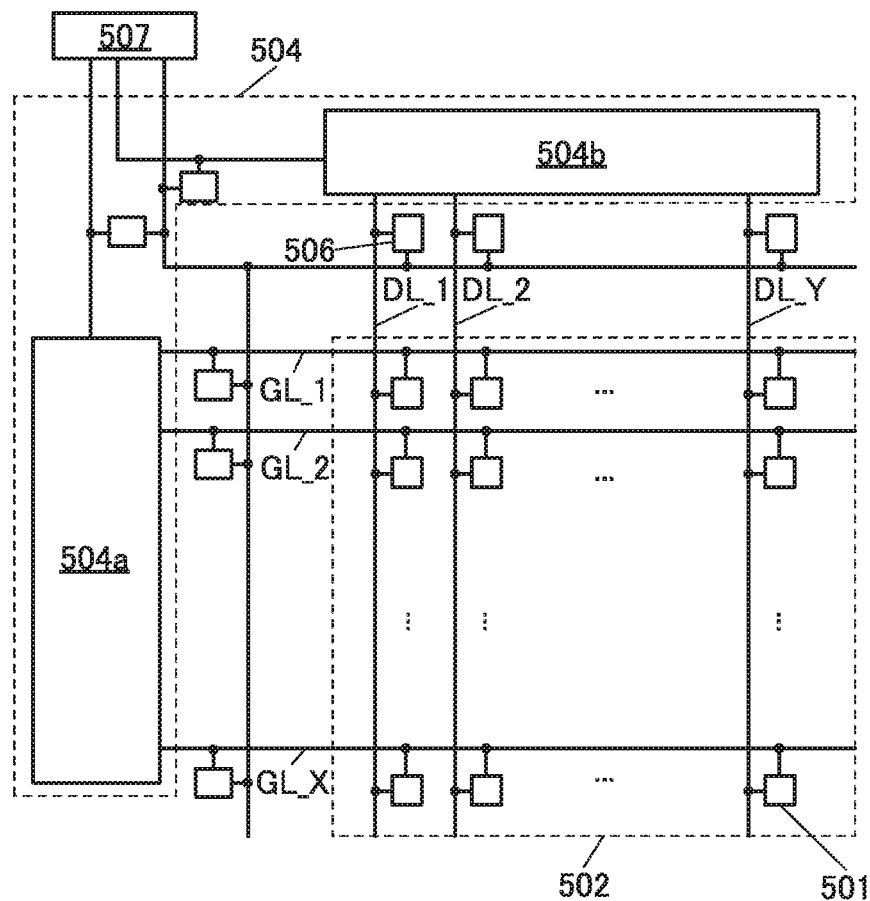
FIG. 18 A block diagram and circuit diagrams of a display device.

The protection circuit 506 illustrated in FIG. 18(A) is connected to, for example, the scan line GL, which is a wiring between the gate driver 504a and the pixel circuit 501. Alternatively, the protection circuit 506 is connected to the data line DL, which is a wiring between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion provided with terminals for inputting power, control signals, and image signals to the display device from external circuits.

The protection circuit 506 is a circuit that makes, when a potential out of a certain range is applied to the wiring connected to the protection circuit, the wiring and another wiring be in conduction state.

As illustrated in FIG. 18(A), the protection circuit 506 is provided for each of the pixel portion 502 and the driver circuit portion 504, so that the resistance of the display device to overcurrent generated by ESD (Electro Static Discharge) or the like can be improved. Note that the configuration of the protection circuits 506 is not limited thereto; for example, a configuration in which the protection circuit 506 is connected to the gate driver 504a or a configuration in which the protection circuit 506 is connected to the source driver 504b can be employed. Alternatively, a configuration in which the protection circuit 506 is connected to the terminal portion 507 can be employed.

In FIG. 18(A), an example in which the driver circuit portion 504 is formed by the gate driver 504a and the source driver 504b is shown; however, the structure is not limited thereto. For example, a structure may be employed in which only the gate driver 504a is formed and a separately prepared substrate where a source driver circuit is formed (e.g., a driver circuit substrate formed with a single crystal semiconductor film or a polycrystalline semiconductor film) is mounted.

Figure 19:
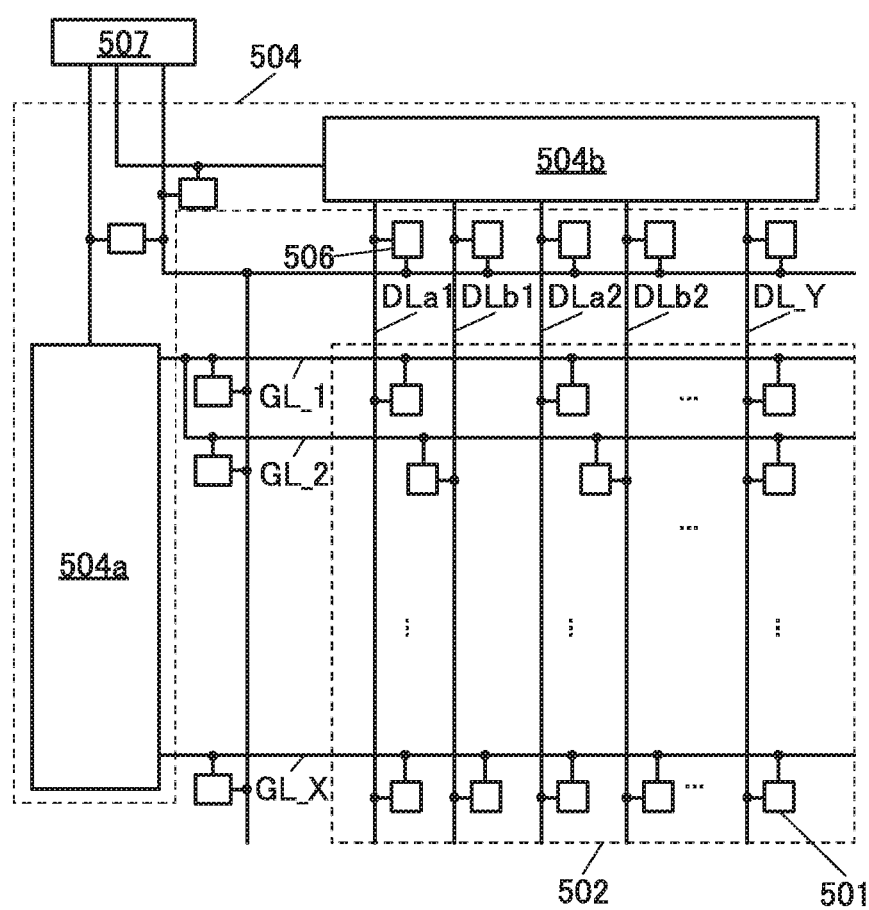
FIG. 19 A block diagram of a display device.

Here, FIG. 19 illustrates a configuration different from that in FIG. 18(A). In FIG. 19, a pair of source lines (e.g., a source line DLa1 and a source line DLb1) is provided so that a plurality of pixels arranged in the source line direction are sandwiched therebetween. In addition, two adjacent gate lines (e.g., a gate line GL_1 and a gate line GL_2) are electrically connected to each other.

Furthermore, pixels connected to the gate line GL_1 are connected to one of the source lines (such as the source line DLa1 or a source line DLa2), and pixels connected to the gate line GL_2 are connected to the other source line (such as the source line DLb1 or a source line DLb2).

In such a configuration, two gate lines can be selected concurrently. Accordingly, one horizontal period can have a length twice that in the configuration illustrated in FIG. 18(A). Thus, this facilitates an increase in resolution and an increase in screen size of a display device.

Figure 18B:
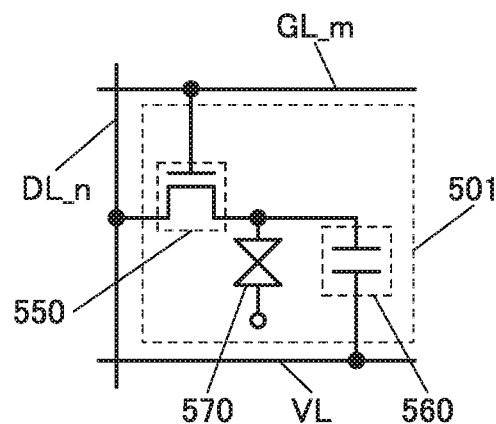

Furthermore, the plurality of pixel circuits 501 illustrated in FIG. 18(A) and FIG. 19 can have the configuration illustrated in FIG. 18(B), for example.

The pixel circuit 501 illustrated in FIG. 18(B) includes a liquid crystal element 570, a transistor 550, and a capacitor 560. As the transistor 550, the transistors described in the above embodiments can be used.

The potential of one of a pair of electrodes of the liquid crystal element 570 is set in accordance with the specifications of the pixel circuit 501 as appropriate. The alignment state of the liquid crystal element 570 is set depending on written data. Note that a common potential may be supplied to one of the pair of electrodes of the liquid crystal element 570 included in each of the plurality of pixel circuits 501. Moreover, a different potential may be supplied to one of the pair of electrodes of the liquid crystal element 570 of the pixel circuit 501 in each row.

For example, as a driving method of the display device including the liquid crystal element 570, a TN mode, an STN mode, a VA mode, an ASM (Axially Symmetric Aligned Micro-cell) mode, an OCB (Optically Compensated Birefringence) mode, an FLC (Ferroelectric Liquid Crystal)

mode, an AFLC (AntiFerroelectric Liquid Crystal) mode, an MVA mode, a PVA (Patterned Vertical Alignment) mode, an IPS mode, an FFS mode, or a TBA (Transverse Bend Alignment) mode may be used. Examples of the driving method of the display device include an ECB (Electrically Controlled Birefringence) mode, a PDLC (Polymer Dispersed Liquid Crystal) mode, a PNLC (Polymer Network Liquid Crystal) mode, and a guest-host mode, in addition to the above driving methods. However, without being limited to the above, a variety of liquid crystal elements and the driving methods thereof can be used.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. In addition, a gate electrode of the transistor 550 is electrically connected to the scan line GL_m. The transistor 550 has a function of controlling writing of data of a data signal.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. Note that the value of the potential of the potential supply line VL is set in accordance with the specifications of the pixel circuit 501 as appropriate. The capacitor 560 has a function of a storage capacitor for holding written data.

For example, in the display device including the pixel circuit 501 in FIG. 18(B), the pixel circuits 501 in each row are sequentially selected by, for example, the gate driver 504a illustrated in FIG. 18(A), whereby the transistors 550 are turned on and data of a data signal is written.

When the transistors 550 are turned off, the pixel circuits 501 in which the data has been written are brought into a holding state. This operation is sequentially performed row by row; thus, an image can be displayed.

Figure 18C:
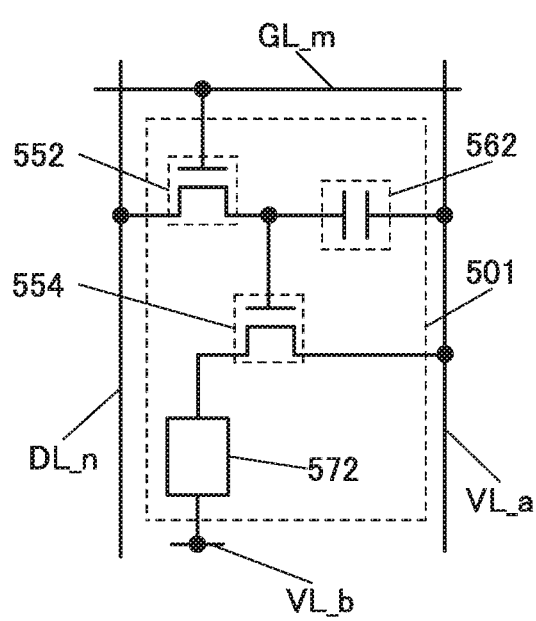

Furthermore, the plurality of pixel circuits 501 illustrated in FIG. 18(A) can have the configuration illustrated in FIG. 18(C), for example.

The pixel circuit 501 illustrated in FIG. 18(C) includes transistors 552 and 554, a capacitor 562, and a light-emitting element 572. The transistors described in the above embodiments can be used as one or both of the transistor 552 and the transistor 554.

One of a source electrode and a drain electrode of the transistor 552 is electrically connected to a data line DLn, and a gate electrode is electrically connected to a scan line GL_m.

The transistor 552 has a function of controlling writing of data of a data signal.

One of a pair of electrodes of the capacitor 562 is electrically connected to a potential supply line VL_a, and the other is electrically connected to the other of the source electrode and the drain electrode of the transistor 552.

The capacitor 562 has a function of a storage capacitor for holding written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited thereto; an inorganic EL element including an inorganic material may be used.

Note that a high power supply potential VDD is supplied to one of the potential supply line VL_a and the potential supply line VL_b, and a low power supply potential VSS is supplied to the other.

In the display device including the pixel circuit 501 in FIG. 18(C), the pixel circuits 501 in each row are sequentially selected by, for example, the gate driver 504a illustrated in FIG. 18(A), whereby the transistors 552 are turned on and data of a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal, and the light-emitting element 572 emits light with a luminance corresponding to the amount of flowing current. This operation is sequentially performed row by row; thus, an image can be displayed.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments described in this specification as appropriate.

Embodiment 4

An electronic device in which the display device of one embodiment of the present invention can be used is described below. Here, an electronic device including a power generating device and a power receiving device is described as an example.

As an example of the electrical device, an example of a portable information terminal is described with reference to FIG. 20.

Figure 20A:
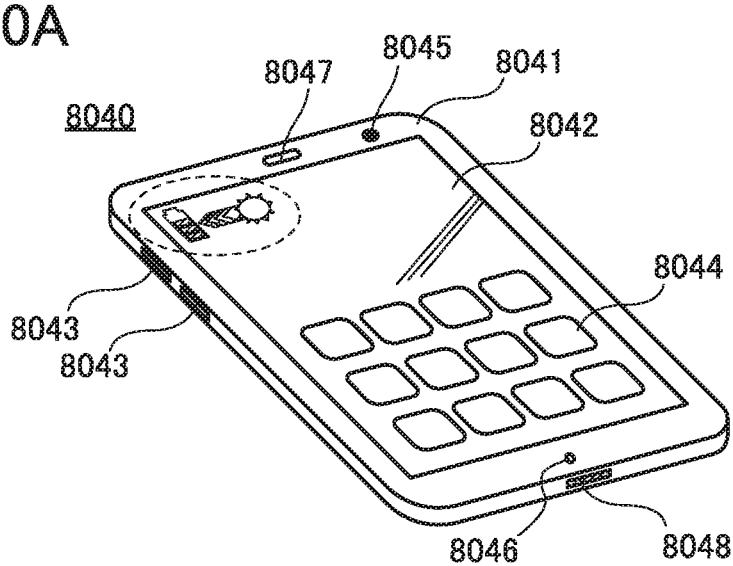
FIG. 20 Diagrams illustrating an electronic device.

FIG. 20(A) is a perspective view illustrating a front surface and a side surface of a portable information terminal 8040. The portable information terminal 8040 is capable of executing a variety of applications such as mobile phone calls, e-mailing, viewing and editing texts, music reproduction, Internet communication, and a computer game. In the portable information terminal 8040, a housing 8041 includes a display portion 8042, a camera 8045, a microphone 8046, and a speaker 8047 on its front surface, a button 8043 for operation on its left side, and a connection terminal 8048 on its bottom surface.

A display module or a display panel of one embodiment of the present invention is used for the display portion 8042.

The portable information terminal 8040 illustrated in FIG. 20(A) is an example of providing one display portion 8042 in the housing 8041; however, one embodiment of the present invention is not limited to this example. The display portion 8042 may be provided on a rear surface of the portable information terminal 8040. Furthermore, the portable information terminal 8040 may be a foldable portable information terminal in which two or more display portions are provided.

A touch panel with which data can be input by an instruction means such as a finger or a stylus is provided as an input means on the display portion 8042. Thus, icons 8044 displayed on the display portion 8042 can be easily operated by the instruction means. Since the touch panel is provided, a region for a keyboard on the portable information terminal 8040 is not needed and thus the display portion can be provided in a large region. Furthermore, since data can be input with a finger or a stylus, a user-friendly interface can be obtained. Although the touch panel may be of any of various types such as a resistive type, a capacitive type, an infrared ray type, an electromagnetic induction type, and a surface acoustic wave type, the resistive type or the capacitive type is particularly preferable because the display portion 8042 can be curved. Furthermore, such a touch panel may be what is called an in-cell touch panel, in which a touch panel is integral with the display module or the display panel.

The touch panel may also function as an image sensor. In this case, for example, an image of a palm print, a fingerprint, or the like is taken with the display portion 8042 touched with the palm or the finger, whereby personal authentication can be performed. Furthermore, with the use of backlight or a sensing light source emitting near-infrared light for the display portion 8042, an image of a finger vein, a palm vein, or the like can also be taken.

In the display portion 8042, a keyboard may be provided instead of the touch panel, or both the touch panel and the keyboard may be provided.

The button 8043 for operation can have various functions in accordance with the intended use. For example, the button 8043 may be used as a home button so that a home screen is displayed on the display portion 8042 by pressing the button 8043. Furthermore, the portable information terminal 8040 may be configured such that main power source thereof is turned off with a press of the button 8043 for a predetermined time. In the case where the portable information terminal 8040 is in a sleep mode, a press of the button 8043 may bring the portable information terminal 8040 out of the sleep mode. Besides, the button can be used as a switch for starting a variety of functions depending on the length of time for pressing or by pressing the button at the same time as another button, for example.

Furthermore, the button 8043 may be used as a volume control button or a mute button to have a function of adjusting the volume of the speaker 8047 for outputting sound, for example. The speaker 8047 outputs various kinds of sound, examples of which are sound set for predetermined processing, such as startup sound of an operating system (OS), sound from sound files executed in various applications, such as music from music reproduction application software, and an incoming e-mail alert. Although not illustrated, a connector for outputting sound to a device such as headphones, earphones, or a headset may be provided together with or instead of the speaker 8047 for outputting sound.

As described above, the button 8043 can have various functions. Although two buttons 8043 are provided on the left side of the portable information terminal 8040 in FIG. 20(A), it is needless to say that the number, arrangement, position, and the like of the buttons 8043 are not limited to this example and can be designed as appropriate.

The microphone 8046 can be used for sound input and recording. Images obtained with the use of the camera 8045 can be displayed on the display portion 8042.

In addition to the operation with the touch panel provided on the display portion 8042 or the button 8043, the portable information terminal 8040 can be operated by recognition of user's movement (gesture) (also referred to as gesture input) using the camera 8045, a sensor provided in the portable information terminal 8040, or the like. Alternatively, with the use of the microphone 8046, the portable information terminal 8040 can be operated by recognition of user's voice (also referred to as voice input). By introducing an NUI (Natural User Interface) technique that enables data to be input to an electrical device by natural behavior of a human, the operational performance of the portable information terminal 8040 can be further improved.

The connection terminal 8048 is a terminal for inputting a signal at the time of communication with an external device or inputting electric power at the time of power supply. For example, the connection terminal 8048 can be used for connecting an external memory drive to the portable information terminal 8040. Examples of the external memory drive are storage medium drives such as an external HDD (hard disk drive), a flash memory drive, a DVD (Digital Versatile Disk) drive, a DVD-R (DVD-recordable) drive, a DVD-RW (DVD-ReWritable) drive, a CD (Compact Disc) drive, a CD-R (Compact Disc Recordable) drive, a CD-RW (Compact Disc ReWritable) drive, a MO (Magneto Optical Disc) drive, an FDD (Floppy Disk Drive), and other nonvolatile solid state drive (SSD) devices. Although the portable information terminal 8040 has the touch panel on the display portion 8042, a keyboard may be provided on the housing 8041 instead of the touch panel or may be externally added.

Although one connection terminal 8048 is provided on the bottom surface of the portable information terminal 8040 in FIG. 20(A), it is needless to say that the number, arrangement, position, and the like of the connection terminals 8048 are not limited to this example and can be designed as appropriate.

Figure 20B:
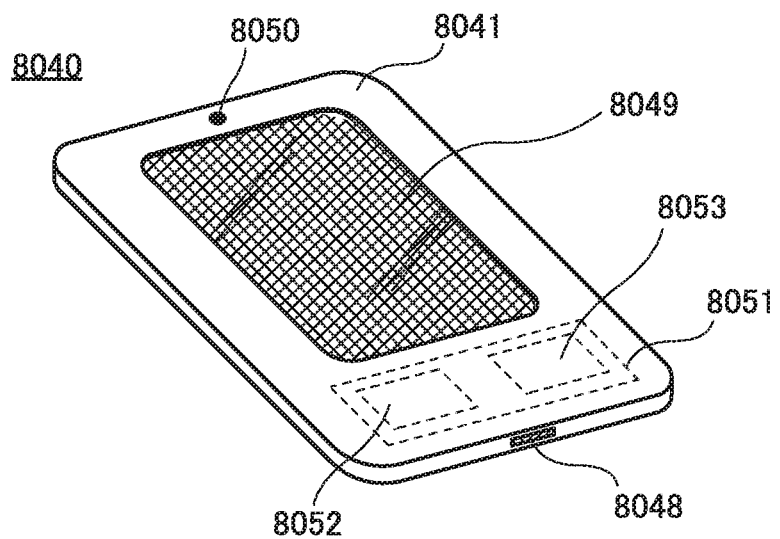

FIG. 20(B) is a perspective view illustrating the rear surface and the side surface of the portable information terminal 8040. In the portable information terminal 8040, the housing 8041 includes a solar cell 8049 and a camera 8050 on its surface; the portable information terminal 8040 further includes a charge and discharge control circuit 8051, a battery 8052, a DC-DC converter 8053, and the like. FIG. 20(B) illustrates an example where the charge and discharge control circuit 8051 includes the battery 8052 and the DC-DC converter 8053. The recovery method of a battery of one embodiment of the present invention described in the above embodiment can be used for the battery 8052.

The solar cell 8049 attached on the rear surface of the portable information terminal 8040 can supply electric power to the display portion, the touch panel, a video signal processor, and the like. Note that the solar cell 8049 can be provided on one or both surfaces of the housing 8041. By including the solar cell 8049 in the portable information terminal 8040, the battery 8052 in the portable information terminal 8040 can be charged even in a place where an electric power supply unit is not provided, such as outdoors.

As the solar cell 8049, it is possible to use any of the following: a silicon-based solar cell including a single layer or a stacked layer of single crystal silicon, polycrystalline silicon, microcrystalline silicon, or amorphous silicon; an InGaAs-based, GaAs-based, CIS-based, $Cu_2ZnSnS_4$, or CdTe—CdS-based solar cell; a dye-sensitized solar cell including an organic dye; an organic thin film solar cell including a conductive polymer, fullerene, or the like; a quantum dot solar cell having a pin structure in which a quantum dot structure is formed in an i-layer with silicon or the like; and the like.

Here, an example of a structure and operation of the charge and discharge control circuit 8051 illustrated in FIG. 20(B) is described with reference to a block diagram in FIG. 20(C).

Figure 20C:
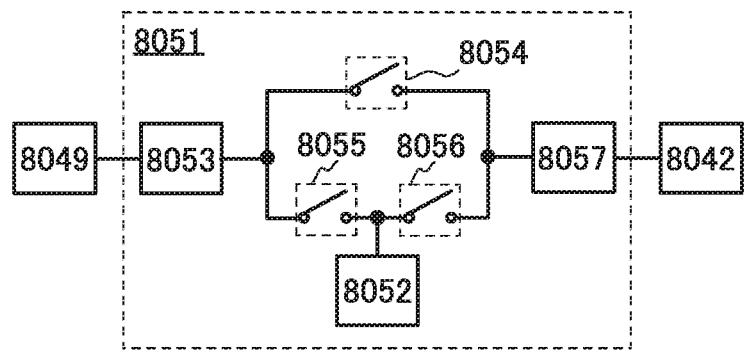

FIG. 20(C) illustrates the solar cell 8049, the battery 8052, the DC-DC converter 8053, a converter 8057, a switch 8054, a switch 8055, a switch 8056, and the display portion 8042. The battery 8052, the DC-DC converter 8053, the converter 8057, the switch 8054, the switch 8055, and the switch 8056 correspond to the charge and discharge control circuit 8051 in FIG. 20(B).

The voltage of electric power generated by the solar cell 8049 with the use of external light is raised or lowered by the DC-DC converter 8053 to be at a level needed for charging the battery 8052. When electric power from the solar cell 8049 is used for the operation of the display portion 8042, the switch 8054 is turned on and the voltage of the electric power is raised or lowered by the converter 8057 to a voltage needed for operating the display portion 8042. In addition, when display on the display portion 8042 is not performed, the switch 8054 is turned off and the switch 8055 is turned on so that the battery 8052 is charged.

Although the solar cell 8049 is described as an example of a power generation means, the power generation means is not limited thereto, and the battery 8052 may be charged by another power generation means such as a piezoelectric element or a thermoelectric conversion element (Peltier element). The charging method of the battery 8052 in the portable information terminal 8040 is not limited thereto, and the connection terminal 8048 may be connected to a power source to perform charge, for example. The battery 8052 may be charged by a contactless power transmission module performing charge by transmitting and receiving electric power wirelessly, or any of the above charging methods may be used in combination.

Here, the state of charge (SOC) of the battery 8052 is displayed on the upper left corner (in the dashed frame) of the display portion 8042. Thus, the user can check the state of charge of the battery 8052 and can accordingly select a power saving mode of the portable information terminal 8040. When the user selects the power saving mode, for example, the button 8043 or the icons 8044 can be operated to switch the components of the portable information terminal 8040, e.g., the display module or the display panel, an arithmetic unit such as CPU, and a memory, to the power saving mode. Specifically, in each of the components, the use frequency of a given function is decreased to stop the use. Furthermore, the portable information terminal 8040 can be configured to be automatically switched to the power saving mode depending on the state of charge. Moreover, by providing a sensor such as an optical sensor in the portable information terminal 8040, the amount of external light at the time of using the portable information terminal 8040 is sensed to optimize display luminance, which makes it possible to reduce the power consumption of the battery 8052.

In addition, when charging with the use of the solar cell 8049 or the like is performed, an image or the like showing that the charging is performed with the solar cell may be displayed on the upper left corner (in the dashed frame) of the display portion 8042 as illustrated in FIG. 20(A).

At least part of this embodiment can be implemented in combination with any of the other embodiments described in this specification as appropriate.

Embodiment 5

In this embodiment, a display module that can be manufactured using one embodiment of the present invention is described.

Figure 21A:
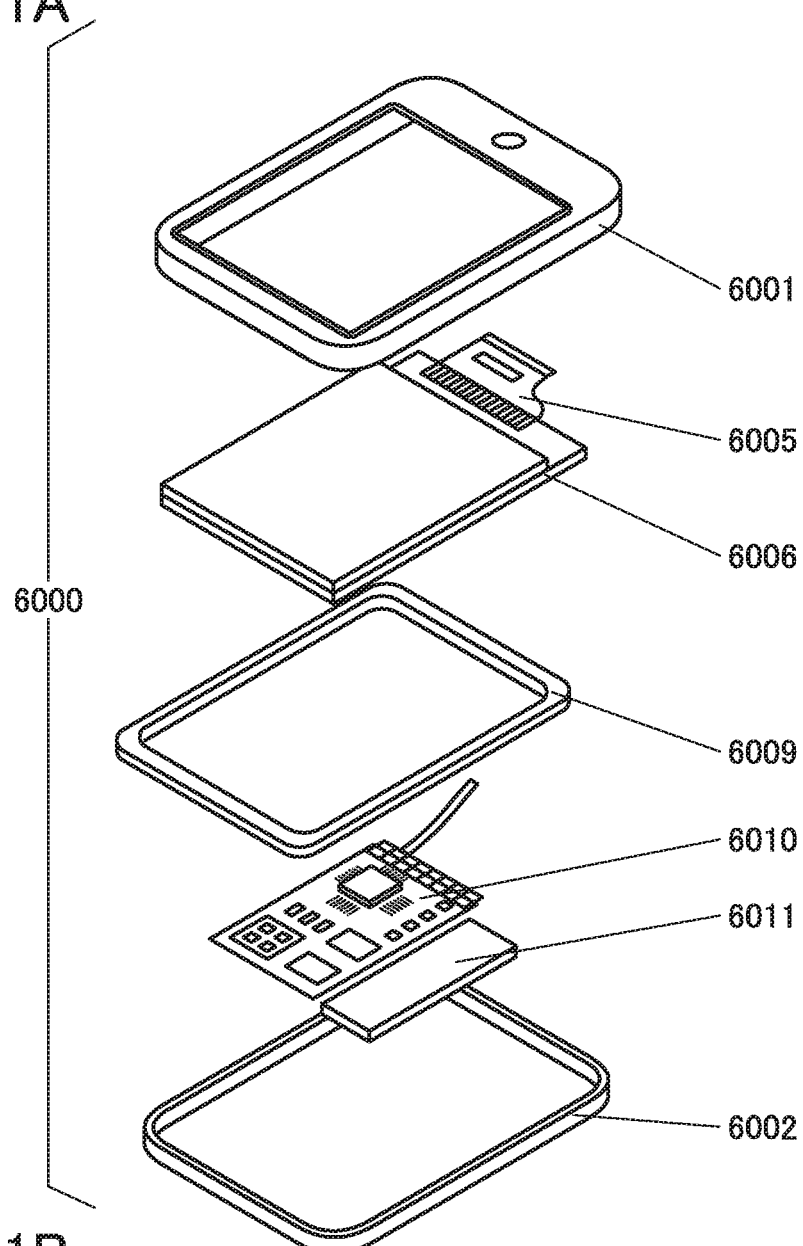
FIG. 21 A structure example of a display module.

A display module 6000 shown in FIG. 21(A) includes a display device 6006 connected to an FPC 6005, a frame 6009, a printed board 6010, and a battery 6011 between an upper cover 6001 and a lower cover 6002.

For example, the display device manufactured using one embodiment of the present invention can be used for the display device 6006. With the display device 6006, a display module with extremely low power consumption can be achieved.

The shapes and sizes of the upper cover 6001 and the lower cover 6002 can be changed as appropriate in accordance with the size of the display device 6006.

A touch panel may be provided to overlap with the display device 6006. The touch panel can be a resistive or capacitive touch panel that overlaps with the display device 6006. Instead of providing the touch panel, the display device 6006 can have a touch panel function.

The frame 6009 has a function of protecting the display device 6006 and functions as an electromagnetic shield for blocking electromagnetic waves generated by the operation of the printed board 6010. The frame 6009 may function as a radiator plate.

The printed board 6010 includes a power source circuit and a signal processing circuit for outputting a video signal and a clock signal. A power source for supplying electric power to the power source circuit may be an external commercial power source or the separately provided battery 6011. The battery 6011 can be omitted in the case where a commercial power source is used.

Figure 21B:
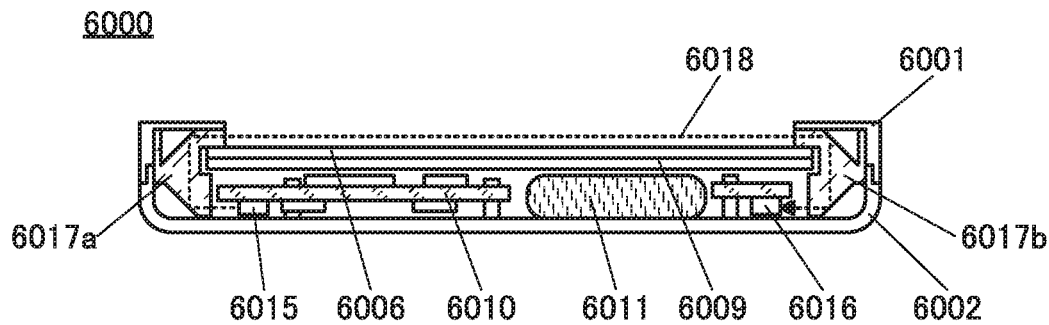

FIG. 21(B) is a schematic cross-sectional view of the display module 6000 with an optical touch sensor.

The display module 6000 includes a light-emitting portion 6015 and a light-receiving portion 6016 that are provided on the printed board 6010. A pair of light guide portions (a light guide portion 6017*a* and a light guide portion 6017*b*) are included in a region surrounded by the upper cover 6001 and the lower cover 6002.

A plastic or the like can be used for the upper cover 6001 and the lower cover 6002. The upper cover 6001 and the lower cover 6002 can each be thin (e.g., more than or equal to 0.5 mm and less than or equal to 5 mm). Therefore, the display module 6000 can be significantly lightweight. The upper cover 6001 and the lower cover 6002 can be manufactured with a small amount of material, and therefore, manufacturing costs can be reduced.

The display device 6006 is provided to overlap with the printed board 6010 and the battery 6011 with the frame 6009 located therebetween. The display device 6006 and the frame 6009 are fixed to the light guide portion 6017*a* and the light guide portion 6017*b*.

Light 6018 emitted from the light-emitting portion 6015 travels over the display device 6006 through the light guide portion 6017*a* and reaches the light-receiving portion 6016 through the light guide portion 6017*b*. For example, blocking of the light 6018 by a sensing target such as a finger or a stylus can be detected as touch operation.

A plurality of light-emitting portions 6015 are provided along two adjacent sides of the display device 6006, for example. A plurality of light-receiving portions 6016 are provided to face the light-emitting portions 6015. Accordingly, information about the position of touch operation can be obtained.

As the light-emitting portion 6015, a light source such as an LED element can be used. It is particularly preferable to use, as the light-emitting portion 6015, a light source that emits infrared light, which is not visually recognized by users and is harmless to users.

As the light-receiving portion 6016, a photoelectric element that receives light emitted from the light-emitting portion 6015 and converts it into an electrical signal can be used. A photodiode that can receive infrared light is suitably used.

For the light guide portion 6017a and the light guide portion 6017b, components that transmit at least the light 6018 can be used. With the use of the light guide portion 6017a and the light guide portion 6017b, the light-emitting portion 6015 and the light-receiving portion 6016 can be placed under the display device 6006, and a malfunction of the touch sensor due to external light reaching the light-receiving portion 6016 can be suppressed. It is particularly preferable to use a resin that absorbs visible light and transmits infrared light. Thus, the malfunction of the touch sensor can be suppressed more effectively.

At least part of this embodiment can be implemented in combination with the other embodiments described in this specification as appropriate.

Embodiment 6

In this embodiment, electronic devices each including a display device fabricated using one embodiment of the present invention are described.

Figure 22A:
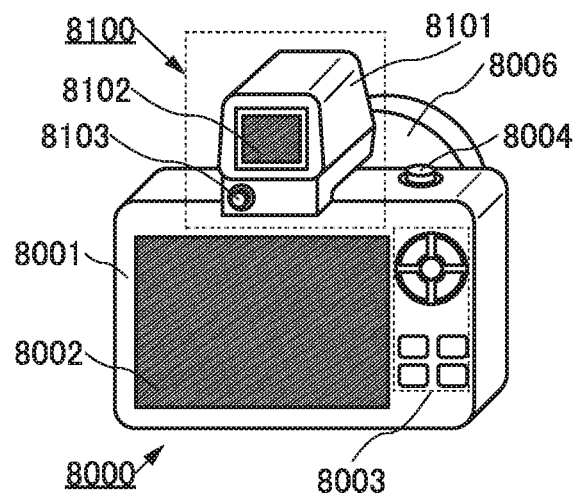
FIG. 22 Structure examples of electronic devices.

FIG. 22(A) is an external view of a camera 8000 to which a finder 8100 is attached.

The camera 8000 includes a housing 8001, a display portion 8002, operation buttons 8003, a shutter button 8004, and the like. A detachable lens 8006 is attached to the camera 8000.

Although the lens 8006 of the camera 8000 here is detachable from the housing 8001 for replacement, the lens 8006 may be integrated with the housing 8001.

The camera 8000 can take images at the press of the shutter button 8004. The display portion 8002 functions as a touch panel and images can also be taken at the touch of the display portion 8002.

The housing 8001 of the camera 8000 includes a mount including an electrode, so that the finder 8100, a stroboscope, or the like can be connected to the housing.

The finder 8100 includes a housing 8101, a display portion 8102, a button 8103, and the like.

The housing 8101 includes a mount for engagement with the mount of the camera 8000 so that the finder 8100 can be attached to the camera 8000. The mount includes an electrode, and a video or the like received from the camera 8000 through the electrode can be displayed on the display portion 8102.

The button 8103 serves as a power button. The on/off state of the display portion 8102 can be switched with the button 8103.

A display device of one embodiment of the present invention can be used in the display portion 8002 of the camera 8000 and the display portion 8102 of the finder 8100.

Note that although the camera 8000 and the finder 8100 are separate and detachable electronic devices in FIG. 22(A), a finder including a display device may be incorporated in the housing 8001 of the camera 8000.

Figure 22B:
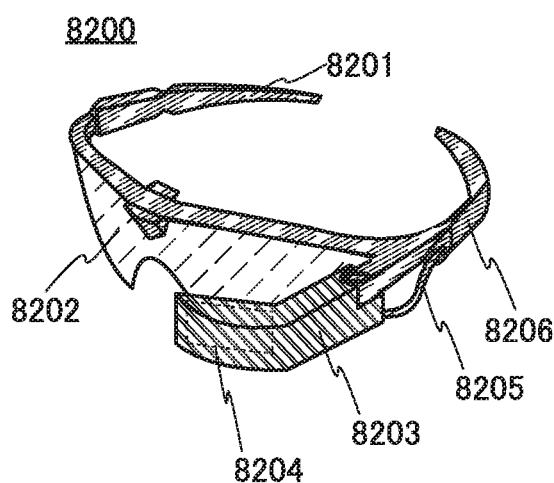

FIG. 22(B) is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203.

The main body 8203 includes a wireless receiver or the like and can display received video information, such as image data, on the display portion 8204. The movement of the eyeball and the eyelid of a user is captured by a camera provided in the main body 8203 and then coordinates of the sight line of the user are calculated using the information to utilize the sight line of the user as an input means.

A plurality of electrodes may be provided in the mounting portion 8201 at a position in contact with the user. The main body 8203 may have a function of sensing current flowing through the electrodes with the movement of the user's eyeball to recognize the user's sight line. The main body 8203 may have a function of sensing current flowing through the electrodes to monitor the user's pulse. The mounting portion 8201 may include various sensors such as a temperature sensor, a pressure sensor, and an acceleration sensor to have a function of displaying the user's biological information on the display portion 8204. The main body 8203 may sense the movement of the user's head or the like to change a video displayed on the display portion 8204 in synchronization with the movement.

The display device of one embodiment of the present invention can be used in the display portion 8204.

Figure 22C:
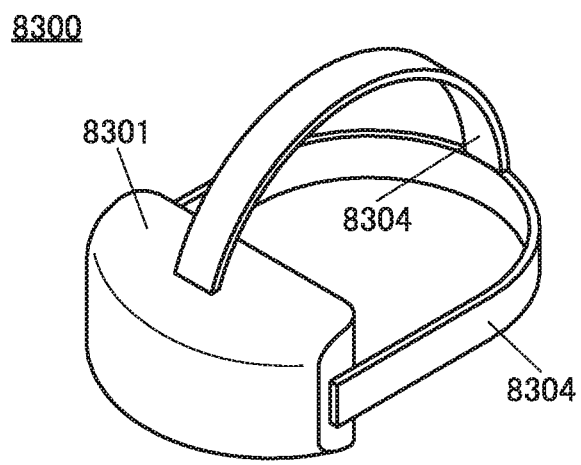
Figure 22D:
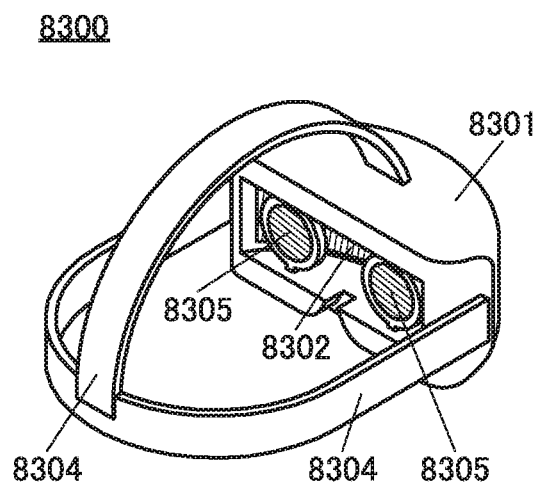
Figure 22E:
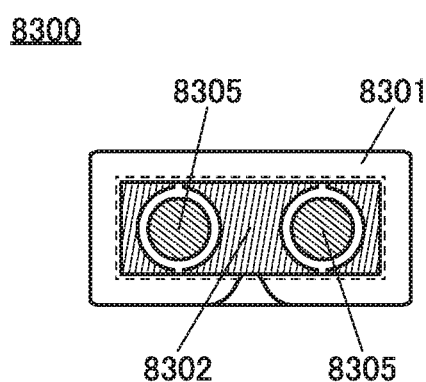

FIGS. 22(C), 22(D), and 22(E) are external views of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. Note that it is suitable that the display portion 8302 be curved and placed. When the display portion 8302 is curved and placed, a user can feel a high realistic sensation. Note that although the structure in which one display portion 8302 is provided is described in this embodiment as an example, the structure is not limited thereto, and two display portions 8302 may be provided. In that case, one display portion is placed for one eye of the user, so that three-dimensional display using parallax or the like is possible.

Note that the display device of one embodiment of the present invention can be used in the display portion 8302. The display device including the semiconductor device of one embodiment of the present invention has an extremely high resolution; thus, even when a video is magnified using the lenses 8305 as in FIG. 22(E), the user does not perceive pixels, and a more realistic video can be displayed.

Next, FIG. 23(A) to FIG. 23(G) show examples of electronic devices that are different from the electronic devices shown in FIG. 22(A) to FIG. 22(E).

Electronic devices shown in FIG. 23(A) to FIG. 23(G) include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices shown in FIG. 23(A) to FIG. 23(G) have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices shown in FIG. 23(A) to FIG. 23(G) are not limited thereto, and the electronic devices can have a variety of functions. Although not illustrated in FIG. 23(A) to FIG. 23(G), the electronic devices may each include a plurality of display portions. The electronic devices may each include a camera and the like and have a function of taking a still image, a function of taking a moving image, a function of storing the taken image in a memory medium (external or incorporated in the camera), a function of displaying the taken image on the display portion, or the like.

The details of the electronic devices shown in FIG. 23(A) to FIG. 23(G) are described below.

Figure 23A:
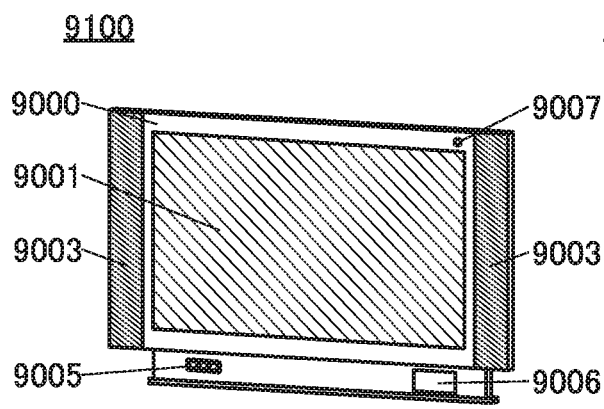
FIG. 23 Structure examples of electronic devices.

FIG. 23(A) is a perspective view showing a television device 9100. The television device 9100 can include the display portion 9001 having a large screen size of, for example, 50 inches or more, or 100 inches or more.

Figure 23D:
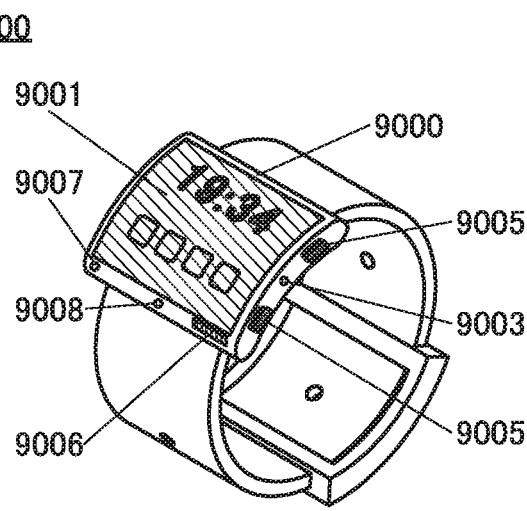
Figure 23B:
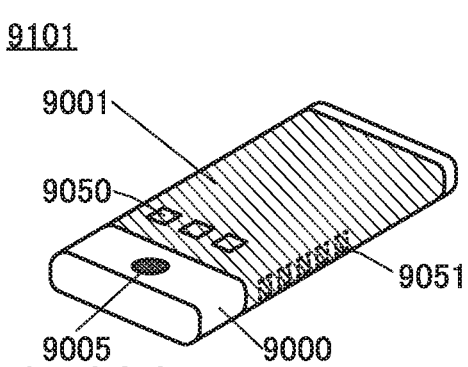

FIG. 23(B) is a perspective view showing a portable information terminal 9101. The portable information terminal 9101 functions as, for example, one or more selected from a telephone set, a notebook, an information browsing device, and the like. Specifically, the portable information terminal 9101 can be used as a smartphone. Note that the speaker 9003, the connection terminal 9006, the sensor 9007, or the like may be provided in the portable information terminal 9101. The portable information terminal 9101 can display characters and image information on its plurality of surfaces. For example, three operation buttons 9050 (also referred to as operation icons, or simply as icons) can be displayed on one surface of the display portion 9001. Information 9051 indicated by dashed rectangles can be displayed on another surface of the display portion 9001. Note that examples of the information 9051 include display indicating reception of an e-mail, an SNS (social networking service), a telephone call, and the like, the title of an e-mail, an SNS, or the like, the sender of an e-mail, an SNS, or the like, date, time, remaining battery, and reception strength of an antenna. Alternatively, the operation buttons 9050 or the like may be displayed on the position where the information 9051 is displayed, in place of the information 9051.

Figure 23E:
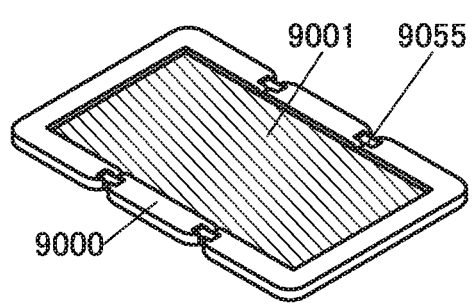
Figure 23C:
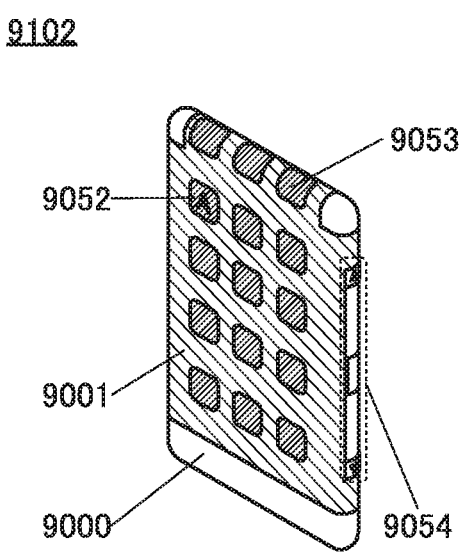

FIG. 23(C) is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, a user of the portable information terminal 9102 can see the display (here, the information 9053) with the portable information terminal 9102 put in a breast pocket of the clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 23(D) is a perspective view showing a watch-type portable information terminal 9200. The portable information terminal 9200 is capable of executing a variety of applications such as mobile phone calls, e-mailing, reading and editing texts, music reproduction, Internet communication, and computer games. The display surface of the display portion 9001 is curved and provided, and display can be performed along the curved display surface. The portable information terminal 9200 can execute near field communication conformable to a communication standard. For example, hands-free calling can be achieved by mutual communication with a headset capable of wireless communication. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Figure 23F:
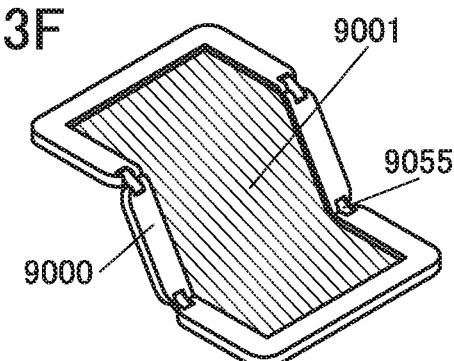
Figure 23G:
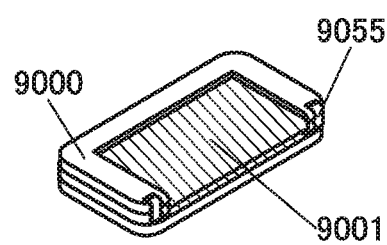

FIGS. 23(E), 23(F), and 23(G) are perspective views showing a foldable portable information terminal 9201. FIG. 23(E) is a perspective view of the portable information terminal 9201 in the opened state, FIG. 23(F) is a perspective view of the portable information terminal 9201 that is shifted from one of the opened state and the folded state to the other, and FIG. 23(G) is a perspective view of the portable information terminal 9201 in the folded state. The portable information terminal 9201 is highly portable in the folded state and is highly browsable in the opened state because of a seamless large display region. The display portion 9001 of the portable information terminal 9201 is supported by three housings 9000 joined by hinges 9055. By being folded at the hinges 9055 between two housings 9000, the portable information terminal 9201 can be reversibly changed in shape from the opened state to the folded state. For example, the portable information terminal 9201 can be bent with a radius of curvature of greater than or equal to 1 mm and less than or equal to 150 mm.

The electronic devices described in this embodiment are characterized by including the display portion for displaying some sort of information. Note that the semiconductor device of one embodiment of the present invention can also be used for an electronic device that does not include a display portion.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments described in this specification as appropriate.

Embodiment 7

In this embodiment, electronic devices of one embodiment of the present invention are described with reference to drawings.

Electronic devices exemplified below include a display device of one embodiment of the present invention in a display portion. Thus, the electronic devices achieve high resolution. In addition, the electronic devices can achieve both high resolution and a large screen.

The display portion of the electronic device of one embodiment of the present invention can display a video with a resolution of, for example, full high definition, 4K2K, 8K4K, 16K8K, or more. In addition, as a screen size of the display portion, the diagonal can be greater than or equal to 20 inches, greater than or equal to 30 inches, greater than or equal to 50 inches, greater than or equal to 60 inches, or greater than or equal to 70 inches.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device or the lighting device of one embodiment of the present invention can be incorporated along a curved inside/outside wall surface of a house or a building or a curved interior/exterior surface of a car.

The electronic device of one embodiment of the present invention may include an antenna. When a signal is received by the antenna, the electronic device can display a video, information, or the like on a display portion. In addition, when the electronic device includes the antenna and a secondary battery, the antenna may be used for contactless power transmission.

The electronic device of one embodiment of the present invention may include a sensor (having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, it can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 24A:
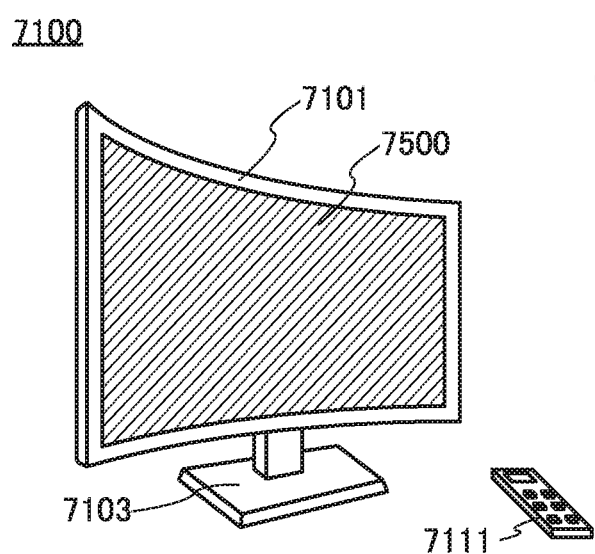
FIG. 24 Structure examples of electronic devices.

FIG. 24(A) illustrates an example of a television device. In a television device 7100, a display portion 7500 is incorporated in a housing 7101. Here, a structure in which the housing 7101 is supported by a stand 7103 is illustrated.

The display device of one embodiment of the present invention can be used for the display portion 7500.

Operation of the television device 7100 illustrated in FIG. 24(A) can be performed with an operation switch provided in the housing 7101 or a separate remote controller 7111. Alternatively, the display portion 7500 may include a touch sensor, and the television device 7100 can be operated by touch on the display portion 7500 with a finger or the like. The remote controller 7111 may be provided with a display portion for displaying information output from the remote controller 7111. With operation keys or a touch panel provided in the remote controller 7111, channels and volume can be operated and videos displayed on the display portion 7500 can be operated.

Note that the television device 7100 has a structure in which a receiver, a modem, and the like are provided. A general television broadcast can be received with the receiver. In addition, when connected to a communication network with or without wires via the modem, one-way (from a transmitter to a receiver) or two-way (between a transmitter and a receiver or between receivers) data communication can also be performed.

Figure 24B:
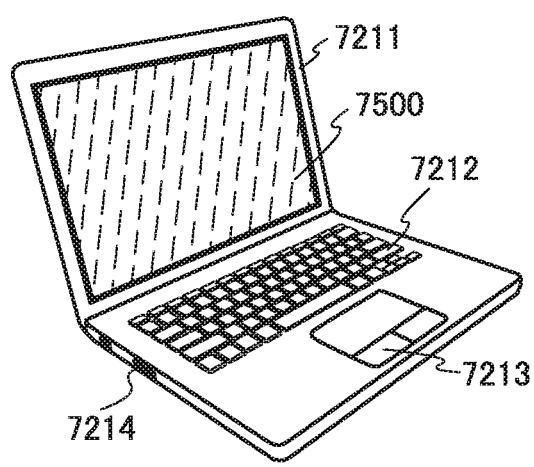

FIG. 24(B) illustrates a laptop personal computer 7200. The laptop personal computer 7200 includes a housing 7211, a keyboard 7212, a pointing device 7213, an external connection port 7214, and the like. In the housing 7211, the display portion 7500 is incorporated.

The display device of one embodiment of the present invention can be used for the display portion 7500.

Figure 24C:
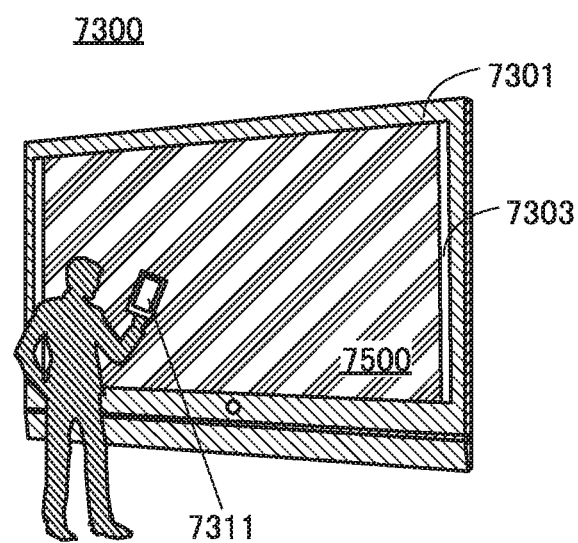
Figure 24D:
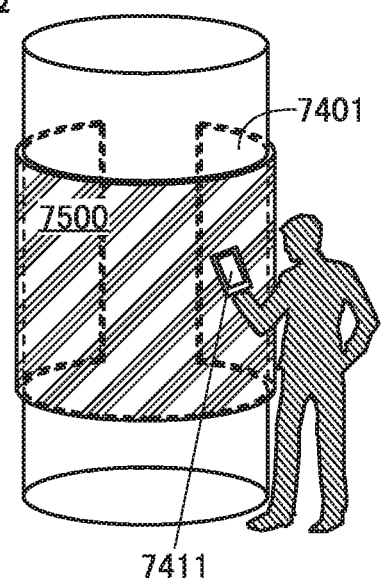

FIGS. 24(C) and 24(D) illustrate examples of digital signage.

Digital signage 7300 illustrated in FIG. 24(C) includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

In addition, FIG. 24(D) is digital signage 7400 attached to a cylindrical pillar 7401. The digital signage 7400 includes the display portion 7500 provided along a curved surface of the pillar 7401.

The display device of one embodiment of the present invention can be used for the display portion 7500 in FIGS. 24(C) and 24(D).

A larger area of the display portion 7500 can increase the amount of information that can be provided at a time. In addition, the larger display portion 7500 attracts more attention, so that the effectiveness of the advertisement can be increased, for example.

It is preferable to use a touch panel for the display portion 7500 because in addition to display of a still image or a moving image on the display portion 7500, intuitive operation by a user is possible. Moreover, for an application for providing information such as route information or traffic information, usability can be enhanced by intuitive operation.

Furthermore, as illustrated in FIGS. 24(C) and 24(D), it is preferable that the digital signage 7300 or the digital signage 7400 work with an information terminal 7311 or an information terminal 7411 such as a smartphone a user has through wireless communication. For example, information of an advertisement displayed on the display portion 7500 can be displayed on a screen of the information terminal 7311 or the information terminal 7411. Moreover, by operation of the information terminal 7311 or the information terminal 7411, a displayed image on the display portion 7500 can be switched.

Furthermore, it is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

At least part of this embodiment can be implemented in combination with the other embodiments described in this specification as appropriate.

Embodiment 8

In this embodiment, an example of a television device for which a display device including the semiconductor device of one embodiment of the present invention is used is described with reference to drawings.

Figure 25A:
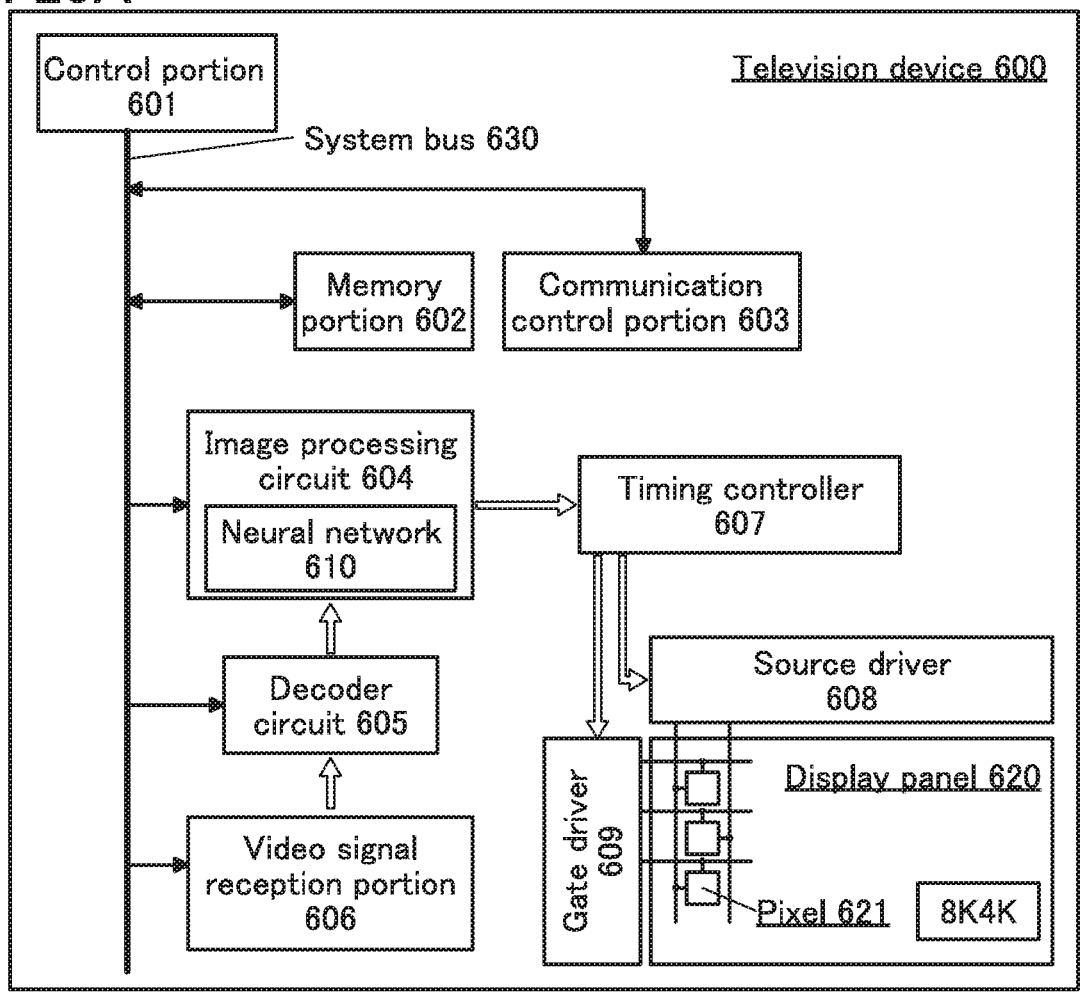
FIG. 25 A structure example of a television device.

FIG. 25(A) is a block diagram of a television device 600.

Note that in the drawings attached to this specification, the block diagram in which components are classified according to their functions and shown as independent blocks is illustrated; however, it is difficult to separate completely actual components according to their functions, and it is possible for one component to relate to a plurality of functions.

The television device 600 includes a control portion 601, a memory portion 602, a communication control portion 603, an image processing circuit 604, a decoder circuit 605, a video signal reception portion 606, a timing controller 607, a source driver 608, a gate driver 609, a display panel 620, and the like.

The display device exemplified in the above embodiment can be used for the display panel 620 in FIG. 25(A). Thus, the television device 600 with a large size, high definition, and high visibility can be obtained.

The control portion 601 can function as, for example, a central processing unit (CPU). For example, the control portion 601 has a function of controlling components such as the memory portion 602, the communication control portion 603, the image processing circuit 604, the decoder circuit 605, and the video signal reception portion 606 via a system bus 630.

Signals are transmitted between the control portion 601 and the components via the system bus 630. In addition, the control portion 601 has a function of processing signals input from the components which are connected via the system bus 630, a function of generating signals to be output to the components, and the like, so that the components connected to the system bus 630 can be controlled comprehensively.

The memory portion 602 functions as a register, a cache memory, a main memory, a secondary memory, or the like that can be accessed by the control portion 601 and the image processing circuit 604.

As a memory device that can be used as a secondary memory, a memory device that uses a rewritable nonvolatile memory element can be used, for example. For example, a flash memory, an MRAM (Magnetroresistive Random Access Memory), a PRAM (Phase change RAM), a ReRAM (Resistive RAM), and an FeRAM (Ferroelectric RAM) can be used.

In addition, as a memory device that can be used as a temporary memory such as a register, a cache memory, or a main memory, a volatile memory element such as a DRAM (Dynamic RAM) or an SRAM (Static Random Access Memory) may be used.

For example, as a RAM provided in the main memory, a DRAM is used, for example, in which case a memory space as a workspace for the control portion 601 is virtually allocated and used. An operating system, an application program, a program module, program data, and the like which are stored in the memory portion 602 are loaded into the RAM for execution. The data, program, and program module which are loaded into the RAM are directly accessed and operated by the control portion 601.

In the ROM, a BIOS (Basic Input/Output System), firmware, and the like for which rewriting is not needed can be stored. As the ROM, a mask ROM, an OTPROM (One Time Programmable Read Only Memory), an EPROM (Erasable Programmable Read Only Memory), or the like can be used. Examples of an EPROM include an UV-EPROM (Ultra-Violet Erasable Programmable Read Only Memory) which can erase stored data by irradiation with ultraviolet rays, an EEPROM (Electrically Erasable Programmable Read Only Memory), and a flash memory.

Moreover, a structure in which, besides the memory portion 602, a detachable memory device can be connected may be employed. For example, it is preferable to include a terminal connected to a storage media drive functioning as a storage device such as a hard disk drive (HDD) or a solid state drive (SSD) or a storage medium such as a flash memory, a Blu-ray Disc, or a DVD. Accordingly, a video can be stored.

The communication control portion 603 has a function of controlling communication performed via a computer network. For example, the communication control portion 603 controls a control signal for connection to a computer network in response to instructions from the control portion 601 and transmits the signal to the computer network. Accordingly, communication can be performed by connection with a computer network such as the Internet, which is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network).

Furthermore, the communication control portion 603 may have a function of communicating with a computer network or another electronic device with a communication standard such as Wi-Fi (registered trademark), Bluetooth (registered trademark), or ZigBee (registered trademark).

The communication control portion 603 may have a function of wireless communication. For example, an antenna and a high frequency circuit (an RF circuit) are provided to receive and transmit an RF signal. The high frequency circuit performs conversion between an electromagnetic signal and an electric signal in a frequency band that is set by national laws and performs wireless communication with another communication device using the electromagnetic signal. As a practical frequency band, several tens of kilohertz to several tens of gigahertz are generally used. A structure can be employed in which the high frequency circuit connected to an antenna includes a high frequency circuit portion compatible with a plurality of frequency bands and the high frequency circuit portion includes an amplifier, a mixer, a filter, a DSP, an RF transceiver, or the like.

The video signal reception portion 606 includes, for example, an antenna, a demodulation circuit, an AD converter circuit (analog-digital conversion circuit), and the like. The demodulation circuit has a function of demodulating a signal input from the antenna. Moreover, the AD converter circuit has a function of converting the demodulated analog signal into a digital signal. The signal processed in the video signal reception portion 606 is transmitted to the decoder circuit 605.

The decoder circuit 605 has a function of decoding video data included in a digital signal input from the video signal reception portion 606, in accordance with the specifications of the broadcasting standard of the data to be transmitted, and a function of generating a signal transmitted to the image processing circuit. Examples of the broadcasting standard in 8K broadcasts include H.265|MPEG-H High Efficiency Video Coding (abbreviation: HEVC).

Examples of airwaves that can be received by the antenna included in the video signal reception portion 606 include a ground wave, and a radio wave transmitted from a satellite. In addition, examples of airwaves that can be received by the antenna include airwaves for analog broadcasting, digital broadcasting, video-audio-only broadcasting, and audio-only broadcasting. For example, the antenna can receive airwaves transmitted in a certain frequency band in a UHF band (about 300 MHz to 3 GHz) or a VHF band (30 MHz to 300 MHz). Furthermore, for example, a plurality of pieces of data received in a plurality of frequency bands is used, whereby the transfer rate can be increased and more information can be thus obtained. Accordingly, a video with a resolution exceeding the full high definition can be displayed in the display panel 620. A video with a resolution of, for example, 4K2K, 8K4K, 16K8K, or more can be displayed.

Alternatively, a structure may be employed in which the video signal reception portion 606 and the decoder circuit 605 generate a signal transmitted to the image processing circuit 604 using the broadcasting data received with data transmission technology through a computer network. At this time, in the case where the received signal is a digital signal, the video signal reception portion 606 does not necessarily include a demodulation circuit, an AD converter circuit, and the like.

The image processing circuit 604 has a function of generating a video signal output to the timing controller 607, on the basis of a video signal input from the decoder circuit 605.

In addition, the timing controller 607 has a function of generating a signal (a signal such as a clock signal or a start pulse signal) output to the gate driver 609 and the source driver 608 on the basis of a synchronization signal included in a video signal or the like on which the image processing circuit 604 performs processing. Moreover, the timing controller 607 has a function of generating a video signal output to the source driver 608, as well as the above signal.

The display panel 620 includes a plurality of pixels 621. Each pixel 621 is driven by a signal supplied from the gate driver 609 and the source driver 608. Here, an example of a display panel whose number of pixels is 7680×4320, with the resolution corresponding to the standard of 8K4K, is shown. Note that the resolution of the display panel 620 is not limited thereto, and the display panel 620 may have a resolution corresponding to the standard such as full high definition (the number of pixels is 1920×1080) or 4K2K (the number of pixels is 3840×2160).

A structure in which, for example, a processor is included can be employed for the control portion 601 or the image processing circuit 604 illustrated in FIG. 25(A). For example, a processor functioning as a central processing unit (CPU) can be used for the control portion 601. In addition, another processor such as a DSP (Digital Signal Processor) or a GPU (Graphics Processing Unit) can be used for the image processing circuit 604, for example. Furthermore, a structure in which the above processor is obtained with a PLD (Programmable Logic Device) such as an FPGA (Field Programmable Gate Array) or an FPAA (Field Programmable Analog Array) may be employed for the control portion 601 or the image processing circuit 604.

The processor interprets and executes instructions from various programs to process various kinds of data and control programs. The programs that might be executed by the processor may be stored in a memory region included in the processor or a memory device which is additionally provided.

Furthermore, two or more functions among the functions of the control portion 601, the memory portion 602, the communication control portion 603, the image processing circuit 604, the decoder circuit 605, the video signal reception portion 606, and the timing controller 607 may be aggregated in one IC chip to form a system LSI. For example, a system LSI including a processor, a decoder circuit, a tuner circuit, an AD converter circuit, a DRAM, an SRAM, and the like may be employed.

Note that a transistor that includes an oxide semiconductor in a channel formation region and that achieves an extremely low off-state current can be used in an IC or the like included in the control portion 601 or another component. Since the transistor has an extremely low off-state current, the transistor is used as a switch for holding electric charge (data) which flows into a capacitor functioning as a memory element, whereby a long data retention period can be ensured. Utilizing this characteristic for a register or a cache memory of the control portion 601 or the like enables normally-off computing where the control portion 601 operates only when needed and data on the previous processing is stored in the memory element in the other case. Thus, power consumption of television device 600 can be reduced.

Note that the structure of the television device 600 exemplified in FIG. 25(A) is just an example, and all of the components are not necessarily included. It is acceptable as long as the television device 600 includes at least necessary components among the components illustrated in FIG. 25(A). Furthermore, the television device 600 may include a component other than the components illustrated in FIG. 25(A).

For example, the television device 600 may include an external interface, an audio output portion, a touch panel unit, a sensor unit, a camera unit, or the like besides the configuration illustrated in FIG. 25(A). For example, examples of the external interfaces include an external connection terminal such as a USB (Universal Serial Bus) terminal, a LAN (Local Area Network) connection terminal, a power reception terminal, an audio output terminal, an audio input terminal, a video output terminal, and a video input terminal; a transceiver for optical communication using infrared rays, visible light, ultraviolet rays, or the like; and a physical button provided on a housing. In addition, examples of the audio input/output portions include a sound controller, a microphone, and a speaker.

The image processing circuit 604 is described in detail below.

The image processing circuit 604 preferably has a function of executing image processing on the basis of a video signal input from the decoder circuit 605.

Examples of the image processing include noise removal processing, grayscale conversion processing, tone correction processing, and luminance correction processing. Examples of the tone correction processing or the luminance correction processing include gamma correction.

Furthermore, the image processing circuit 604 preferably has a function of executing processing such as pixel interpolation processing in accordance with up-conversion of the resolution or frame interpolation processing in accordance with up-conversion of the frame frequency.

As the noise removing processing, various noise such as mosquito noise which appears near outline of characters and the like, block noise which appears in high-speed moving images, random noise causing flicker, and dot noise caused by up-conversion of the resolution are removed, for example.

The grayscale conversion processing converts the grayscale of an image to a grayscale corresponding to output characteristics of the display panel 620. For example, in the case where the number of grayscale levels is increased, gradation values of pixels are interpolated to an input image with a small number of gray levels and assigned to the pixels, so that processing for smoothing a histogram can be executed. In addition, a high-dynamic range (HDR) processing for increasing the dynamic range is also included in the grayscale conversion processing.

In addition, the pixel interpolation processing interpolates data that does not actually exist when resolution is up-converted. For example, with reference to pixels around the target pixel, data is interpolated to display intermediate color therebetween.

In addition, the tone correction processing corrects the tone of an image. The luminance correction processing corrects the brightness (luminance contrast) of an image. For example, the type, luminance, color purity, and the like of a lighting placed in a space where the television device 600 is provided are detected, and the luminance and tone of images displayed on the display panel 620 are corrected to be optimal accordingly. Alternatively, a function of comparing a displayed image to images of various scenes in an image list stored in advance, and then correcting the luminance and tone of the displayed image to be suitable to the images of the closest scene of the image can be included.

In the case where the frame frequency of the displayed video is increased, the frame interpolation generates an image for a frame that does not exist actually (an interpolation frame). For example, an image for an interpolation frame that is interposed between certain two images is generated from a difference between the two images. Alternatively, images for a plurality of interpolation frames can be generated between the two images. For example, when the frame frequency of a video signal input from the decoder circuit 605 is 60 Hz, a plurality of interpolation frames are generated, and the frame frequency of a video signal output to the timing controller 607 can be increased twofold to 120 Hz, fourfold to 240 Hz, or eightfold to 480 Hz, for example.

Furthermore, the image processing circuit 604 preferably has a function of executing image processing utilizing a neural network. In FIG. 25(A), an example in which the image processing circuit 604 includes a neural network 610 is illustrated.

For example, with the neural network 610, features can be extracted from image data included in a video, for example. In addition, the image processing circuit 604 can select an optimal correction method in accordance with the extracted feature or select a parameter used for the correction.

Alternatively, the neural network 610 itself may have a function of performing image processing. In other words, a structure may be employed in which image data not subjected to image processing is input to the neural network 610 so that image data subjected to image processing is outputted.

Furthermore, data of a weight coefficient used for the neural network 610 is stored in the memory portion 602 as a data table. The data table including the weight coefficient can be updated by the communication control portion 603 through the computer network, for example. Alternatively, a structure in which the image processing circuit 604 has a learning function and enables the update of the data table including the weight coefficient may be employed.

Figure 25B:
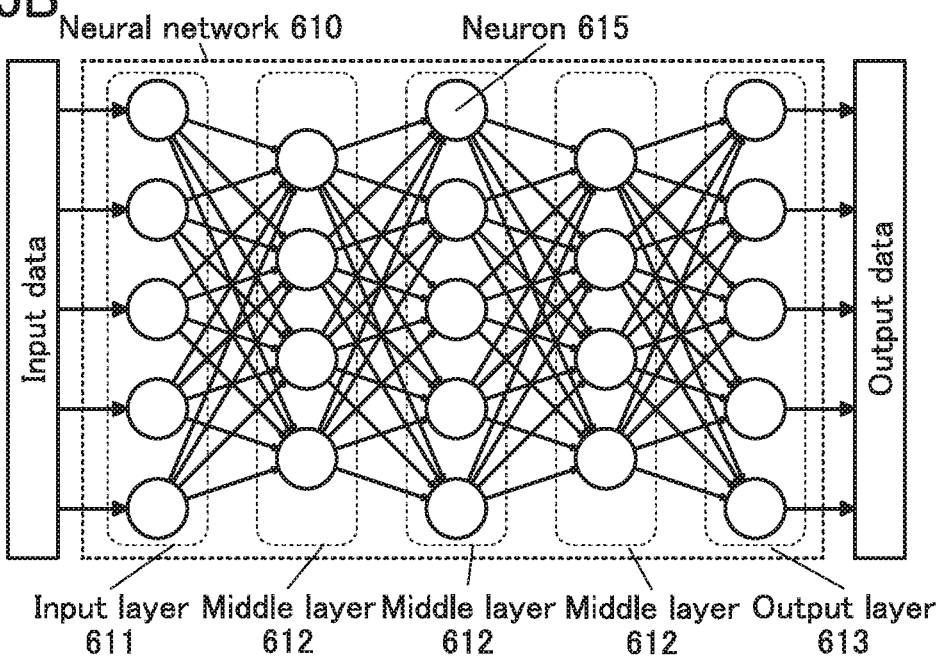

In FIG. 25(B), a schematic view of the neural network 610 included in the image processing circuit 604 is illustrated.

Note that in this specification and the like, the neural network indicates a general model having the capability of solving problems, which is modeled on a biological neural network and determines the connection strength of neurons by the learning. The neural network includes an input layer, a middle layer (also referred to as a hidden layer), and an output layer. Among neural networks, a neural network having two or more middle layers is referred to as a deep neural network (DNN). The learning using a deep neural network is referred to as "deep learning".

In addition, in the description of the neural network in this specification and the like, to determine a connection strength of neurons (also referred to as a weight coefficient) from the existing data is referred to as "learning" in some cases. Moreover, in this specification and the like, to draw a new conclusion from the neural network formed using the connection strength obtained by the learning is referred to as "inference" in some cases.

The neural network 610 includes an input layer 611, one or more middle layers 612, and an output layer 613. Input data is input to the input layer 611. Output data is output from the output layer 613.

Each of the input layer 611, the middle layer 612, and the output layer 613 includes neurons 615. The neuron 615 indicates here a circuit element that might execute product-sum operation (product-sum operation element). In FIG. 25, directions of input/output data between two neurons 615 in two layers are denoted by arrows.

The arithmetic processing in each layer is executed by the product-sum operation of an output of the neuron 615 in the previous layer and a weight coefficient. For example, when the output from an i-th neuron in the input layer is denoted by $x_i$, and the connection strength (weight coefficient) between the output $x_i$, and a j-th neuron in the next middle layer 612 is denoted by $w_{ji}$, the output $y_j$ from the j-th neuron in the middle layer can be denoted by $y_j=f(\Sigma w_{ji} \cdot x_i)$. Note that i and j are each an integer greater than or equal to 1. Here, $f(x)$ represents an activation function, and a sigmoid function, a threshold function, or the like can be used therefor. In this manner, the output of the neuron 615 in each layer is a value obtained from the activation function with respect to the result of product-sum operation of the output from the neuron 615 in the previous layer and the weight coefficient. Furthermore, the connection between layers may be a full connection where all of the neurons are connected or a partial connection where some of the neurons are connected. FIG. 25(B) shows the case where all of the neurons are connected.

In FIG. 25(B), an example including three middle layers 612 is illustrated. Note that the number of the middle layers 612 is not limited thereto and it is acceptable as long as one or more middle layers are included. In addition, the number of neurons included in one middle layer 612 may be changed as appropriate depending on the specifications. For example, the number of the neurons 615 included in one middle layer 612 may be larger or smaller than the number of the neurons 615 included in the input layer 611 or the output layer 613.

The weight coefficient serving as an indicator of the connection strength between the neurons 615 is determined by learning. Although the learning may be executed by the processor included in the television device 600, it is preferable to execute with a calculator having high arithmetic processing properties, such as a dedicated server or a cloud. The weight coefficient determined by the learning is stored in the memory portion 602 as the table and used by being read out by the image processing circuit 604. Furthermore, the table can be updated as needed through the computer network.

The above is the description of the neural network.

At least part of this embodiment can be implemented in combination with the other embodiments described in this specification as appropriate.

REFERENCE NUMERALS

DL_Y: data line, DL_1: data line, DLa1: source line, DLa2: source line, DLb1: source line, DLb2: source line, GL_X: gate line, GL_1: gate line, GL_2: gate line, 100: transistor, 100A: transistor, 100B: transistor, 100C: transistor, 100D: transistor, 102: substrate, 102a: substrate, 102b: substrate, 103: insulating layer, 104: insulating layer, 104a: layer, 104b: layer, 104c: layer, 105: adhesive layer, 106: conductive layer, 108: semiconductor layer, 108A: semiconductor film, 108a: semiconductor layer, 108B: semiconductor film, 108b: semiconductor layer, 108c: semiconductor layer, 109: insulating layer, 109*f*: insulating film, 110: insulating layer, 111: conductive layer, 111*f*: conductive film, 112: opening, 113A: insulating film, 113*a*: insulating layer, 113B: insulating film, 113*b*: insulating layer, 116: insulating layer, 118: insulating layer, 118*f*: insulating film, 119: insulating layer, 119*f*: insulating film, 120*a*: conductive layer, 120*b*: conductive layer, 141*a*: opening, 141*b*: opening, 142: opening, 501: pixel circuit, 502: pixel portion, 504: driver circuit portion, 504*a*: gate driver, 504*b*: source driver, 506: protection circuit, 507: terminal portion, 550: transistor, 552: transistor, 554: transistor, 560: capacitor, 562: capacitor, 570: liquid crystal element, 572: light-emitting element, 600: television device, 601: control portion, 602: memory portion, 603: communication control portion, 604: image processing circuit, 605: decoder circuit, 606: video signal reception portion, 607: timing controller, 608: source driver, 609: gate driver, 610: neural network, 611: input layer, 612: middle layer, 613: output layer, 615: neuron, 620: display panel, 621: pixel, 630: system bus, 700: display device, 700A: display device, 701: substrate, 702: pixel portion, 704: source driver circuit portion, 705: substrate, 706: gate driver circuit portion, 708: FPC terminal portion, 710: signal line, 710*a*: signal line, 711: wiring portion, 712: sealant, 716: FPC, 721: source driver IC, 722: gate driver circuit, 723: FPC, 724: printed board, 730: insulating film, 732: sealing film, 734: insulating film, 736: coloring film, 738: light-blocking film, 750: transistor, 752: transistor, 760: connection electrode, 770: planarization insulating film, 772: conductive film, 773: insulating film, 774: conductive film, 775: liquid crystal element, 776: liquid crystal layer, 778: structure body, 780: anisotropic conductive film, 782: light-emitting element, 786: EL layer, 788: conductive film, 790: capacitor, 791: touch panel, 792: insulating film, 793: electrode, 794: electrode, 795: insulating film, 796: electrode, 797: insulating film, 6000: display module, 6001: upper cover, 6002: lower cover, 6005: FPC, 6006: display device, 6009: frame, 6010: printed board, 6011: battery, 6015: light-emitting portion, 6016: light-receiving portion, 6017*a*: light guide portion, 6017*b*: light guide portion, 6018: light, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 7500: display portion, 8000: camera, 8001: housing, 8002: display portion, 8003: operation button, 8004: shutter button, 8006: lens, 8040: portable information terminal, 8041: housing, 8042: display portion, 8043: button, 8044: icon, 8045: camera, 8046: microphone, 8047: speaker, 8048: connection terminal, 8049: solar cell, 8050: camera, 8051: charge and discharge control circuit, 8052: battery, 8053: DC-DC converter, 8054: switch, 8055: switch, 8056: switch, 8057: converter, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9200: portable information terminal, 9201: portable information terminal

The invention claimed is:

1. A semiconductor device comprising:
first to sixth insulating layers;
a semiconductor layer;
first to third conductive layers;
a first opening;
a second opening; and
a third opening in the fifth insulating layer and the sixth insulating layer,
wherein the second insulating layer is positioned over the first insulating layer,
wherein the semiconductor layer is positioned between the first insulating layer and the second insulating layer,
wherein the third insulating layer is positioned over the second insulating layer,
wherein the fourth insulating layer is positioned over the third insulating layer,
wherein the first conductive layer comprises a region overlapping with the semiconductor layer, and is positioned between the third insulating layer and the fourth insulating layer,
wherein the third insulating layer comprises a region in contact with a bottom surface of the first conductive layer and a region in contact with the fourth insulating layer,
wherein the fourth insulating layer is in contact with a top surface and a side surface of the first conductive layer,
wherein the fifth insulating layer is in contact with a top surface and a side surface of the semiconductor layer,
wherein the fifth insulating layer comprises the first opening and the second opening in a region overlapping with the semiconductor layer and not overlapping with the first conductive layer,
wherein the second conductive layer is electrically connected to the semiconductor layer in the first opening,
wherein the third conductive layer is electrically connected to the semiconductor layer in the second opening,
wherein the third insulating layer, the fourth insulating layer, and the fifth insulating layer comprise metal, and oxygen or nitrogen,
wherein the sixth insulating layer comprises a region in contact with a top surface and a side surface of the fifth insulating layer and a region in contact with the first insulating layer, and
wherein the second insulating layer and the first conductive layer are positioned inside the third opening.

2. The semiconductor device according to claim 1, wherein the third insulating layer, the fourth insulating layer, and the fifth insulating layer comprise aluminum or hafnium, and oxygen or nitrogen.

3. The semiconductor device according to claim 1, further comprising a seventh insulating layer and a fourth conductive layer,
wherein the seventh insulating layer is positioned between the first insulating layer and the third conductive layer,
wherein the fourth conductive layer comprises a region overlapping with the first conductive layer, and
wherein the seventh insulating layer comprises metal, and oxygen or nitrogen.

4. The semiconductor device according to claim 3, wherein the seventh insulating layer comprises aluminum or hafnium, and oxygen or nitrogen.

5. The semiconductor device according to claim 1, further comprising eighth and ninth insulating layers,
wherein the ninth insulating layer is positioned over the first insulating layer and the fourth insulating layer, wherein the eighth insulating layer is positioned between the first insulating layer and the ninth insulating layer, and wherein the ninth insulating layer comprises metal, and oxygen or nitrogen.

6. The semiconductor device according to claim 5, wherein the ninth insulating layer comprises aluminum or hafnium, and oxygen or nitrogen.

7. The semiconductor device according to claim 1, wherein the semiconductor layer comprises metal oxide.

8. A display device comprising:
the semiconductor device according to claim 1, and
a liquid crystal element or a light-emitting element electrically connected to the semiconductor device.

* * * * *